United States Patent
Saito et al.

(10) Patent No.: US 6,678,128 B2
(45) Date of Patent: Jan. 13, 2004

(54) EXCHANGE COUPLING FILM AND ELECTRORESISTIVE SENSOR USING THE SAME

(75) Inventors: Masamichi Saito, Niigata-ken (JP); Naoya Hasegawa, Niigata-ken (JP); Yosuke Ide, Niigata-ken (JP); Kenichi Tanaka, Niigata-ken (JP)

(73) Assignee: Alps Electric Co., Ltd., Tokyo (JP)

(*) Notice: Subject to any disclaimer, the term of this patent is extended or adjusted under 35 U.S.C. 154(b) by 282 days.

(21) Appl. No.: 09/833,756

(22) Filed: Apr. 11, 2001

(65) Prior Publication Data

US 2001/0053053 A1 Dec. 20, 2001

(30) Foreign Application Priority Data

Apr. 12, 2000 (JP) ........................................ 2000-110604

(51) Int. Cl.[7] ................................................ G11B 5/39
(52) U.S. Cl. .................................................. 360/324.11
(58) Field of Search ....................... 360/324.11, 324.12, 360/324

(56) References Cited

U.S. PATENT DOCUMENTS

| | | | |
|---|---|---|---|
| 5,731,936 A | 3/1998 | Lee et al. | |
| 5,768,067 A | 6/1998 | Saito et al. | |
| 5,784,225 A | 7/1998 | Saito et al. | |
| 6,023,395 A | 2/2000 | Dill et al. | |
| 6,046,892 A | 4/2000 | Aoshima et al. | |
| 6,083,632 A | 7/2000 | Fujikata et al. | |
| 6,387,548 B1 * | 5/2002 | Hasegawa et al. | .......... 428/692 |
| 6,411,476 B1 | 6/2002 | Lin et al. | |
| 6,433,972 B1 | 8/2002 | Mao et al. | |
| 6,452,763 B1 | 9/2002 | Gill | |
| 6,456,469 B1 | 9/2002 | Gill | |
| 2001/0043986 A1 * | 11/2001 | Saito et al. | .................. 427/130 |
| 2001/0047930 A1 * | 12/2001 | Saito et al. | ............... 204/192.1 |

FOREIGN PATENT DOCUMENTS

| | | | | |
|---|---|---|---|---|
| JP | 8-88118 | 7/1996 | | |
| JP | 9-69211 | 3/1997 | | |
| JP | 11-191647 | 7/1999 | | |
| JP | 2000068569 A * | 3/2000 | ........... | H01L/43/08 |
| JP | 2000124523 A * | 4/2000 | ........... | H01L/43/08 |

OTHER PUBLICATIONS

English Translation of JP 11-191647.
English Translation of JP 9-69211.

* cited by examiner

*Primary Examiner*—William Klimowicz
(74) *Attorney, Agent, or Firm*—Brinks Hofer Gilson & Lione

(57) ABSTRACT

An exchange coupling film has an antiferromagnetic layer, a pinned magnetic layer, and a seed layer provided on the side of the antiferromagnetic layer 4 opposite to the pinned magnetic layer. The seed layer has a crystalline structure constituted mainly by face-centered cubic crystals with (111) planes substantially aligned. The seed layer is preferably non-magnetic. A laminate structure including the antiferromagnetic layer and a free layer inclusive of the intervening layers have crystalline orientations with their (111) planes substantially aligned, so that large crystal grains and, hence, large ratio of resistance variation can be achieved.

119 Claims, 13 Drawing Sheets

EXCHANGE COUPLING FILM AND ELECTRORESISTIVE SENSOR USING THE SAME

BACKGROUND OF THE INVENTION

1. Field of the Invention

The present invention relates to an exchange coupling film which has an antiferromagnetic layer and a ferromagnetic layer, wherein the direction of magnetization of the ferromagnetic layer is fixed in a predetermined direction by the effect of an exchange magnetic field which is generated at the interface between the antiferromagnetic layer and the ferromagnetic layer. More particularly, the present invention relates to an exchange coupling film which is improved to exhibit a large ratio of resistance variation and also to a magnetoresistive sensor, e.g., a spin valve thin-film device or an ARM device, incorporating such an exchange coupling film, as well as to a thin-film magnetic head which uses such a magnetoresistive sensor.

2. Description of the Related Art

A spin-valve-type thin-film device is a kind of GMR (Giant Magnetoresistive) device which makes use of a giant magnetoresistive effect, and is used for detecting recording magnetic fields from a recording medium such as a hard disk.

The spin-valve-type thin-film device, among various GMR devices, has advantageous features such as simplicity of the structure and high subtlety to vary its magnetic resistance even under a weak magnetic field.

The simplest form of the spin-valve-type thin-film device has an antiferromagnetic layer, a pinned magnetic layer, a non-magnetic intermediate layer, and a free magnetic layer. The antiferromagnetic layer and the pinned magnetic layer are formed in contact with each other, and the direction of the pinned magnetic layer is put into a single magnetic domain state and fixed by an exchange anisotropic magnetic field, which is produced at the interface between the antiferromagnetic layer and the pinned magnetic layer. The magnetization of the free magnetic layer is aligned in a direction which intersects the direction of magnetization of the pinned magnetic layer, by the effect of bias layers that are formed on both sides of the free magnetic layer.

Alloy films such as an Fe—Mn (Iron-Manganese) alloy film, Ni—Mn (Nickel-Manganese) alloy film and a Pt—Mn (Platinum-Manganese) alloy film are generally usable as the material of the antiferromagnetic layer, among which the Pt—Mn alloy film are attracting attention due to its advantages such as a high blocking temperature, superior corrosion resistance, and so forth.

In order to comply with the future demand for higher recording density, it is important to achieve greater exchange coupling magnetic field and greater ratio of resistance variation. However, it has been impossible to obtain a large ratio of resistance variation, with the conventional structure of the magnetoresistive sensor which is composed of an antiferromagnetic layer, a pinned magnetic layer, a non-magnetic intermediate layer and a free magnetic layer.

It has been recognized that the ratio of resistance variation has dependency on exchange coupling magnetic field: the resistance variation ratio decreases unless a large exchange coupling magnetic field is obtained. The resistance variation ratio also has dependency on the crystalline orientations of the layers. With the conventional structure, it has been impossible to obtain a magnetoresistive sensor that possesses both appropriate crystalline orientations and a large exchange magnetic field, and that accordingly exhibits a large resistance variation ratio.

SUMMARY OF THE INVENTION

The present invention is aimed at overcoming these problems, by providing an exchange coupling film having an antiferromagnetic layer, a ferromagnetic layer, and a seed layer formed on the side of the antiferromagnetic layer opposite to the interface between the antiferromagnetic layer and the ferromagnetic layer. The seed layer serves to optimize the crystalline orientations of the layers so as to provide a large ratio of resistance variation. The present invention also provides a magnetoresistive sensor using this exchange coupling film and also a thin-film magnetic head using such a magnetoresistive sensor.

In accordance with a first aspect of the present invention, there is provided an exchange coupling film comprising: an antiferromagnetic layer; a ferromagnetic layer arranged such that an exchange coupling magnetic field is produced at the interface between the antiferromagnetic layer and the ferromagnetic layer; and a seed layer formed on the side of the antiferromagnetic layer opposite to the ferromagnetic layer, the seed layer having face-centered cubic crystals with the (111) plane substantially oriented in parallel with the interface; wherein the crystalline structure of at least part of the antiferromagnetic layer comprises CuAu—I type face-centered ordered lattice, wherein the antiferromagnetic layer and the ferromagnetic layer have crystalline orientations in which the (111) planes are oriented in parallel with the interface, and wherein a non-aligned crystal lattice state is created at at least part of the interface between the antiferromagnetic layer and the seed layer.

The structure of the exchange coupling film of the present invention has been subjected to a heat treatment after the deposition of the layers constituting the exchange film.

The exchange coupling film of the present invention has the seed layer formed on the side of the antiferromagnetic layer opposite to the interface between the antiferromagnetic layer and the ferromagnetic layer. The seed layer has a crystalline structure composed mainly by face-centered cubic crystals having the (111) planes substantially oriented in parallel with the above-mentioned interface. The seed layer thus formed serves to cause the (111) planes of the antiferromagnetic layer and the ferromagnetic layer to be in parallel with the interface therebetween, thus offering remarkable improvement in the ratio of resistance variation of a magnetoresistive sensor incorporating the exchange coupling film.

In order to obtain a large exchange coupling magnetic field at the interface between the antiferromagnetic layer and the ferromagnetic layer, a non-aligned state has been created at at least part of the interface between the antiferromagnetic layer and the seed layer. This means that transformation from disordered lattice to ordered lattice has been properly effected, and indicates that an exchange coupling film is obtainable that has a large exchange coupling magnetic field. The ratio of resistance variation has dependency also on the strength of the exchange coupling magnetic field, so that the ratio of resistance variation can be increased as a result of the increase of the exchange coupling.

In accordance with a second aspect of the present invention, there is provided an exchange coupling film comprising: an antiferromagnetic layer; a ferromagnetic layer arranged such that an exchange coupling magnetic field is produced at the interface between the antiferromagnetic layer and the ferromagnetic layer; and a seed layer formed on the side of the antiferromagnetic layer opposite to the ferromagnetic layer, the seed layer having face-centered cubic crystals with the (111) plane substantially oriented in parallel with the interface; wherein the crystalline structure of at least part of the antiferromagnetic layer comprises CuAu—I type face-centered ordered lattice, wherein the antiferromagnetic layer and the ferromagnetic layer have crystalline orientations in which the (111) planes are oriented in parallel with the interface, and wherein the antiferromagnetic layer and the seed layer have different lattice constants at the interface therebetween.

Unlike the first aspect described before, the second aspect features that the antiferromagnetic layer and the seed layer have different lattice constants at the interface therebetween. Preferably, a crystal lattice non-aligned state is created at at least part of the interface between the antiferromagnetic layer and the seed layer.

In accordance with this aspect of the present invention, the antiferromagnetic layer may be made from an antiferromagnetic alloy material containing an element X and Mn, wherein the element X is selected from the group of elements consisting of Pt, Pd, Ir, Rh, Ru, and Os and combinations thereof, or from an antiferromagnetic alloy material containing an element X, an element X' and Mn, where the element X' is selected from the group of elements consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb and a rare earth element and combinations thereof.

Preferably, the antiferromagnetic alloy material containing an element X, an element X' and Mn is an interstitial solid solution in which the element X' has invaded and resides in the interstices of a space lattice constituted by the element X and Mn, or a substitutive solid solution in which part of the lattice points of a crystal lattice constituted by the element X and Mn has been substituted by the element X'.

This permits the X—Mn—X' alloy to have a large lattice constant, while enhancing the difference in the lattice constant between the ferromagnetic layer and the antiferromagnetic layer, thus facilitating the creation of the non-aligned crystal lattice state at the interface between the ferromagnetic layer and the antiferromagnetic layer.

In accordance with a third aspect of the present invention, there is provided an exchange coupling film comprising: an antiferromagnetic layer made from an antiferromagnetic alloy material containing an element X and Mn, wherein the element X is selected from the group of elements consisting of Pt, Pd, Ir, Rh, Ru, and Os and combinations thereof; a ferromagnetic layer arranged such that an exchange coupling magnetic field is generated at the interface between the antiferromagnetic layer and the ferromagnetic layer; and a seed layer formed on the antiferromagnetic layer at the side of the antiferromagnetic layer opposite to the interface, and having (111) planes of face-centered cubic crystals substantially oriented in parallel with the interface; wherein the antiferromagnetic layer has a region in which the ratio of atomic percent of the element X to Mn increases in a direction towards the seed layer, wherein the crystalline structure of at least part of the antiferromagnetic layer has a CuAu—I face-centered cubic ordered lattice, and wherein the antiferromagnetic layer and the ferromagnetic layer have such crystal orientations that the (111) planes are substantially oriented in parallel with the interface between the antiferromagnetic layer and the ferromagnetic layer.

Alternatively, this aspect of the present invention provides an exchange coupling film comprising: an antiferromagnetic layer made from an antiferromagnetic alloy material containing an element X, an element X' and Mn, wherein the element X is selected from the group of elements consisting of Pt, Pd, Ir, Rh, Ru, and Os and combinations thereof, while the element X' is selected from the group of elements consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb and a rare earth element and combinations thereof; a ferromagnetic layer arranged such that an exchange coupling magnetic field is generated at the interface between the antiferromagnetic layer and the ferromagnetic layer; and a seed layer formed on the antiferromagnetic layer at the side of the antiferromagnetic layer opposite to the interface, and having (111) planes of face-centered cubic crystals substantially oriented in parallel with the interface, wherein the antiferromagnetic layer has a region in which the ratio of atomic percent of the element X to Mn increases in a direction towards the seed layer, wherein the crystalline structure of at least part of the antiferromagnetic layer has a CuAu—I face-centered cubic ordered lattice, and wherein the antiferromagnetic layer and the ferromagnetic layer have such crystal orientations that the (111) planes are substantially oriented in parallel with the interface between the antiferromagnetic layer and the ferromagnetic layer.

Preferably, the antiferromagnetic alloy material containing an element X, an element X' and Mn is an interstitial solid solution in which the element X' has invaded and resides in the interstices of a space lattice constituted by the element X and Mn, or a substitutive solid solution in which part of the lattice points of a crystal lattice constituted by the element X and Mn has been substituted by the element X'. The antiferromagnetic layer and the seed layer may have different lattice constants at the interface therebetween. Preferably, a non-aligned crystal lattice state has been created at at least part of the interface between the antiferromagnetic layer and the seed layer.

The presence of the region in which the ratio of the atomic percent of the element X or the elements X+X' to Mn increases in a direction towards the seed layer frees the antiferromagnetic layer from the restraint effected by the crystalline structure of the seed layer at the interface between the antiferromagnetic layer and the seed layer, whereby the antiferromagnetic layer is properly transformed into ordered structure to offer a greater exchange magnetic field than those obtainable with known devices.

The structure may be such that, assuming a first imaginary boundary at the side of the thicknesswise center of the antiferromagnetic layer adjacent to the seed layer and a second imaginary boundary at the side of the thicknesswise center adjacent to the ferromagnetic layer, the ratio is greater in the region between the interface adjacent to the seed layer and the first imaginary boundary than in the region between the first and second imaginary boundaries, and the ratio linearly or non-linearly increases towards aid interface adjacent to the seed layer in a region which includes the first imaginary boundary.

Preferably, the antiferromagnetic layer has a region in which the atomic percent of the element X or the elements X+X' increases in a direction towards the seed layer starting from a thicknesswise location within the antiferromagnetic layer. This feature provides a greater exchange coupling magnetic field.

It is also preferred that the antiferromagnetic layer has a region which is near the interface between the antiferromagnetic layer and the seed layer and in which the atomic percent of the element X or the elements X+X' decreases in a direction towards the seed layer. This feature also provides a greater exchange coupling magnetic field.

It is also preferred that the composition ratio of the element X or the elements X+X' of the antiferromagnetic layer to the total composition ratio 100 at % of all the elements constituting the antiferromagnetic layer is about preferably about 50 at % to about 65 at % and, more preferably about 50 at % to about 60 at %, in the region near the interface between the antiferromagnetic layer and the seed layer.

Preferably, a region exists near the thicknesswise center of the antiferromagnetic layer, the region having a composition ratio of the element X or the elements X+X' about of preferably about 44 at % to about 57 at % and, more preferably about 46 wt % to about 55 at % of said element X where a total composition ratio of all the elements is expressed as 100 at %. This means that transformation from disordered lattice to ordered lattice has been properly performed, thus suggesting that a large resistance variation ratio and large exchange coupling magnetic field are obtainable.

Preferably, the antiferromagnetic layer has a thickness at least about 76 Å. Thus, the present invention offers greater resistance variation ratio and greater exchange coupling magnetic field than ever, even with such a small thickness of the antiferromagnetic layer.

It is also preferred that the seed layer is formed of an Ni—Fe alloy or an Ni—Fe—Y alloy, wherein Y is one or more elements selected from the group consisting of Cr, Rh, Ta, Hf, Nb, Zr, and Ti. In particular, the seed layer is a non-magnetic layer. This serves to suppress shunting of the sense current to the seed layer, thus contributing to the improvement in the resistance variation ratio.

It is also preferred that the seed layer, the antiferromagnetic layer, and the ferromagnetic layer are sequentially formed in this order on an underlying layer, the underlying layer being formed of at least one element selected from the group consisting of Ta, Hf, Nb, Zr, Ti, Mo and W. This feature enables the seed layer formed on the underlying layer to have a crystalline structure composed mainly of face-centered cubic crystals, with the (111) plane substantially oriented in parallel with the aforementioned interface.

Preferably, the antiferromagnetic layer and the ferromagnetic layer have different lattice constants at at least part of the interface therebetween. In particular, it is preferred that a non-aligned crystal lattice state has been created at at least part of the interface between the antiferromagnetic layer and the ferromagnetic layer. The presence of such a non-aligned crystal lattice state at the interface between the ferromagnetic layer and the antiferromagnetic layer enables appropriate transformation in the whole antiferromagnetic layer, thus ensuring a large exchange coupling magnetic field.

The exchange coupling film having the described features can be used in a variety of types of magnetoresistive sensors.

Thus, in accordance with a different aspect of the present invention, there is provided a magnetoresistive sensor, comprising: an antiferromagnetic layer; a pinned magnetic layer which is formed in contact with the antiferromagnetic layer and having a direction of magnetization fixed by an exchange anisotropic magnetic field with the antiferromagnetic layer; a non-magnetic intermediate layer formed between the pinned magnetic layer and a free magnetic layer; and a bias layer for aligning the direction of magnetization of the free magnetic layer in a direction which intersects the direction of magnetization of the pinned magnetic layer; wherein the antiferromagnetic layer and the pinned magnetic layer formed in contact with the antiferromagnetic layer are formed of the exchange coupling film described before, and wherein the nonmagnetic intermediate layer and the free magnetic layer have crystalline orientations with the (111) planes substantially oriented in parallel with the interface between the antiferromagnetic layer and the pinned magnetic layer. Thus, the layers from the antiferromagnetic layers to the free magnetic layer, inclusive of other layers therebetween, have crystalline orientations with the (111) planes substantially oriented, whereby a large resistance variation ratio is obtainable.

A magnetoresistive sensor, comprising: an antiferromagnetic layer; a pinned magnetic layer which is formed in contact with the antiferromagnetic layer and having a direction of magnetization fixed by an exchange anisotropic magnetic field with the antiferromagnetic layer; a non-magnetic intermediate layer formed between the pinned magnetic layer and a free magnetic layer; and an antiferromagnetic exchange bias layer formed on either the upper side or the lower side of the free magnetic layer and having portions spaced from each other in the track width direction; wherein the exchange bias layer and the free layer are formed of the exchange coupling film described before, and wherein the nonmagnetic intermediate layer, the pinned magnetic layer and the antiferromagnetic layer have crystalline orientations with the (111) planes substantially oriented in parallel with the interface between the exchange bias layer and the free magnetic layer.

The substantial orientations of the (111) planes in the layers from the antiferromagnetic layer to the free magnetic layer provides a greater resistance variation ratio than those obtainable with known devices.

In accordance with the present invention, there is provided a magnetoresistive sensor comprising: a free magnetic layer; non-magnetic intermediate layers formed on upper and lower sides of the free magnetic layer; pinned magnetic layers one of which is formed on the upper side of one of the non-magnetic intermediate layers while the other on the lower side of the other of the non-magnetic intermediate layers; antiferromagnetic layers one of which is formed on the upper side of the one of the pinned magnetic layers while the other on the lower side of the other of the pinned magnetic layers, the antiferromagnetic layers serving to fix the directions of magnetization of the associated pinned magnetic layers by exchange anisotropic magnetic fields; and a bias layer which aligns the direction of magnetization of the free magnetic layer to a direction that intersects the directions of the pinned magnetic layers; wherein the antiferromagnetic layer and the pinned magnetic layer contacting therewith, at least one of the upper and lower sides of the free magnetic layer, are formed of the exchange coupling film described before, and wherein the layers other than the exchange coupling film have crystalline orientations with the (111) planes substantially aligned in parallel with the interface between the antiferromagnetic layer and the pinned layer. Thus, the laminate of the layers starting from one of the pinned magnetic layer and terminating in the other pinned magnetic layer have crystalline orientations with the (111) planes substantially oriented, whereby the magnetoresistive sensor exhibits a greater ratio of resistance variation than those obtainable with known devices.

The present invention also provides a magnetoresistive sensor comprising: a non-magnetic layer; a magnetoresistive layer and a soft magnetic layer and the non-magnetic layer therebetween; and an antiferromagnetic layer formed on the upper side or the lower side of the magnetoresistive layer and having portions spaced from each other in the track width direction; wherein the antiferromagnetic layer and the magnetoresistive layer and the magnetoresistive layer are formed of the exchange coupling film described before, and wherein the non-magnetic layer and the soft magnetic layer have crystalline orientations with the (111) planes substantially oriented in parallel with the interface between the magnetoresistive layer and the antiferromagnetic layer. Thus, the magnetoresistive layer and the soft magnetic layer, as well as intervening layer, have crystalline orientations with the (111) planes substantially oriented, whereby the magnetoresistive sensor exhibits a greater ratio of resistance variation than those obtainable with known devices.

The present invention also provides a magnetoresistive sensor having shield layers provided on the upper and lower sides of the above-mentioned magnetoresistive sensor through the intermediaries of gap layers.

DESCRIPTION OF THE PREFERRED EMBODIMENTS

Figure 1:
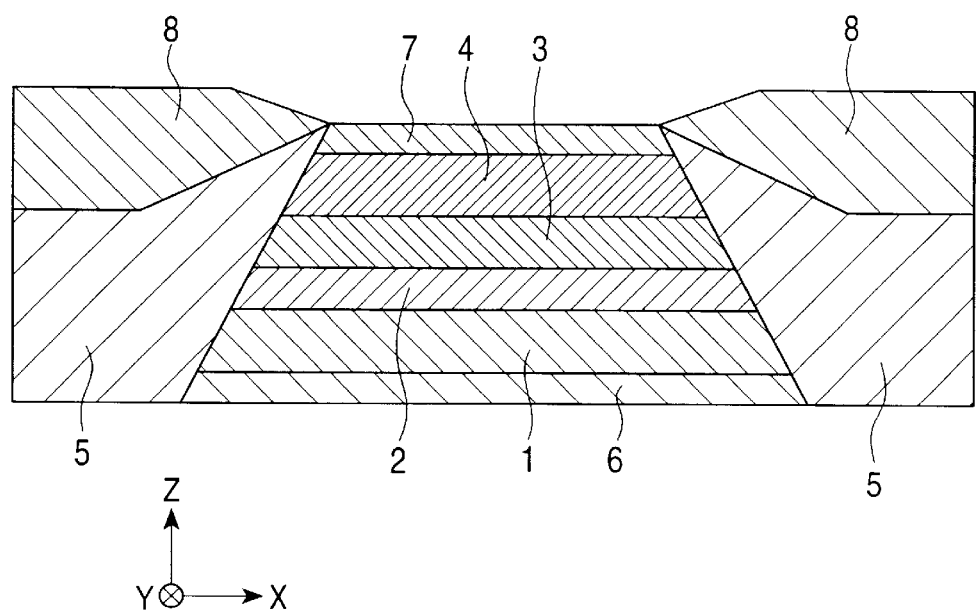
FIG. 1 is a sectional view of the structure of a single spin valve type magnetoresistive sensor in accordance with a first embodiment of the present invention, as viewed from the same side as an ABS surface.

FIG. 1 is a sectional view of a single spin valve type magnetoresistive sensor as a first embodiment of the present invention, as viewed from the same side as the ABS surface. In this Figure, only the central portion of the device which extends in the X direction is shown in sectional view.

This single spin valve type magnetoresistive sensor is provided on, for example, a trailing side end of a floating slider of a hard disk device, and is intended to detect, for example, the recording magnetic fields on the hard disk.

A recording medium such as the hard disk moves in a Z direction, while the direction of the magnetic field leaking from the hard disk is indicated by Y.

Shown at the bottom of FIG. 1 is an underlying layer 6 which is formed of a non-magnetic material selected from the group consisting of Ta, Hf, Nb, Zr, Ti, Mo, and W and combinations thereof. On the underlying layer 6 are sequentially deposited a free magnetic layer 1, a non-magnetic intermediate layer 2, a pinned magnetic layer 3, and an antiferromagnetic layer 4. The antiferromagnetic layer 4 is overlain by a protective layer 7 made from a non-magnetic material containing elements selected from the group consisting of Ta, Hf, Nb, Zr, Ti, Mo, and W and combinations thereof.

As shown in FIG. 1, a hard bias layer 5 is formed on each end of the laminate composed of the six layers the underlying layer 6 to the protective layers 7. A conductive layer 8 is deposited on each portion of the hard bias layer 5.

In accordance with the present invention, each of the free magnetic layer 1 and the pinned magnetic layer 3 is made from, for example, an Ni—Fe alloy, a Co—Fe alloy, Co, or a Co—Ni—Fe alloy. In the structure shown in FIG. 1, the free magnetic layer 1 is formed of a single layer. This, however, is only illustrative and the free magnetic layer 1 may be multi-layered. For instance, the free magnetic layer 1 may be formed of a laminate composed of an Ni—Fe alloy and Co layers.

The non-magnetic intermediate layer 2 interposed between the free magnetic layer 1 and the pinned magnetic layer 3 is formed of, for example, Cu. When the magnetoresistive sensor embodying the present invention is a tunnel-type magnetoresistive sensor (TMR sensor) using the tunneling effect, the non-magnetic intermediate layer 2 is made from an insulating material such as $Al_2O_3$. The hard bias layer 5 is formed of, for example, a Co—Pt (cobalt-platinum) alloy or a Co—Cr—Pt (cobalt-chromium-platinum) alloy. The conductive layer 8 is made from Cu (copper, W (wolfram), or the like. In case of the tunnel-type magnetoresistive sensor, the conductive layer 8 is formed both on the lower side of the free magnetic layer 1 and the upper side of the antiferromagnetic layer 4.

A description will now be given of a method of producing a magnetoresistive sensor embodying the present invention, focusing mainly on an exchange coupling film constituted by the antiferromagnetic layer and the ferromagnetic layer (pinned magnetic layer). Then, a description will follow as to the features of the structure of the magnetoresistive sensor produced by the described method.

Figure 2:
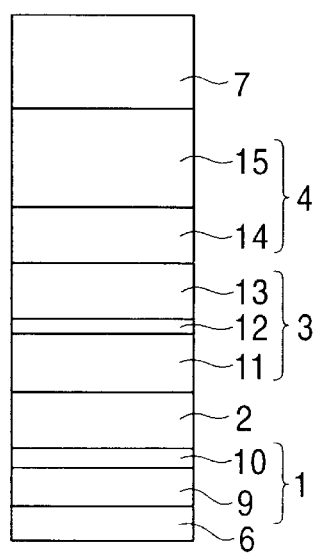
FIG. 2 is a schematic illustration of a laminate structure in accordance with the present invention in a state after deposition and prior to a heat treatment.

FIG. 2 is a partial schematic illustration of a laminate structure which has, as in the structure shown in FIG. 1, the lowermost underlying layer 6 and the uppermost protective layer 7, with the antiferromagnetic layer 4 formed on the upper side of the pinned magnetic layer 3. The laminate structure shown in FIG. 2 is in a state after deposition of the layers, i.e., in a state prior to a heat treatment.

First of all, the underlying layer 6 of Ta or the like is formed on a substrate which is not shown. By way of example, the underlying layer 6 is preferably formed to have a thickness of about 50 Å. Then, by way of example, an Ni—Fe alloy film 9 is formed on the underlying layer 6, and a Co film 10 is formed on the Ni—Fe alloy film 9. The Ni—Fe alloy film 9 and the Co film 10, in combination, form a free magnetic layer 1. By forming the Co film 10 on the side of the free magnetic layer 1 contacting the non-magnetic intermediate layer 2, it is possible to prevent diffusion of the metal elements at the interface between the free magnetic layer 1 and the non-magnetic intermediate layer 2 and, hence, to increase the resistance variation ratio □ΔMR. The Ni—Fe alloy film 9 is formed to contain, for example, about 80 at % of Ni and about 20 at % of Fe. The Ni—Fe alloy film 9 preferably has a thickness of about 45 Å, while the Co film 10 preferably has a thickness of about 5 Å.

Then, the non-magnetic intermediate layer 2 of, for example, Cu is formed on the free magnetic layer 1. By way of example, the non-magnetic intermediate layer 2 preferably has a film thickness of about 25 Å.

Then, the pinned magnetic layer 3 is formed on the non-magnetic intermediate layer 2. In this embodiment, the pinned magnetic layer 3 is composed of a triple-layered laminate structure. In particular, the pinned magnetic layer 3 is composed of a Co film 11, an Ru film 12, and another Co film 13 and, due to a later-mentioned exchange coupling magnetic field acting at the interface between the pinned magnetic layer 3 and the antiferromagnetic layer 4, the Co film 11 and the Co film 13 are made to have directions of magnetization that are not parallel. This state is generally referred to as ferromagnetic state, and serves to stabilize the magnetization of the pinned magnetic layer 3, while achieving a greater exchange coupling magnetic field occurring at the interface between the pinned magnetic layer 3 and the antiferromagnetic layer 4. The Co film 11 is preferably formed to have a thickness of about 20 Å, the Ru film 12 is preferably formed to have a thickness of about 8 Å, and the Co film 13 is preferably formed to have a thickness of about 15 Å.

Then, the antiferromagnetic layer 4 is formed on the pinned magnetic layer 3. As will be seen from FIG. 3, a first antiferromagnetic layer 14 is formed on the pinned magnetic layer 3, and a second antiferromagnetic layer 15 is formed on the first antiferromagnetic layer 14.

In accordance with the present invention, each of the first antiferromagnetic layer 14 and the second antiferromagnetic layer 15 may be formed from an antiferromagnetic material which contains an element X and Mn, wherein X is selected from the group of elements consisting of Pt, Pd, Ir, Rh, Ru, and Os and combinations thereof.

The X—Mn alloy containing a platinum-group element or elements exhibits superior corrosion resistance and high blocking temperature, as well as superior properties required for an antiferromagnetic material, such as a large exchange coupling magnetic field (Hex). Among these platinum group elements, most suitably used is Pt in the form of, for example, a binary-system Pt—Mn alloy.

In accordance with the present invention, each of the first antiferromagnetic layer 14 and the second antiferromagnetic layer 15 may also be formed from an antiferromagnetic material which contains an element X, an element X' and Mn, wherein the element X' is selected from the group of elements consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb and a rare earth element and combinations thereof.

Preferably, an element that invades and resides in interstices of the space lattice formed by the element X and Mn, or an element which substitutes part of the lattice points of the crystalline structure formed of the element X and Mn, is used as the element X'. A term "solid solution" is used here to mean a solid in which components are uniformly mixed over a wide region.

The formation of an interstitial solid solution or a substitutional solid solution enables the lattice constant of the X—Mn—X' alloy to be greater than the lattice constant of the X—Mn alloy, thus creating a greater difference of the lattice constant from the lattice constant of the pinned magnetic layer 3, making it easy to create a non-aligned crystal lattice state of the interface structure between the antiferromagnetic layer 4 and the pinned magnetic layer 3. When an element that forms a substitutional solid solution is used as the element X', a too large of composition ratio of the element X' will impair the antiferromagnetic properties, resulting in a smaller exchange coupling magnetic field at the interface between the pinned magnetic layer 3 and the antiferromagnetic layer 4. In accordance with the present invention, therefore, it is preferred that an inert rare gas element, such as Ne, Ar, Kr, and Xe and combinations thereof that form an interstitial solid solution, is used as the element X'. The rare gas element is an inert gas, so that it does not significantly affect the antiferromagnetic properties even when it is present in the film and, in addition, Ar is a gas conventionally used as a sputter gas introduced into a sputtering apparatus and, therefore, can easily be contained in the film.

When a gaseous element is used as the element X', it is difficult to form a film containing a large amount of the element X', but a trace amount of element X' contained in the film drastically increases the exchange coupling magnetic field that is generated as a result of a heat treatment, when the gaseous element X' is a rare gas element.

In accordance with the present invention, the composition ratio of the element X' preferably ranges from about 0.2 at % to about 10 at % and, more preferably, from about 0.5 at % to about 5 at %. In accordance with the present invention, it is possible to use Pt as the element X and, hence, to use a Pt—Mn—X' alloy.

The element X or elements X+X', which form the first antiferromagnetic layer 14 and the antiferromagnetic layer 15, may be the same or different elements and may be used for both these antiferromagnetic layers. For instance, it is possible to use, as the material of the first antiferromagnetic layer 14, a Pt—Mn—X' alloy that allows to achieve a large lattice constant, while using a Pt—Mn alloy as the material of the second antiferromagnetic layer 15.

In the state of the laminate structure after the deposition (prior to the heat treatment) shown in FIG. 2, it is important that the composition ratio (at %) of the element X in the first antiferromagnetic layer 14 is greater than the composition ratio (at %) of the element X in the second antiferromagnetic layer 15. When each of the first antiferromagnetic layer 14 and the second antiferromagnetic layer 15 is made from an X—Mn—X' alloy, the composition ratio (at %) of the elements X+X' in the first antiferromagnetic layer 14 is determined to be greater than the composition ratio (at %) of the elements X+X' in the second antiferromagnetic layer 15. When the first antiferromagnetic layer 14 is made of an X—Mn—X' alloy, while the second antiferromagnetic layer 15 is made of an X—Mn alloy, the composition ratio (at %) of the elements X+X' in the first antiferromagnetic layer 14 is greater than the composition ratio (at %) of the element X in the second antiferromagnetic layer 15.

An important role to be played by the first antiferromagnetic layer 14 is to weakenheat treatment the restraint force of the crystalline structure of the pinned magnetic layer 3 when a heat treatment is conducted after deposition of the second antiferromagnetic layer 15 so as to keep the second antiferromagnetic layer 15 away from the restraint force, thereby allowing the disordered lattice of the antiferromagnetic layer 14 to be properly transformed into ordered lattice. In order to reduce the influence of the restraint force produced by the crystalline structure of the pinned magnetic layer 3 at the interface between the antiferromagnetic layer 4 and the pinned magnetic layer 3, it is necessary that the composition ratio of the element X or elements X+X' in the first antiferromagnetic layer is set to a sufficiently large value.

A large composition ratio of the element X or elements X+X' tends to cause the composition to deviate from the composition which is ideal for formation of ordered lattice at the heat treatment, but serves to increase the difference from the lattice constant of the pinned magnetic layer. Increase of the difference in the lattice constant offers a greater freedom of the first antiferromagnetic layer 14 and, hence, of the second antiferromagnetic layer 15 from the restraint force produced by the crystalline structure of the pinned magnetic layer 3.

In accordance with the present invention, it is preferred that a non-aligned crystal lattice state is created at at least part of the interface between the first antiferromagnetic layer 14 and the pinned magnetic layer 3. The presence of non-aligned crystal lattice state at this interface further reduces the influence of the crystalline structure of the pinned magnetic layer 3 on the first antiferromagnetic layer 14.

As explained before, in a bulk type of Pt—Mn alloy, a CuAu—I type face-centered cubic ordered lattice is most easy to obtain and, therefore, antiferromagnetic properties are most easy to achieve, when the at % ratio between Pt and Mn is about 50. Increase of the Pt content beyond about 50 at % on the one hand weakens the antiferromagnetic properties, but on the other hand, enhances the lattice constant of the Pt—Mn alloy, allowing easier creation of the non-aligned crystal lattice state at the interface between the pinned magnetic layer 3 and the antiferromagnetic layer 4.

Preferably, the composition ratio of the element X or elements X+X' of the first antiferromagnetic layer 14 is about 53 at % to about 65 at %. More preferably, this composition ratio is about at % to about 60 at %. Results of experiments that will be described later show that an exchange coupling magnetic field of about $7.9 \times 10^4$ (A/m) or greater is obtainable with such a composition ratio.

It is to be understood that the thickness of the first antiferromagnetic layer 14 is not unrestricted, A too small thickness of the first antiferromagnetic layer weakens the non-aligned crystal lattice state at the interface between the first antiferromagnetic layer 14 and the pinned magnetic layer 3, making it impossible to obtain a proper intensity of the exchange coupling magnetic field through the heat treatment. The first antiferromagnetic layer 14 has a composition which inherently is not liable to exhibit transformation from disordered lattice to ordered lattice. Hence, the first antiferromagnetic layer 14 is less liable to possess antiferromagnetic properties when heat-treated, with the result that a too large thickness of the first antiferromagnetic layer 14 increases the proportion of the region that is hard to transform, which in turn increases the region in which disordered lattice remains without being transformed by heat treatment, whereby the exchange coupling magnetic field is drastically reduced.

In accordance with the present invention, the thickness of the first antiferromagnetic layer 14 is preferably set to be about 3 Å to about 30 Å. Results of experiments which will be described later show that a thickness of the first antiferromagnetic layer 14 falling within the above-specified range provides a large exchange coupling magnetic field (Hex), specifically an exchange coupling magnetic field of about $7.9 \times 10^4$ (A/m) or greater.

Subsequent to the deposition of the first antiferromagnetic layer 14, the second antiferromagnetic layer 15, which has a composition ratio of the element X or the elements X+X' smaller than that in the first antiferromagnetic layer 14, is formed on the first antiferromagnetic layer 14. Preferably, the composition ratio of the element X or the elements X+X' in the second antiferromagnetic layer 15 is 44 at % to about 57 at % and, more preferably, about 46 at % to about 55 at % and, most preferably, about 48 at % to about 53 at %. It is also preferred that the composition ratio of the element X or the elements X+X' in the second antiferromagnetic layer 15 approximates a composition ration that is ideal for causing transformation from disordered lattice to ordered lattice upon a heat treatment, so that the heat treatment executed after the deposition of the second antiferromagnetic layer 15 causes the latter to properly transform its structure from disordered lattice to ordered lattice.

It is to be noted that the thickness of the second antiferromagnetic layer 15 is not unrestricted. It has been confirmed through an experiment that a too small thickness of the second antiferromagnetic layer 15 causes a drastic reduction in the exchange coupling magnetic field (Hex). In accordance with the present invention, it is preferred that the second antiferromagnetic layer 15 has a thickness of at least about 70 Å. A thickness meeting this requirement makes it possible to obtain a large exchange coupling magnetic field, specifically about $7.9 \times 10^4$ (A/m) or greater.

In accordance with the present invention, it is preferred that the first antiferromagnetic layer 14 and the second antiferromagnetic layer 15 are formed by sputtering. In particular, when the first antiferromagnetic layer 14 or the second antiferromagnetic layer 15 is formed of an X—Mn—X' alloy, use of sputtering for depositing this alloy enables the alloy to be deposited in a non-equilibrium state, so that the element X' invades and resides in the interstices of the space lattice constituted by the element X and Mn or substitutes for part of the lattice points of the crystalline lattice formed by the element X and Mn, in the deposited X—Mn—X' alloy. As a result of the formation of an interstitial solid solution or a substitutional solid solution by the use of the element X', the lattice is expanded, so that the lattice constant of the antiferromagnetic layer 4 is increased as compared with the case where the element X' is not contained.

In accordance with the present invention, the deposition of the first antiferromagnetic layer 14 and the second antiferromagnetic layer 15 by sputtering is conducted preferably such that the sputtering gas pressure is maintained in the deposition of the first antiferromagnetic layer 14 at a level lower than that in the deposition of the second antiferromagnetic layer 15. Such a technique provides a composition ratio of the element X or the elements X+X' in the first antiferromagnetic layer 14 greater than that in the second antiferromagnetic layer 15.

Thus, in accordance with the present invention, it is preferred that the antiferromagnetic layer 4 has a laminate structure composed of the first antiferromagnetic layer 14 and the second antiferromagnetic layer 15. The first and second antiferromagnetic layers 14 and 15 are preferably deposited such that the composition ratio of the element X or the elements X+X' in the first antiferromagnetic layer 14 is set to be greater than that in the second antiferromagnetic layer 15, so as to reduce the influence of the restraint force produced by the crystalline structure of the pinned magnetic layer 3 on the first antiferromagnetic layer 14 at the interface between the first antiferromagnetic layer 14 and the pinned magnetic layer 3. Thus, a non-aligned crystal lattice state is created at at least part of the above-mentioned interface, thereby enabling proper transformation from disordered lattice to ordered lattice upon heat treatment, and whereby a large exchange coupling magnetic field is obtainable between the antiferromagnetic layer 4 and the pinned magnetic layer 3.

In accordance with the present invention, as stated before, it is preferred that a non-aligned crystal lattice state is created at at least part of the interface between the first antiferromagnetic layer 14 and the pinned magnetic layer 3 after the deposition of the layers. Such a non-aligned crystal lattice state can be obtained by providing the first antiferromagnetic layer 14 and the second antiferromagnetic layer 15 with different lattice constant values. It suffices only to produce such a difference at at least part of the above-mentioned interface.

Alternatively, different crystal orientations are created at at least part of the first antiferromagnetic layer 14 and the pinned magnetic layer 3. Creation of the above-mentioned non-aligned crystal lattice state at at least part of the interface between the first antiferromagnetic layer 14 and the pinned magnetic layer 3 can be facilitated also by employing different crystal orientations. For instance, when the (111) plane of the pinned magnetic layer 3 has been substantially oriented in a direction parallel to the film surface, the degree of orientation of the (111) plane of the first antiferromagnetic layer 14 is set to be smaller than that of the (111) plane of the pinned magnetic layer 3, or not oriented at all.

In another alternative, when the (111) plane of the first antiferromagnetic layer 3 has been substantially oriented in a direction parallel to the film surface, the degree of orientation of the (111) plane of the pinned magnetic layer 3 is set to be smaller than that of the (111) plane of the first antiferromagnetic layer 14, or the (111) plane of the first antiferromagnetic layer 14 is not oriented at all.

In yet another alternative, the first antiferromagnetic layer 14 is made to have a small degree of orientation, or to have no orientation at all of the (111) plane with respect to the interface between the first antiferromagnetic layer 14 and the pinned magnetic layer 3. The above-mentioned degree of crystalline orientation is controllable by varying factors, such as use or non-use of the underlying layer, composition ratio, electric power and gas pressure during the sputtering, and order of lamination of the layers.

The laminate structure thus formed is then subjected to a heat treatment. As a result of this heat treatment, an exchange coupling magnetic field is generated at the interface between the antiferromagnetic layer 4 and the pinned magnetic layer 3, so that the magnetization of the pinned magnetic layer 3 is formed into a single magnetic domain in a predetermined direction, specifically in the height direction Y shown in FIG. 1.

As described before, the first antiferromagnetic layer 14 is not restrained by the crystalline structure of the pinned magnetic layer 3 at the interface between the first antiferromagnetic layer 14 and the pinned magnetic layer 3. Preferably, a non-aligned state is created at at least part of the above-mentioned interface, so that the second antiferromagnetic layer 15 that is formed on the pinned magnetic layer 1 through the first antiferromagnetic layer 14 starts to transform from disordered lattice to ordered lattice, while maintaining the above-mentioned non-aligned crystal lattice state. This is because the second antiferromagnetic layer 15 is formed from an antiferromagnetic material having a composition approximating the ideal composition for easy transformation from disordered lattice to ordered lattice, as described before.

As a result of the heat treatment, diffusion of elements takes place at the interface between the first antiferromagnetic layer 14 and the second antiferromagnetic layer 15, once such a transformation is started. Such a diffusion allows the elements of the second antiferromagnetic layer 15 to immigrate into the first antiferromagnetic layer 14 and the elements of the first antiferromagnetic layer 14 to immigrate into the second antiferromagnetic layer 15, whereby the antiferromagnetic layer 4 is formed to have a structure in which elements of both the first antiferromagnetic layer 14 and the second antiferromagnetic layer 15 are mixed together without any distinct border.

As a result of the above-described diffusion, at the region near the interface between the first antiferromagnetic layer 14 and the second antiferromagnetic layer 15, the composition ratio (at %) of the element X or the elements X+X' is smaller than that in the first antiferromagnetic layer 14 as initially deposited. Consequently, when the second antiferromagnetic layer 15 starts to be transformed into ordered lattice due to a heat treatment, transformation into ordered lattice is promoted also in the first antiferromagnetic layer 14. Whereas, at the interface between the pinned magnetic layer 3 and the antiferromagnetic layer 4, the first antiferromagnetic layer 14 is freed from the influence of the restraint force of the crystalline structure of the pinned magnetic layer 3, whereby transformation from disordered lattice to ordered lattice takes place over the whole antiferromagnetic layer 4, thus affording a greater exchange coupling magnetic field than ever.

Figure 3:
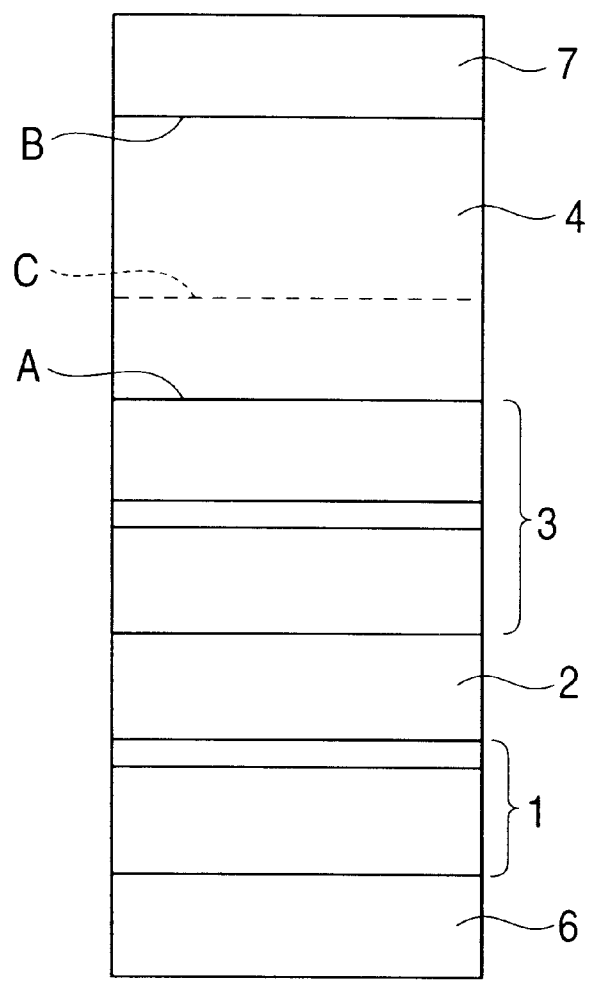
FIG. 3 is a schematic illustration of the laminate structure of FIG. 2 in a state after the heat treatment.

FIG. 3 schematically shows the laminate film prepared by the process described above. No change has been caused in the laminate structure including the underlying layer, the pinned magnetic layer and intervening layers. It is to be understood, however, that the structure of the antiferromagnetic layer 3 is changed from the structure as deposited (prior to the heat treatment: see FIG. 2) to the structure after the heat treatment shown in FIG. 3.

The antiferromagnetic layer 4 shown in FIG. 3 is formed from an antiferromagnetic material containing an element X and Mn, where the element X is selected from the group of elements consisting of Pt, Pd, Ir, Rh, Ru, and Os and combinations thereof, or from an antiferromagnetic element containing an element X, an element X' and Mn, where the element X' is selected from the group of elements consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb and a rare earth element and combinations thereof.

The aforementioned X—Mn—X' alloy preferably has the form of an interstitial solid solution in which the element X' has come into interstices of the space lattice constituted by the element X and Mn, or the form of a substitutional solid solution in which the element X' has substituted for part of the lattice points of the crystal lattice formed of the element X and Mn. Thus, the X—Mn—X' alloy can have an expanded lattice constant over the X—Mn alloy, making it easier to create the non-aligned crystal lattice state at the interface between the antiferromagnetic layer 4 and the pinned magnetic layer after the heat treatment.

In accordance with the present invention, the antiferromagnetic layer 4 has a region in which the ratio of the atomic percent of the element X or elements X+X' to Mn increases in a direction towards the pinned magnetic layer 3. In addition, at least part of the crystalline structure of the antiferromagnetic layer 4 has a CuAu—I type face-centered cubic lattice (ordered lattice). Preferably, a non-aligned crystal lattice state is created at at least part of the interface A.

The reason why the region in which the ratio of the atomic percent of the element X or elements X+X' to Mn increases in a direction towards the pinned magnetic layer 3 exists is that, although the first antiferromagnetic layer 14 and the second antiferromagnetic layer 15 experience diffusion due to the heat treatment, the diffusion is still imperfect and the first antiferromagnetic layer 14 and the second antiferromagnetic layer 15 are not completely diffused in each other: specifically, the antiferromagnetic layer after the heat treatment does not have completely uniform structure.

As explained before with reference to FIG. 2, the composition ratio of the element X or the elements X+X' in the first antiferromagnetic layer 14 at the interface 14 adjacent to the pinned magnetic layer 3 is greater than that in the second antiferromagnetic layer 15, which is separated from the pinned magnetic layer 3 by the first antiferromagnetic layer 14.

As described before, the composition ratio of the element X or the elements X+X' in the second antiferromagnetic layer 15 is set to a value of about 50 at % which is liable to cause transformation into ordered lattice by a heat treatment, requiring that the composition ratio of Mn also be about 50 at %. In contrast, the composition ratio of the element X or the elements X+X' in the first antiferromagnetic layer 14 is set to a value of about 58 at %, in order to reduce the influence of the restraint force of the pinned magnetic layer 3 at the interface A adjacent to the pinned magnetic layer 3, which requires a smaller Mn content to be present than in the second antiferromagnetic layer 15.

Although the heat treatment causes mutual diffusion of compositions between the first antiferromagnetic layer 14 and the second antiferromagnetic layer 15, such a diffusion is still imperfect and the antiferromagnetic layer 4 has a gradient of the composition ratio of the atomic percent of the element X or elements X+X' to that of Mn that progressively increases towards the pinned magnetic layer 3.

As a result of the above-described diffusion, a greater atomic percent of the element X or the elements X+X' is achieved in the region near the interface A adjacent to the pinned magnetic layer 3 than in the region near the interface B opposite to the interface A.

The antiferromagnetic layer 4 is transformed from disordered lattice into ordered lattice as a result of the heat treatment, so that at least part of the crystalline structure of the antiferromagnetic layer 4 has CuAu—I type face-centered cubic lattice (ordered lattice) and, further, it is preferred that a non-aligned crystal lattice state is created at at least part of the interface A adjacent to the pinned magnetic layer 3.

When the aforementioned antiferromagnetic layer 4 is formed of a Pt—Mn alloy, the ratio c/a between the lattice constants "a" and "c" of the antiferromagnetic layer 4 partly transformed into ordered lattice, i.e., the antiferromagnetic layer 4 after the heat treatment, preferably falls within the range of from about 0.93 to about 0.99.

A lattice constant ratio c/a falling down below about 0.93 allows almost the entirety of the crystalline structure of the antiferromagnetic layer to be transformed into ordered lattice, producing undesirable effects such as delamination due to reduction in the adhesion between the antiferromagnetic layer 4 and the pinned magnetic layer 3.

Conversely, a lattice constant ratio c/a above about 0.99 allows almost the entirety of the crystalline structure of the antiferromagnetic layer to remain in the state of ordered lattice, reducing disadvantageously the exchange coupling magnetic field at the interface between the antiferromagnetic layer 4 an the pinned magnetic layer 3.

In accordance with the present invention, it is preferred that a non-aligned crystal lattice state is created at at least part of the interface between the pinned magnetic layer 3 and the antiferromagnetic layer 4. Creation of such a non-aligned crystal lattice state is facilitated by allowing the pinned magnetic layer 3 and the antiferromagnetic layer 4 to have different lattice constants at at least part of the above-mentioned interface.

Thus, in this invention, the arrangement may be such that the antiferromagnetic layer has a region in which the ratio of the atomic percent of the element X or the elements X+X' to Mn increases in a direction towards the pinned magnetic layer 3, and the crystalline structure of at least part of the antiferromagnetic layer may have been changed into CuAu—I type face-centered cubic ordered lattice and, in addition, the antiferromagnetic layer 4 and the pinned magnetic layer 3 have different lattice constants at at least part of the interface A. These features in combination also afford a greater exchange coupling magnetic field than the conventional art.

Alternatively, the structure after the heat treatment may be such that a region exists in which the ratio of the atomic percent of the element X or the elements X+X' to Mn increases in a direction towards the pinned magnetic layer 3 and that at least part of the crystalline structure of the antiferromagnetic layer 4 has CuAu—I type face-centered ordered lattice, while allowing the antiferromagnetic layer 4 and the pinned magnetic layer 3 to have different crystalline structures at at least part of the interface A.

For instance, when the (111) plane of the pinned magnetic layer 3 has been substantially oriented in the direction of the film plane, the (111) plane of the antiferromagnetic layer 4 is oriented at a smaller degree of orientation than the (111) plane of the pinned magnetic layer 3, or not oriented at all. Conversely, if the (111) plane of the antiferromagnetic layer 4 has been substantially oriented in a direction parallel to the aforementioned interface, the (111) plane of the pinned magnetic layer 3 is oriented at a smaller degree of orientation than the (111) plane of the antiferromagnetic layer 4, or not oriented at all.

Alternatively, the degrees of orientation of the (111) planes of the antiferromagnetic layer 4 and of the pinned magnetic layer 3 are both reduced with respect to the direction parallel to the interface between the antiferromagnetic layer 4 and the pinned magnetic layer 3, or these (111) are not oriented at all.

It is also possible to facilitate creation of the non-aligned crystal lattice state at the interface between the pinned magnetic layer 3 and the antiferromagnetic layer 4 and to obtain a greater exchange coupling magnetic field than found in devices of the prior art, by employing different crystal orientations for the pinned magnetic layer 3 and the antiferromagnetic layer 4.

The elements constituting the antiferromagnetic layer 4 after the heat treatment depend on the composition elements of the first antiferromagnetic layer 14 and the second antiferromagnetic layer 15 employed in the deposition prior to the heat treatment and, therefore, when both the first antiferromagnetic layer 14 and the second antiferromagnetic layer 15 are deposited by using the same elements for instance, the first antiferromagnetic layer 4 after the heat treatment has the same elements over its entirety.

It is preferred that the first antiferromagnetic layer 14 is deposited with an antiferromagnetic material that affords a greater lattice constant, in order that the non-aligned crystal lattice state be maintained at the interface between the first antiferromagnetic layer 14 and the pinned magnetic layer 3, in the as-deposited state prior to the heat treatment. The second antiferromagnetic layer 15 is deposited from an antiferromagnetic material that permits a smooth transformation from disordered lattice to ordered lattice upon the heat treatment. Thus, antiferromagnetic materials having different composition elements may be used for the first antiferromagnetic layer 14 and the second antiferromagnetic layer 15.

For instance, the particular element X or the elements X+X' constituting the portion of the antiferromagnetic layer 4 near the interface A adjacent to the pinned magnetic layer 3 after the heat treatment may partly be the same as or different from that at the interface B opposite to the interface A, when a Pt—Mn—Cr alloy is used as the material of the first antiferromagnetic layer 14 while a Pt—Mn alloy is used as the material of the second antiferromagnetic layer 15, or when a Pt—Mn—Cr alloy is used as the material of the first antiferromagnetic layer 14 while a Pd—Mn alloy is used as the material of the second antiferromagnetic layer 15.

As described before, the antiferromagnetic layer 4 after the heat treatment has a region in which the ratio of atomic percent of the element X or the elements X+X' to Mn progressively increases in a direction towards the pinned magnetic layer 3. It is, however, preferred that, in the region near the interface A, the composition ratio of the element X or the elements X+X' is about preferably about 50 at % to about 65 at % of said element X where a total composition ratio of all the elements constituting the antiferromagnetic layer is expressed as being 100 at %. This range of the composition ratio of the element X or the elements X+X' depends on the composition ratio of the element X or the elements X+X' of the first antiferromagnetic layer 14 as deposited, i.e., prior to the heat treatment and the diffusion of composition elements caused by the heat treatment.

More specifically, it is preferred that, as described before, the composition ratio of the element X or the element X+X' is about 53 at % to about 65 at %. A diffusion of elements takes place also at the interface A between the first antiferromagnetic layer 14 and the pinned magnetic layer 3. For these reasons, it is understood that the composition ratio of the element X or the elements X+X' in the region near the interface A between the antiferromagnetic layer 4 and the pinned magnetic layer 3 is reduced from that obtained in the as-deposited state, leaving a possibility that the composition ratio of the element X or the elements X+X' diminishes to below about 53 at %. For this reason, the preferred composition ratio of the element X or the elements X+X' in the region near the interface A after the heat treatment is carried out is preferably about 50 at % to about 65 at %. A more preferred composition ratio of the element X or the elements X+X' is about 50 at % to about 60 at %.

In accordance with the present invention, the composition ratio of the element X or the elements X+X' of the antiferromagnetic layer 4 near the surface opposite to the above-mentioned interface A is preferably about 44 at % to about 57 at % of said element X where a total composition ratio of all the elements constituting the antiferromagnetic layer 4 is represented by 100 at %. The composition ratio of the element X or the elements X+X' in the region near the interface B depends on the composition ratio of the element X or the elements X+X' of the second antiferromagnetic layer 15 in the as-deposited state, i.e., prior to the heat treatment.

As stated above, it is preferred that the composition ratio of the element X or the elements X+X' of the second antiferromagnetic layer 15 is preferably about 44 at % to about 57 at %. Therefore, the preferred range of the element X or the elements X+X' in the region near the interface B opposite to the above-mentioned interface A in the state after the heat treatment is about preferably about 44 at % to about 57 at %, as is the case of the composition ratio in the second antiferromagnetic layer 15. A more preferred range of the element X or the elements X+X' is about 46 at % to about 55 at %.

In accordance with the present invention, the volume of the region in which the composition ratio of the element X or the elements X+X' is about 46 at % to about 55 at % occupies about 70% to about to about 90% of the total volume of the antiferromagnetic layer 4. The fact that the volume ratio of the above-mentioned region falls within the above-specified range means that the transformation of the antiferromagnetic layer 4 caused by the heat treatment from the disordered lattice to ordered lattice has been properly completed, offering a greater exchange coupling magnetic field.

A description will now be given of a composition modulation occurring in the direction of thickness of the antiferromagnetic layer 4. As described before, in accordance with the present invention, the antiferromagnetic layer has a region in which the ratio of the atomic percent of the element X or the element X+X' to Mn increases in a direction towards the pinned magnetic layer 3. In addition to this feature, the antiferromagnetic layer 4 may have a composition modulation as described below.

Continuing to refer to FIG. 3, assume here an imaginary boundary plane extending in parallel to the interface within the thickness of the antiferromagnetic layer 4, so as to divide the antiferromagnetic layer 4 in thicknesswise direction into a first region between the imaginary boundary plane and the interface A and a second region between the imaginary boundary plane and the interface B opposite to the interface A. In such a case, the above-mentioned ratio may be linearly or non-linearly increase from the second region to the first region across the imaginary boundary plane.

For instance, the imaginary boundary mentioned above is represented by a broken line C. Thus, the broken line C indicates the interface between the first antiferromagnetic layer 14 and the second antiferromagnetic layer 15 of the antiferromagnetic layer 4 as deposited, i.e., prior to the heat treatment. (See FIG. 2)

In the state as deposited, the composition ratio of the element X or the elements X+X' is greater in the first antiferromagnetic layer 14 than in the second antiferromagnetic layer 15. It is understood that the heat treatment causes diffusion of the composition across the interface between the first antiferromagnetic layer 14 and the second antiferromagnetic layer 15. After the heat treatment, therefore, the above-mentioned ratio is greater in the first region between the interface A and the imaginary boundary (broken line C) than in the second region between the imaginary boundary (broken line C) and the interface B opposite to the interface A and, in addition, the above-mentioned ratio linearly or non-linearly increases from the second region to the first region within a transient region including the above-mentioned imaginary boundary. In particular, the non-linear increase of the above-mentioned ratio tends to occur when the composition ratio of the element X or the elements X+X' in the first antiferromagnetic layer 14 is significantly greater than that in the second antiferromagnetic layer 15 in the as-deposited state.

In accordance with the present invention, the antiferromagnetic layer 4 preferably has a region in which the composition ratio (atomic percent) of the element X or the elements X+X' increases in a direction towards the pinned magnetic layer 3. According to the present invention, as described before, the composition ratio of the element X or the elements X+X' in the first antiferromagnetic layer 14 in the antiferromagnetic layer as deposited (prior to heat treatment) adjacent to the pinned magnetic layer 3 is determined to be greater than that in the second antiferromagnetic layer 15. Despite any composition modulation caused in the region between the first antiferromagnetic layer 14 and the second antiferromagnetic layer 15 by the heat treatment, the composition ratio (atomic percent) of the element X or the elements X+X' in the portion adjacent to the pinned magnetic layer that has been constituted by the first antiferromagnetic layer before the heat treatment, is still greater than that in the region that has been constituted by the second antiferromagnetic layer, so that the above-mentioned composition modulation takes place in a certain portion.

In accordance with the present invention, it is preferred that a region exists near the interface A between the antiferromagnetic layer 4 and the pinned magnetic layer 3, in which the atomic percent of the element X or the elements X+X' decreases in a direction towards the pinned magnetic layer 3.

As a result of the best treatment, a diffusion of elements takes place between the antiferromagnetic layer 4 and the pinned magnetic layer 3, in the region of the antiferromagnetic layer 4 near the interface A between the antiferromagnetic layer 4 and the pinned magnetic layer 3. Such a diffusion will result in a smaller composition ratio of the element X or the elements X+X' in the region near the interface A than that was achieved in the as-deposited state.

The antiferromagnetic layer 4, when it has a region in which the composition ratio of the element X or the element X+X' decreases in a direction towards the pinned magnetic layer 3 in the region near the interface A as in the case of the present invention, causes the transformation from the disordered lattice to ordered lattice to be properly effected in the region near the interface A, whereby a large exchange coupling magnetic field is generated.

In the heat-treated antiferromagnetic layer 4, it is preferred that the composition ratio of the element X or the elements X+X' is maximized in the region that immediately underlies the interface A adjacent to pinned magnetic layer 3 and which has a thickness of not smaller than 3 Å to about 30 Å as measured from the interface A in the thicknesswise direction towards the side B opposite to the interface A. This range of thickness is the preferred range of thickness of the first antiferromagnetic layer 14 in the as-deposited state prior to the heat treatment.

In accordance with the present invention, a protective layer 7 made of, for example, Ta or the like is formed on the side B of the antiferromagnetic layer 4 opposite to the interface A adjacent to the pinned magnetic layer 3. A composition modulation due to heat treatment occurs also at the boundary between the second antiferromagnetic layer 15 as deposited and the protective layer 7. Thus, in accordance with the present invention, a region may exist in the antiferromagnetic layer 4 near the side thereof opposite to the pinned magnetic layer 3, in which the composition ratio of the element X or the elements X+X' decreases in a direction towards the above-mentioned side of the antiferromagnetic layer 4.

In accordance with the present invention, the antiferromagnetic layer 4 preferably has a thickness at least about 73 Å. As explained before with reference to FIG. 2, the smallest thickness of the first antiferromagnetic layer 14 is preferably about 3 Å, and the smallest thickness of the second antiferromagnetic layer 15 is about 70 Å, so that the total minimum thickness of the antiferromagnetic layer 4 is about 73 Å or greater. Thus, in accordance with the present invention, the minimum thickness required for the antiferromagnetic layer 4 is about 73 Å, which is significantly smaller than that required for the conventional structure. This means that the gap width can be reduced when the laminate structure of FIG. 3 is used as a thin-film magnetic head.

Although in the described embodiment the antiferromagnetic layer 4 as deposited (prior to the heat treatment) is composed of a dual-layer structure having the first antiferromagnetic layer 14 and the second antiferromagnetic layer 15, this is only illustrative and other production method can also be employed. For example, an exchange coupling magnetic field greater than those of the conventional structures can be obtained even when the antiferromagnetic layer 4 as deposited (prior to the heat treatment) is composed of a single layer, provided that the following production process is employed.

More specifically, in accordance with the present invention, the antiferromagnetic layer 4 may be formed by a sputtering process in which an element X and Mn are used as the sputtering targets, where the element X is selected from the group of elements consisting of Pt, Pd, Ir, Rh, Ru, and Os and combinations thereof, while the sputtering gas pressure is progressively increased in the direction away from the pinned magnetic layer 3 during the deposition of the antiferromagnetic layer 4. Accordingly, the composition ratio (atomic percent) of the element X is reduced in the direction away from the side of the antiferromagnetic layer 4 adjacent to the pinned magnetic layer 3. When this method is used, it is preferred that a non-aligned crystal lattice state is obtained at at least part of the interface between the antiferromagnetic layer 4 and the pinned magnetic layer 3.

The preferred range of the element X in the region near the side opposite to the above-mentioned interface in the state after the heat treatment is preferably set to be about 44 at % to about 57 at %, more preferably about 46 at % to about 55 at %.

By virtue of these features, the portion of the antiferromagnetic layer 4 near interface between the antiferromagnetic layer 4 and the pinned magnetic layer 3 is freed from the influence of the restraint force produced by the crystalline structure of the pinned magnetic layer 3, while the remainder portion of the antiferromagnetic layer 4 other than the region near the above-mentioned interface can have a composition having a composition ratio (at %) of the element X which approaches an ideal composition that facilitates transformation from disordered lattice to ordered lattice when subjected to a heat treatment. It is therefore possible to effect a proper transformation of the antiferromagnetic layer 4 as deposited from disordered lattice to ordered lattice, by effecting a heat treatment on the antiferromagnetic layer as deposited. Further, since the heat treatment possibly causes diffusion of elements in the antiferromagnetic layer 4, the transformation from disordered lattice to ordered lattice properly takes place in the antiferromagnetic layer 4, thus making it possible to obtain a greater exchange coupling magnetic field than in the conventional structures.

When a non-aligned crystal lattice state exists in the above-mentioned interface, the antiferromagnetic layer 4 is conveniently freed from the restraint force produced by the crystalline structure of the pinned magnetic layer 3, so that the transformation of the whole antiferromagnetic layer 4 is promoted.

It is also preferred that the antiferromagnetic layer 4 has a thickness of at least about 73 Å. This minimum value of about 73 Å is the sum of the minimum thicknesses that are required, as explained before with reference to FIG. 2, for the first antiferromagnetic layer 14 and the second antiferromagnetic layer 15, which in combination form the antiferromagnetic layer 4. In particular, referring again to FIG. 2, the minimum required thickness of the first antiferromagnetic layer is 3 about Å, while the minimum required thickness for the second antiferromagnetic layer 15 is about 70 Å, so that the minimum thickness required for the antiferromagnetic layer is about 73 Å.

In the case where the antiferromagnetic layer 4 as deposited (prior to the heat treatment) is formed of a single layer, the composition ratio of the element X is preferably about 53 at % to about 65 at % and, more preferably, about 55 at % to about 60 at %, in the thicknesswise region of at least about 3 Å as measured from the interface adjacent to the pinned magnetic layer 3, expressing the composition ratio of all the elements in this region by 100 at % heat treatment. The remainder region having a thickness of about 70 Å or greater preferably has a composition of the element X of about 44 at % to about 57 at % and, more preferably, about 46 at % to about 55 at %. With these features, it is possible to obtain an exchange coupling magnetic field of about $7.9 \times 10^4$ (A/m) or greater, as in the case of the structure shown in FIG. 2.

In accordance with the present invention, the antiferromagnetic layer 4 may also be formed by a sputtering process in which an element X, an element X' and Mn are used as the sputtering targets, where the element X' is selected from the group of elements consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb and a rare earth element and combinations thereof. The sputtering gas pressure is progressively increased in the direction away from the pinned magnetic layer 3 during the deposition of the antiferromagnetic layer 4, whereby the composition ratio (atomic percent) of the elements X+X' is reduced in the direction away from the side of the antiferromagnetic layer 4 adjacent to the pinned magnetic layer 3.

Preferably, an element that invades interstices of the space lattice formed by the element X and Mn, or an element which substitutes part of the lattice points of the crystalline structure formed of the element X and Mn, is used as the element X'. Such an element X' allows the lattice constant of the X—Mn—X' alloy to be expanded over the lattice constant of the X—Mn alloy, thus making it easy to maintain a non-aligned crystal lattice state at the interface A adjacent to the pinned magnetic layer 3.

As stated before, according to the present invention, it is preferred that a non-aligned crystal lattice state is created at at least part of the interface A between the antiferromagnetic layer 4 and the pinned magnetic layer 3. One of the methods for creating such a non-aligned state is to employ, at at least part of the above-mentioned interface, different lattice constants for the antiferromagnetic layer 4 and the pinned magnetic layer 3.

Thus, the present invention may be carried out such that, when the antiferromagnetic layer 4 is formed by a sputtering process using an element X and Mn as the puttering targets or using elements X+X' and Mn as the sputtering targets, the sputtering gas pressure is progressively increased in the direction away from the pinned magnetic layer 3 during the deposition of the antiferromagnetic layer 4. Accordingly, the composition ratio (atomic percent) of the element X or the elements X+X' is reduced in the direction away from the side of the antiferromagnetic layer 4 adjacent to the pinned magnetic layer 3, while employing, during the deposition of the antiferromagnetic layer 4, different lattice constants for the antiferromagnetic layer 4 and the pinned magnetic layer 3 at at least part of the interface A between the antiferromagnetic layer 4 and the pinned magnetic layer 3.

Alternatively, the invention may be carried out such that, when the antiferromagnetic layer 4 is formed by a sputtering process using an element X and Mn as the puttering targets or using elements X+X' and Mn as the sputtering targets, as described above, different crystal orientations are formed for the antiferromagnetic layer 4 and the pinned magnetic layer 3 at at least part of the interface A between the antiferromagnetic layer 4 and the pinned magnetic layer 3. Creation of non-aligned crystal lattice state at at least part of the interface between the antiferromagnetic layer 4 and the pinned magnetic layer 3 is facilitated also by causing the antiferromagnetic layer 4 and the pinned magnetic layer 3 to have different crystal orientations.

By effecting a heat treatment on the laminate structure formed by the described process, it is possible to obtain a laminate structure similar to that shown in FIG. 3. Thus, the antiferromagnetic layer 4 after the deposition is formed of an antiferromagnetic material containing an element X and Mn or, alternatively, elements X+X' and Mn, and has a region in which the ratio of the atomic percent of the element X or the elements X+X' increases in a direction towards the antiferromagnetic layer 3, wherein the crystalline structure of at least part of the antiferromagnetic layer has a CuAu—I type face-centered cubic ordered lattice, and a non-aligned crystal lattice state is created at at least part of the interface A.

Figure 4:
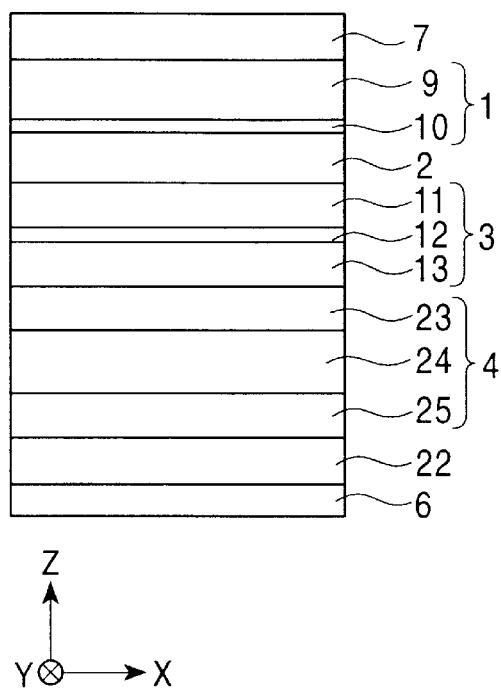
FIG. 4 is a schematic illustration of a laminate structure in accordance with the present invention using a seed layer in a state after deposition and prior to a heat treatment.
Figure 5:
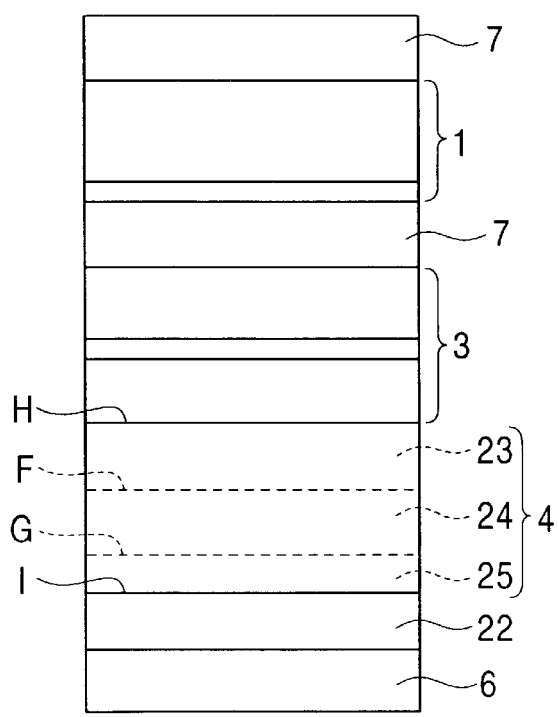
FIG. 5 is a schematic illustration of the laminate structure of FIG. 4 in a state after the heat treatment.
Figure 6:
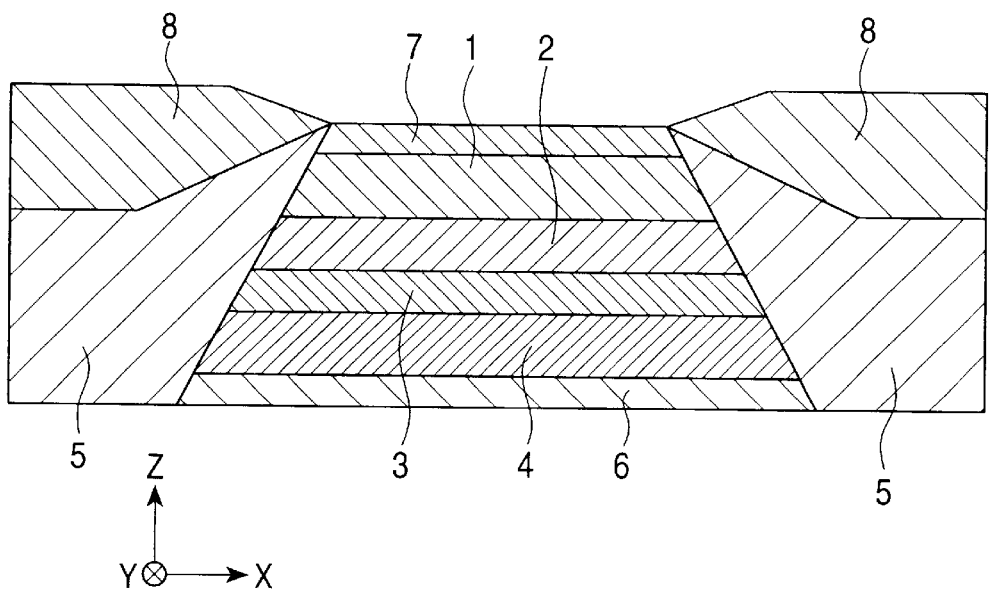
FIG. 6 is a cross-sectional view of the structure of a single spin valve type magnetoresistive sensor in accordance with a second embodiment of the present invention, as viewed from the same side as an ABS surface.

FIG. 4 shows a laminate structure employing a seed layer 22 in a state as deposited, i.e., in a state prior to a heat treatment. FIG. 5 shows the laminate structure obtained by effecting the heat treatment on the laminate structure shown in FIG. 4. The laminate structure of FIG. 4 and, hence, the laminate structure of FIG. 5 are used in the production of a single-spin-valve type magnetoresistive sensor having an antiferromagnetic layer 4 underlying a pinned magnetic layer 3 as shown in FIG. 6 by way of example.

In a first processing step, a seed layer 22 is formed on an underlying layer 6, and then an antiferromagnetic layer 4 is formed on the seed layer 22. The underlying layer 6 is preferably formed of at least one element selected from the group consisting of Ta, Hf, Nb, Zr, Ti, Mo, and W. The underlying layer 6 is intended to align the (111) plane of the seed layer 22 thereon substantially in the direction parallel to the interface between the underlying layer 6 and the seed layer 22. The underlying layer preferably has a thickness of, for example, about 50 Å.

The seed layer 22 is mainly constituted by face-centered cubic crystals, with the (111) plane substantially oriented in the direction parallel to the interface between the seed layer 22 and the antiferromagnetic layer 4. It is preferred that the seed layer is formed of an Ni—Fe alloy or an Ni—Fe—Y alloy, where Y is at least one element selected from the group consisting of Cr, Rh, Ta, Hf, Nb, Zr, and Ti. The seed layer 22 formed from such a material on the underlying layer 6 serves to preferentially facilitate the substantial orientation of the (111) plane in the direction parallel to the interface adjacent to the antiferromagnetic layer 4.

Preferably, the seed layer 22 is formed of a non-magnetic material. The non-magnetic nature of the seed layer 22 serves to enhance the specific resistance of the seed layer 22. Shunting of the sense current into the seed layer 22 undesirably causes reduction of the ratio of resistance variation (ΔMR) or generation of Barkhausen noise.

When a non-magnetic material is used as the material of the seed layer 22, the Ni—Fe—Y alloy, Y being at least one element selected from the group consisting of Cr, Rh, Ta, Hf, Nb, Zr, and Ti, may be selected as such a non-magnetic material, among the materials mentioned above. Such material has a face-centered crystalline structure and, moreover, the (111) plane thereof can easily be substantially aligned in the direction parallel to the interface adjacent to the antiferromagnetic layer 4. The seed layer 22 preferably has a thickness of, for example, about 30 Å.

As will be seen from FIG. 4, the antiferromagnetic layer 4 formed on the seed layer 22 is composed of a laminate structure having a first antiferromagnetic layer 23, a second antiferromagnetic layer 24, and a third antiferromagnetic layer 25. In accordance with the present invention, each of the first antiferromagnetic layer 23, second antiferromagnetic layer 24, and the third antiferromagnetic layer 25 may be formed from an antiferromagnetic material that contains an element X and Mn, wherein X is selected from the group of elements consisting of Pt, Pd, Ir, Rh, Ru, and Os and combinations thereof.

Alternatively, each of the first antiferromagnetic layer 23, second antiferromagnetic layer 24, and the third antiferromagnetic layer 25 may be formed from an antiferromagnetic material that contains an element X, an element X' and Mn, wherein the element X' is selected from the group of elements consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb and a rare earth element and combinations thereof.

In each of the above-described structures, the X—Mn—X' alloy is preferably an interstitial solid solution in which the element X' has come into the interstices of a space lattice formed by the element X and Mn, or a substitutional solid solution in which part of the lattice points of the crystal lattice formed by the element X and Mn has been substituted by the element X'. The X—Mn—X' alloy in the form of an interstitial solid solution or a substitutional solid solution has an expanded lattice constant over that of the X—Mn alloy.

In accordance with the present invention, the composition ratio of the element X or the elements X+X' in each of the first and third antiferromagnetic layers 23 and 25 is determined to be greater than that in the second antiferromagnetic layer 24. The second antiferromagnetic layer 24 formed between the first and third antiferromagnetic layers 23 and 25 is made of an antiferromagnetic material which approximates an ideal composition that is easy to be transformed from disordered lattice to ordered lattice by a heat treatment.

The reason that the composition ratio of the element X or the elements X+X' in each of the first and third antiferromagnetic layers 23 and 25 is determined to be greater than that in the second antiferromagnetic layer 24 is the same as that described before with reference to FIG. 2. In particular, it is intended that restraint forces produced by the crystalline structures of the pinned magnetic layer 3 and the seed layer 22 and acting at the respective interfaces are diminished so as to allow an easy transformation of the antiferromagnetic layer 4 under the heat treatment.

Preferably, the composition ratio of the element X or elements X+X' of each of the first antiferromagnetic layer 23 and the third antiferromagnetic layer 25 is about 53 at % to about 65 at % and, more preferably, about 55 at % to about 60 at %. Preferably, the thickness of each of the first antiferromagnetic layer 23 and the third antiferromagnetic layer 25 is about 3 Å to about 30 Å. For instance, in the embodiment shown in FIG. 4, the thickness of each of the first antiferromagnetic layer 23 and the third antiferromagnetic layer 25 is preferably about 10 Å.

Preferably, the composition ratio of the element X or elements X+X' of the second antiferromagnetic layer 24 is about 44 at % to about 57 at % and, more preferably, about 46 at % to about 55 at %. A composition ratio of the element X or the elements X+X' falling within this range permits easy transformation of the second antiferromagnetic layer 24 from disordered lattice to ordered lattice by the heat treatment. Preferably, the thickness of the second antiferromagnetic layer 24 is about at least about 70 Å. For instance, in the embodiment shown in FIG. 4, the thickness of the second antiferromagnetic layer 24 is preferably about 100 Å.

Preferably, each of the first, second and third antiferromagnetic layers 23, 24 and 25 are formed by sputtering. It is also preferred that the sputtering process for of each of the first antiferromagnetic layer 23 and the third antiferromagnetic layer 25 is conducted at a sputter gas pressure lower than that for the second antiferromagnetic layer 24. Such a lower sputtering gas pressure provides a greater composition of the element X or the elements X+X' for each of the first and third antiferromagnetic layers 23 and 25 than for the second antiferromagnetic layer 24.

Alternatively, in accordance with the present invention, the antiferromagnetic layer 4 as deposited is not formed of a three-layered laminate structure as described, but of a single-layered structure in accordance with the following process. Even with a single-layered process, it is possible to create a suitable variation of the composition ratio (atomic percent) of the element X or the elements X+X' in the direction of thickness of the antiferromagnetic layer 4.

The antiferromagnetic layer 4 is deposited by using the element X and Mn or, alternatively, the elements X+X' and Mn, as the sputtering targets, while progressively increasing the sputtering gas pressure in the direction away from the seed layer 22 and, when the deposition has proceeded to about a half of the final thickness, the sputtering gas pressure is progressively decreased until the deposition of the antiferromagnetic layer is completed. When such a deposition technique is used, the composition ratio (atomic percent) of the element X or the elements X+X' is progressively increased from the interface adjacent to the seed layer 22 towards the thicknesswise central region of the antiferromagnetic layer 4 and then progressively decreased towards the interface adjacent to the pinned magnetic layer 3.

It is thus possible to form an antiferromagnetic layer 4 in which the composition ratio (atomic percent) of the element X or the elements X+X' is large at the interface adjacent to the seed layer 22 and also at the interface adjacent to the pinned magnetic layer 3, and is minimum at the thicknesswise central region of the antiferromagnetic layer 4. Preferably, the composition ratio of the element X or the composition ratio of the elements X+X' of the antiferromagnetic layer to the total composition ratio (100 at %) of all the elements constituting the antiferromagnetic layer 4 is preferably about 53 (at %) to about 65 (at %) and, more preferably, about 55 (at %) to about 60 (at %), in the region near the interface between the antiferromagnetic layer 4 and the pinned magnetic layer, as well as in the region near the antiferromagnetic layer 4 and the seed layer 22.

It is also preferred that in the method of the present invention, the composition ratio of the element X or the composition ratio of the elements X+X' of the antiferromagnetic layer 4 is about 44 (at %) to about 57 (at %) and, more preferably, about 46 (at %) to about 55 (at %), in the thicknesswise central region of the antiferromagnetic layer and the ferromagnetic layer 4. It is also preferred that the thickness of the antiferromagnetic layer is about 76 Å or greater.

The pinned magnetic layer 3 is formed on the antiferromagnetic layer 4, as shown in FIG. 4. In the embodiment shown in FIG. 4, the pinned magnetic layer 3 has a so-called ferromagnetic state constituted by three layers: namely, a Co film 11, a Ru film 12 and a Co film 13, as in the case of the embodiment shown in FIG. 2. The Co film 11 is formed to have a thickness of about 20 Å, the Ru film 12 is formed to have a thickness of about 8 Å, and the Co film 13 is formed to have a thickness of about 15 Å.

As a result of this heat treatment, the antiferromagnetic layer 4 is properly transformed to change its crystalline structure from a disordered lattice to an ordered lattice, without being restrained by the restraint forces produced by the seed layer 22 and the pinned magnetic layer 3 at the interfaces adjacent to the seed layer 22 and the pinned magnetic layer 3. Accordingly, an exchange coupling magnetic field is generated at the interface between the antiferromagnetic layer 4 and the pinned magnetic layer 3, and the magnetization of the pinned magnetic layer 3 is formed into a single magnetic domain in a direction, specifically in the height direction Y.

In accordance with the present invention, a non-aligned crystal lattice state is created at at least part of the interface between the seed layer 22 and the pinned magnetic layer 3. The presence of such a non-aligned crystal lattice state reduces the influence of the restraint forces produced by the seed layer 22 and the pinned magnetic layer 3 at the respective interfaces, thus promoting transformation of the antiferromagnetic layer 4 into ordered structure.

In accordance with the present invention, the antiferromagnetic layer 4 has the first and third antiferromagnetic layers 23 and 25 which are formed at the sides thereof contacting the seed layer 22 and the pinned magnetic layer 3 and each of which has a large composition ratio of the element X or the elements X+X'. A second antiferromagnetic layer 24 is interposed between the first antiferromagnetic layer 23 and the third antiferromagnetic layer 25 and has a composition that is easy to transform from disordered lattice to the ordered lattice. Therefore, transformation proceeds at the second antiferromagnetic layer 24 as a result of a heat treatment, while diffusion of composition takes place at the boundaries between the first antiferromagnetic layer 23 and the second antiferromagnetic layer 24 and between the second antiferromagnetic layer 24 and the third antiferromagnetic layer 25. Accordingly, transformation from the disordered lattice to ordered lattice takes place also in the first antiferromagnetic layer 23 and in the third antiferromagnetic layer 25, while properly maintaining non-aligned crystal lattice state at the interface between the first antiferromagnetic layer 23 and the seed layer 22, as well as at the interface between the third antiferromagnetic layer 25 and the pinned magnetic layer 3. Accordingly, a proper transformation occurs in the whole antiferromagnetic layer 4. In accordance with the present invention, it is possible to expect a proper transformation over the known arts and, hence, a greater exchange coupling magnetic field, specifically an exchange magnetic coupling of about $7.9 \times 10^4$ (A/m) or greater.

A non-magnetic intermediate layer 2, such as of Cu is formed on the pinned magnetic layer 3, and a free magnetic layer 1 is formed on the non-magnetic intermediate layer 2. The free magnetic layer 1 is formed of, for example, an Ni—Fe alloy film 9 and a Co film 10. The non-magnetic intermediate layer 2 preferably has a thickness of, for example, about 22 Å, while the N—Fe alloy film 9 preferably has a thickness of about 45 Å, and the Co film 10 preferably has a thickness of about 5 Å. Then, a protective layer 7 of, for example, Ta is formed on the free magnetic layer 1, as shown in FIG. 4. The protective layer 7 preferably has a thickness of, for example, about 30 Å.

In accordance with the present invention, as stated before, the seed layer 22 is formed on the lower side of the antiferromagnetic layer 4, i.e., on the side of the antiferromagnetic layer 4 opposite to the interface adjacent to the pinned magnetic layer 3. The seed layer is constituted primarily of face-centered crystalline structure, with the (111) plane oriented in a direction parallel to the interface adjacent to the antiferromagnetic layer 4. Therefore, the crystals of the layers on the seed layer 22, starting from the antiferromagnetic layer 4 and terminating in the free magnetic layer 1, are also liable to be aligned such that their (111) planes are substantially oriented in a direction parallel to the above-mentioned interface, allowing the crystal grains to grow large. Such large crystal grains increases the ratio of resistance variation (ΔMR), offering improved reproduction characteristics.

As described before, the embodiment shown in FIG. 4 provides not only improved ratio of resistance variation but also a large exchange coupling magnetic field. The ratio of resistance variation is reduced when the exchange coupling magnetic field is reduced. Exchange coupling magnetic field is necessary to a certain extent, also from the viewpoint of improvement in the ratio of resistance variation.

A heat treatment is conducted after the deposition of the layers, from the underlying layer 6 up to the protective layer 7, shown in FIG. 4. FIG. 5 shows the structure of the layers after the heat treatment. The seed layer 22 on the underlying layer 6 is formed of Ta, or the like, and still remains in its crystalline structure primarily constituted by face-centered cubic crystals with the (111) plane oriented in a direction parallel to the interface adjacent to the antiferromagnetic layer 4, even in the structure shown in FIG. 5 obtained after the heat treatment.

The antiferromagnetic layer 4 formed on the seed layer 22 has a crystalline structure at least part of which is formed of a CuAu—I type face-centered ordered lattice, and each of the layers from the antiferromagnetic layer 4 to the free magnetic layer 1 have their (111) planes substantially oriented in the direction parallel to the aforementioned interface and, further, a non-aligned crystal lattice state is created at at least part of the interface I between the antiferromagnetic layer 4 and the seed layer 22 and at at least part of the interface H between the antiferromagnetic layer 4 and the pinned magnetic layer 3.

As described above, in the present invention, layers from the antiferromagnetic layer 4 to the free magnetic layer 1 have crystalline structures with their (111) planes oriented in the direction parallel to the aforementioned interface and, at the same time, have large crystal grains, thus offering a greater resistance variation ratio ($\Delta$MR).

As described above, the seed layer 22 is preferably formed from an Ni—Fe alloy or an Ni—Fe—Y alloy, where Y is at least one element selected from the group consisting of Cr, Rh, Ta, Hf, Nb, Zr, and Ti, in particular from a non-magnetic. The non-magnetic nature of the seed layer 22 serves to enhance the specific resistance of the seed layer 22, so that shunting of a sense current from the conductive layer to the seed layer 22 is suppressed to afford a greater resistance variation ratio, while suppressing generation of Barkhausen noise.

Furthermore, in accordance with the present invention, a non-aligned crystal lattice state is created at at least part of the interface I between the antiferromagnetic layer 4 and the seed layer 22, and at at least part of the interface H between the antiferromagnetic layer 4 and the pinned magnetic layer 3. Moreover, the crystalline structure of at least part of the antiferromagnetic layer 4 has been transformed into CuAu—I type face-centered cubic ordered lattice structure, suggesting that the antiferromagnetic layer 4 has been properly transformed from disordered lattice structure to ordered lattice structure. Thus, a greater exchange coupling magnetic field than found in the prior art is generated between the antiferromagnetic layer 4 and the pinned magnetic layer 3, specifically an exchange coupling magnetic field of about $7.9 \times 10^4$ (A/m) or greater.

In accordance with the present invention, the antiferromagnetic layer 4 and the seed layer 22 may have different lattice constants at at least part of the aforementioned interface I, and the antiferromagnetic layer 4 and the pinned magnetic layer 3 may have different lattice constants at at least part of the aforementioned interface H. This permits a non-aligned crystal lattice state to be created at at least part of the interface I between the antiferromagnetic layer 4 and the seed layer 22 and at at least part of the interface H between the antiferromagnetic layer 4 and the pinned magnetic layer 3.

The heat treatment causes a diffusion of composition at the interface F between the first antiferromagnetic layer 23 and the second antiferromagnetic layer 24 and at the interface G between the third antiferromagnetic layer 25 and the second antiferromagnetic layer 24. As a result, the interfaces F and G become obscure and indefinite after the heat treatment.

The antiferromagnetic layer 4 is preferably formed from an antiferromagnetic material containing an element X and Mn, where the element X is selected from the group of elements consisting of Pt, Pd, Ir, Rh, Ru, and Os and combinations thereof, or from an antiferromagnetic element containing an element X, an element X' and Mn, where the element X' is selected from the group of elements consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb and a rare earth element and combinations thereof. The aforementioned X—Mn—X' alloy, when used as the material of the antiferromagnetic layer 4, preferably has the form of an interstitial solid solution in which the element X' has come into interstices of the space lattice constituted by the element X and Mn, or the form of a substitutional solid solution in which the element X' has substituted for part of the lattice points of the crystal lattice formed of the element X and Mn. The X—Mn—X' alloy can expand the lattice constant over that of the X—Mn alloy, making it possible to properly maintain the non-aligned crystal lattice state at the interface between the seed layer 22 and the pinned magnetic layer 3.

Preferably, the antiferromagnetic layer 4 after the heat treatment has a region in which the ratio of the atomic percent of the element X or the elements X+X' increases towards the seed layer 22. The presence of such a composition modulation means that the transformation into the ordered lattice structure has been properly effected by the heat treatment. The region of the above-mentioned composition modulation can be achieved by fixing the composition ratio of the element X or the elements X+X' in the third antiferromagnetic layer 25 to be greater than that in the second antiferromagnetic layer 24 in the as-deposited state, i.e., in the state shown in FIG. 4 prior to the heat treatment. The composition ration can be achieved by varying the sputter gas pressure during the deposition of the antiferromagnetic layer 4, such that the atomic percent of the element X or the elements X+X' is progressively decreased towards the thicknesswise center of the antiferromagnetic layer 4. With this feature, the transformation into the ordered lattice structure is properly performed at the interface I between the seed layer 22 and the antiferromagnetic layer 4, without being influenced by any restraint force produced by the crystalline structure of the seed layer 22, thus providing a greater exchange coupling magnetic field than ever.

In addition to the above-described composition modulation, the antiferromagnetic layer 4 has a region in which the ratio of the atomic percent of the element X or the elements X+X' increases in a direction towards the pinned magnetic layer 3. This can be achieved by fixing the composition ratio of the element X or the elements X+X' in the first antiferromagnetic layer 23 to be greater than that in the second antiferromagnetic layer 24 in the as-deposited state, i.e., in the state shown in FIG. 4 prior to the heat treatment. The composition can be achieved by varying the sputter gas pressure during the deposition of the antiferromagnetic layer 4 such that the composition ratio (atomic percent) of the element X or the elements X+X' is progressively decreased from the thicknesswise central region towards the pinned magnetic layer 3.

Thus, the antiferromagnetic layer 4 adjoining to the seed layer 22 shown in FIG. 5 has a thicknesswise region between the thicknesswise central region and the pinned magnetic layer 3 in which the atomic percent of the element X or the elements X+X' to Mn progressively increases in a direction towards the pinned magnetic layer 3, and a thicknesswise region between the thicknesswise central region and the seed layer 22 in which the atomic percent of the element X or the elements X+X' to Mn progressively increases towards the seed layer 22.

Representing by 100 at % the composition ratio of all the elements constituting the region of the first antiferromagnetic layer 2 near the interface I adjacent to the seed layer 22, as well as that in the region of the first antiferromagnetic layer near the interface H adjacent to the pinned magnetic layer 3, the composition ratio of the element X or the elements X+X' is preferably about 50 at % to about 65 at %. This range is derived from the proper composition range (about 53 at % to about 65 at %) of the first antiferromagnetic layer 23 and the third antiferromagnetic layer 25 in the as-deposited state prior to the heat treatment. The minimum value (about 50 at %) of the composition ratio allowed in the antiferromagnetic layer 4 after the heat treatment is smaller than the above-mentioned minimum value (about 53 at % allowed for the first antiferromagnetic layer 23 and the third antiferromagnetic layer 25, because of diffusions of compositions at the interface I between the antiferromagnetic layer 4 and the seed layer 22 and at the interface H between the antiferromagnetic layer 4 and the pinned magnetic layer 3 caused by the heat treatment. The composition ratio of the element X or the elements X+X' is preferably about 50 at % to about 60 at % in each of the interface I adjacent to the seed layer 22 and the interface H adjacent to the pinned magnetic layer 3.

The composition ratio (atomic percent) of the element X or the elements X+X' after the heat treatment is preferably about 44 at % to about 57 at % in the thicknesswise central region. This range of the composition ratio is derived from the preferred composition ratio (about 44 at % to about 57 at %) of the element X or the elements X+X' of the second antiferromagnetic layer 24 in the as-deposited state, i.e., prior to the heat treatment. More preferably, the above-mentioned composition ratio of the element X or the elements X+X' is about 46 at % to about 55 at %.

Referring to FIG. 5, two imaginary boundary planes extend in parallel to the interfaces adjacent to the pinned magnetic layer 3 and the seed layer 22, within the thickness of the antiferromagnetic layer 4. The ratio of the atomic percent of the element X or the elements X+X' to Mn is greater in a third region and in a first region than in a second region, wherein the third region is a region between the interface H adjacent to the pinned magnetic layer 3 and a second imaginary boundary plane adjacent to the interface H. The first region is a region between the interface I adjacent to the seed layer 22 and a first imaginary boundary plane G and the second region is the region between the two imaginary boundary planes G and F. The above-mentioned ratio preferably increases linearly or non-linearly from the second region towards the first region across the first imaginary boundary plane G and from the second region towards the third region across the second imaginary boundary. A broken line G of FIG. 5 indicates the first imaginary boundary plane, while a broken line F shown in FIG. 5 indicates the second imaginary boundary plane. The broken lines F and G are drawn at thicknesswise positions where the interface between the first antiferromagnetic layer 23 and the second antiferromagnetic layer 24 and the interface between the second antiferromagnetic layer 24 and the third antiferromagnetic layer 25 existed in the as-deposited state prior to the heat treatment.

In the as-deposited structure prior to the heat treatment, the composition ratio of the element X or the elements X+X' is greater in the first and third antiferromagnetic layers 23 and 25 than in the second antiferromagnetic layer 24. It is understood that a subsequent heat treatment causes diffusion at the interfaces between the second antiferromagnetic layer 24 and the first and third antiferromagnetic layers 23, 25. Accordingly, in the state after the heat treatment, the ratio of the atomic percent of the element X or the elements X+X' to Mn in the third region between the interface H facing the pinned magnetic layer 3 and the second imaginary boundary plane (broken line F) adjacent to the interface H, as well as that in the first region between the interface I facing the seed layer 22 and the first imaginary boundary plane (broken line G) adjacent to the interface I, is greater than the ratio of the atomic percent of the element X or the elements X+X' to Mn in the second region between these imaginary boundary planes. In addition, the ratio of atomic percent of the element X or the elements X+X' to Mn linearly or non-linearly increases from the second region towards the third region across the second imaginary boundary plane (broken line F) and, likewise, increases linearly or non-linearly from the second region towards the first region across the first imaginary boundary plane (broken line G). In particular, the non-linear change described above is liable to occur when the composition ratio of the element X or the elements X+X' is significantly greater in each of the first and third antiferromagnetic layers 23 and 25 than in the second antiferromagnetic layer 24.

It is thus understood that, in the antiferromagnetic layer 4 after the heat treatment, the composition ratio (atomic percent) of the element X or the elements X+X' increases from a certain thicknesswise central portion towards the interface H adjacent to the pinned magnetic layer 3 and also increases from the above-mentioned thicknesswise central portion towards the interface I adjacent to the seed layer 22. This is due to the fact that the composition ratio of the element X or the elements X+X' is greater in each of the first and third antiferromagnetic layers 23 and 25 than in the second antiferromagnetic layer 24.

The heat treatment also causes diffusion of the compositions between the antiferromagnetic layer 4 and the pinned magnetic layer 3 across the interface H and between the antiferromagnetic layer 4 and the seed layer 22 across the interface I. Accordingly, the composition ratio of the element X or the elements X+X' is decreased from that achieved in the as-deposited state, at each of the regions near these interfaces H and I.

In accordance with the present invention, therefore, the antiferromagnetic layer 4 preferably has a region near the interface I adjacent to the seed layer 22, in which the atomic percent of the element X or the elements X+X' decreases towards the seed layer 22, as well as a region near the interface H adjacent to the pinned magnetic layer 3, in which the atomic percent of the element X or the elements X+X' decreases towards the pinned magnetic layer 3.

The diffusion of elements occurring at each of the interface H between the antiferromagnetic layer 4 and the pinned magnetic layer 3 and the interface I between the antiferromagnetic layer 4 and the seed layer 22 causes the atomic percent of the element X or the elements X+X' to be decreased in the region near each of these interfaces H and I from the atomic percent that was achieved in the as-deposited state. Accordingly, a proper transformation from disordered lattice to ordered lattice takes place in the regions near these interfaces H and I, making it possible to produce a large exchange coupling magnetic field.

Preferably, in the heat-treated antiferromagnetic layer 4, the region in which the composition ratio (atomic percent) of the element X or the elements X+X' decreases towards the interface H adjacent to the pinned magnetic layer 3 is a region which has a thickness about 3 Å to about 30 Å as measured from the interface H towards the thicknesswise center of the antiferromagnetic layer 4. The region in which the composition ratio (atomic percent) of the element X or the elements X+X' decreases towards the interface I adjacent to the seed layer 22 is a region which has a thickness about 3 Å to about 30 Å, as measured from the interface I towards the thicknesswise center of the antiferromagnetic layer 4. These thickness ranges are the preferred thicknesses of the first and third antiferromagnetic layers 23 and 25 in the as-deposited state prior to the heat treatment.

Preferably, the antiferromagnetic layer 4 has a thickness which is at least about 76 Å. As explained before with reference to FIG. 4 in connection with the production process, each of the first and third antiferromagnetic layers has the minimum thickness of about 3 Å, while the minimum thickness required for the second antiferromagnetic layer 24 is about 70 Å, so that the minimum required thickness of the whole first antiferromagnetic layer 4 is about 76 Å. Thus, in accordance with the present invention, the minimum thickness required for the antiferromagnetic layer 4 is as small as 76 Å, which is significantly smaller than that required for the conventional structure.

A hard bias layer 5 for aligning the magnetization of the free magnetic layer 1, as well as a conductive layer 8, is formed on each side of the laminate structure including the lowermost underlying layer 6 and the topmost protective layer 7 and the layers intermediate therebetween, as shown in FIG. 1.

Although the laminate structure as deposited (prior to the heat treatment) employing the seed layer 22 as shown in FIG. 4 has the antiferromagnetic layer 4 composed of three layers which serve to enhance the exchange coupling magnetic field, the present invention does not exclude the use of an antiferromagnetic layer 4 having a uniform X—Mn or a uniform X+X' composition. In such a case, it is necessary that a non-aligned crystal lattice state is created at at least part of the interface between the seed layer 22 and the antiferromagnetic layer 4, or that the seed layer 22 and the antiferromagnetic layer 4 are made to have different lattice constants at at least part of this interface. More preferably, a non-aligned crystal lattice state is created at at least part of the interface between the seed layer 22 and the antiferromagnetic layer 4 and, at the same time, the seed layer 22 and the antiferromagnetic layer 4 are made to have different lattice constants at at least part of this interface.

A single-layered antiferromagnetic layer 4 is formed of a $Pt_{52}Mn_{48}$ alloy. The antiferromagnetic layer 4 made of such a Pt—Mn alloy exhibits a comparatively small degree of non-aligned crystal lattice state with respect to the seed layer 22 and the pinned magnetic layer 3 so that the exchange coupling magnetic field decreases correspondingly. Nevertheless, the resistance variation ratio is improved by virtue of the presence of the seed layer 22. This is because the crystalline structure of at least part of the antiferromagnetic layer 4 has a CuAu—I type cubic ordered lattice and the above-mentioned layers have such crystal orientations that the (111) planes are substantially oriented in a direction parallel to the antiferromagnetic layer 4 and the pinned magnetic layer 3 to create a non-aligned crystal lattice state at at least part of the interface between the antiferromagnetic layer 4 and the seed layer 22. In this case also, the antiferromagnetic layer 4 and the seed layer 22 may have different lattice constants at at least part of the interface therebetween.

In accordance with the invention, the antiferromagnetic layer 4 may be composed of the second antiferromagnetic layer 24 and the third antiferromagnetic layer 25, with the first antiferromagnetic layer 23 adjacent to the pinned magnetic layer 3 being omitted. In such a case, the restraint force produced by the crystalline structure of the pinned magnetic layer 3 tends to provide a greater influence at the interface adjacent to the pinned magnetic layer 3, such that the exchange coupling magnetic field is reduced. This problem is not critical if the interface adjacent to the seed layer 22 is held in a state to avoid the influence of the restraint force produced by the crystalline structure of the seed layer 22. The exchange coupling field is still greater as compared with the case where a significant influence is caused by the restraint force produced by the crystalline structure of the seed layer 22 at the interface adjacent to the seed layer 22. The proper transformation of the antiferromagnetic layer 4 from disordered lattice to ordered lattice is ensured to a certain degree, without impairing the large resistance variation ratio offered by the presence of the seed layer 22. In this case, the antiferromagnetic layer 4 has a composition modulation similar to that explained before with reference to FIG. 3. In particular, it is preferred that the antiferromagnetic layer 4 has a region in which the ratio of the atomic percent of the element X or the elements X+X' to Mn increases in a direction towards the seed layer 22. Assuming a first imaginary boundary plane parallel to the interface adjacent to the seed layer 22 at the same side of the thicknesswise central portion of the antiferromagnetic layer 4 as the seed layer 22 and a second imaginary boundary plane parallel to the interface adjacent to the pinned magnetic layer 3 at the same side of the thicknesswise central portion as the pinned magnetic layer 3, the aforementioned ratio is greater in the region between the interface adjacent the seed layer 22 and the first imaginary boundary plane than in the region between the first and second imaginary boundary planes. The ratio increases linearly or non-linearly across the first imaginary boundary plane towards the interface adjacent to the seed layer 22. It is also preferred that a non-aligned crystal lattice state is created at at least part of the interface between the seed layer 22 and the antiferromagnetic layer 4.

Preferably, the antiferromagnetic layer 4 has a region starting from a certain thicknesswise position towards the seed layer 22, in which the atomic percent of the element X or the elements X+X' increases in a direction towards the seed layer 22 and, more preferably, the antiferromagnetic layer 4 further has a region near the interface adjacent to the seed layer 22, in which the atomic percent of the element X or the elements X+X' decreases in a direction towards the seed layer 22.

In the case where the seed layer 22 is employed, the material of the antiferromagnetic layer 4 is not limited to the X—Mn alloy or the X—Mn—X' alloy which are mentioned heretofore. For example, it is possible to use an Ni—Mn alloy that has been conventionally used as an antiferromagnetic material, or other antiferromagnetic material free of Mn. The large resistance variation ratio offered by the invention due to the presence of the seed layer 22 is achievable even when such materials are used.

In addition, the three-layered structure of the antiferromagnetic layer 4 as shown in FIG. 4 may be employed even when the laminate structure lacks the seed layer 22 as in FIG. 2. Assuming that the antiferromagnetic layer 4 in the structure of FIG. 2 is composed of three layers and that the structure is subjected to a heat treatment, the antiferromagnetic layer 4 after the heat treatment will have a region in which the ratio of the atomic percent of the element X or the elements X+X' to Mn increases in a direction towards the pinned magnetic layer 3 starting from a thicknesswise central portion, and a region in which the ratio of the atomic percent of the element X or the elements X+X' to Mn increases in a direction towards the protective layer starting from the above-mentioned thicknesswise central portion. The crystalline structure of at least part of the antiferromagnetic layer 4 has a CuAu—I type face-centered cubic ordered crystal lattice. In this case also, it is preferred that a non-aligned crystal lattice state is created at at least part of the interface adjacent to the pinned magnetic layer 3 or that the antiferromagnetic layer 4 and the pinned magnetic layer 3 have different lattice constants at at least part of the above-mentioned interface. The structure shown in FIG. 2 has the protective layer 7 made of a non-magnetic material such as a material selected from the group consisting of Ta, Hf, Nb, Zr, Ti, Mo, and W and combinations thereof, formed on the side of the antiferromagnetic layer 4 opposite to the pinned magnetic layer 3. Accordingly, it is believed that a diffusion of composition takes place between the protective layer 7 and the antiferromagnetic layer 4, with the result that a region in which the atomic percent of the element X or the elements X+X' progressively decreases is formed near the interface adjacent to the protective layer 7.

Each of the laminate structures shown in FIGS. 2 to 5 can be employed in a variety of types of magnetoresistive sensors. In the laminate structures of FIGS. 2 and 3, the antiferromagnetic layer 4 may be deposited on the lower side of the pinned magnetic layer 3, although in these Figures the antiferromagnetic layer 4 is deposited on the upper side of the pinned magnetic layer 3. In such a case, the exchange coupling film is formed by depositing, starting from the lower side, the second antiferromagnetic layer 15, the first antiferromagnetic layer 14, and the pinned magnetic layer 3 in this order. The thickness requirements for the first and second antiferromagnetic layers 14 and 15 are the same as those described before with reference to FIG. 2.

The structure having the antiferromagnetic layer 4 formed on the lower side of the pinned magnetic layer 3 can be used as, for example, a single-spin-valve type magnetoresistive sensor as shown in FIG. 6. The single spin valve type magnetoresistive sensor shown in FIG. 6 has a laminate structure composed of an underlying layer 6, an antiferromagnetic layer 4, a pinned magnetic layer 3, a non-magnetic intermediate layer 2, a free magnetic layer 1, and a protective layer 7 which are sequentially deposited from the bottom in this order, and has a hard bias layer 5 and a conductive layer 8 formed on each side of the laminate structure.

In the production of the single-spin-valve type magnetoresistive sensor of FIG. 6, the antiferromagnetic layer 4 may be deposited to have a three-layered structure similar to that explained before with reference to FIG. 4. Thus, the third antiferromagnetic layer 25, second antiferromagnetic layer 24 and the first antiferromagnetic layer are laminated on the underlying layer 6. Materials, compositions and thicknesses of these antiferromagnetic layers may be the same as those described before in connection with FIG. 4.

A subsequent heat treatment causes diffusions of elements from and into the respective antiferromagnetic layers. Accordingly, the antiferromagnetic layer 4, as heat-treated, has a region in which the ratio of the atomic percent of the element X to Mn increases in a direction towards the pinned magnetic layer 3 starting from a thicknesswise central portion of the antiferromagnetic layer 4, as well as a region in which the ratio of the atomic percent of the element X to Mn increases in a direction towards the pinned magnetic layer 3 starting from the thicknesswise central portion of the antiferromagnetic layer 4. The crystalline structure of at least part of the antiferromagnetic layer 4 has a CuAu—I type face-centered cubic ordered crystal lattice and, preferably, a non-aligned state crystal lattice is created at at least part of the interface adjacent to the pinned magnetic layer 3 or, alternatively, both layers on this interface employ difference lattice constants.

The process forming the antiferromagnetic layer 4 described above is not exclusive, and the first antiferromagnetic layer 4 may be formed by varying the sputter gas pressure so that the atomic percent of the element X or the elements X+X' is progressively changed n the thicknesswise direction, while using the same target.

In the laminate structures of FIGS. 4 and 5 having the seed layer 22, the antiferromagnetic layer 4 may be deposited on the upper side of the pinned magnetic layer 3, although in these Figures the antiferromagnetic layer 4 is deposited on the lower side of the pinned magnetic layer 3. Such a laminate structure can be used as a single-spin-valve type magnetoresistive sensor of the type shown in FIG. 1.

More specifically, the underlying layer 6, free magnetic layer 1, non-magnetic intermediate layer 2, pinned magnetic layer 3, antiferromagnetic layer 4, seed layer 22, and a protective layer 7 are laminated in this order from the bottom, and hard bias layers 5 and conductive layers 8 are formed on the respective sides of the resultant laminate structure. Requirements concerning the crystalline structure and material of the seed layer 22 are the same as those described before with reference to FIGS. 4 and 5.

Figure 7:
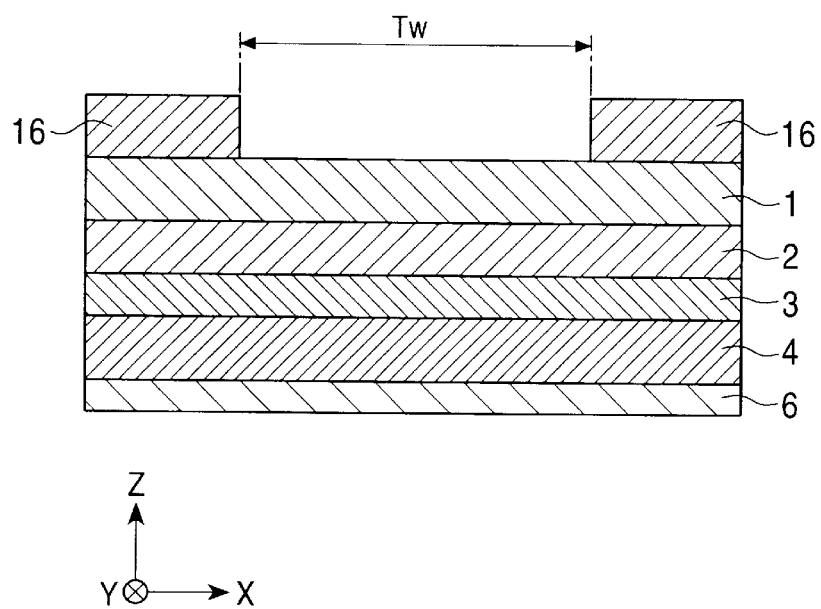
FIG. 7 is a cross-sectional view of the structure of a single spin valve type magnetoresistive sensor in accordance with a third embodiment of the present invention, as viewed from the same side as an ABS surface.
Figure 8:
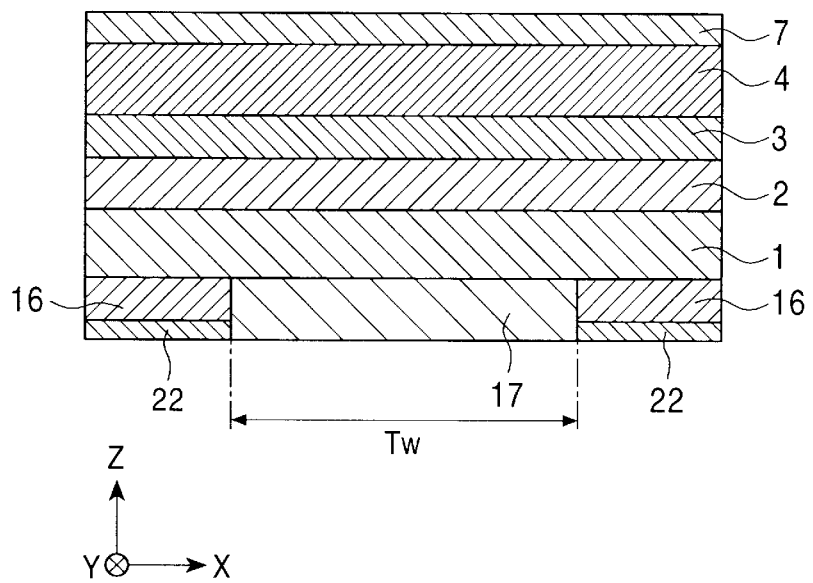
FIG. 8 is a cross-sectional view of the structure of a single spin valve type magnetoresistive sensor in accordance with a fourth embodiment of the invention, as viewed from the same side as an ABS surface.

FIGS. 7 and 8 are cross-sectional views of different forms of the single-spin-valve type magnetoresistive sensor in accordance with the present invention. Referring to FIG. 7, an underlying layer 6, an antiferromagnetic layer 4, a pinned magnetic layer 3, a non-magnetic intermediate layer 2, and a free magnetic layer 1 are deposited in this order from the bottom. Thus, the antiferromagnetic layer 4 is formed on the lower side of the pinned magnetic layer 3 in this embodiment.

In a preferred production process, the second antiferromagnetic layer 15 and the first antiferromagnetic layer 14 described before with reference to FIG. 2, are formed on the underlying layer 6 in this order, and the pinned magnetic layer 3 is formed on the first antiferromagnetic layer 14. Alternatively, the antiferromagnetic layer 4 may have a three-layered structure, such as that described before with reference to FIG. 4. Preferably, each of the first antiferromagnetic layer 14 and the second antiferromagnetic layer 15 is preferably an X—Mn alloy where X is selected from the group of elements consisting of Pt, Pd, Ir, Rh, Ru, and Os and combinations thereof and, more preferably, a Pt—Mn alloy, or an X—Mn—X' alloy, where X' is selected from the group of elements consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb and a rare earth element and combinations thereof.

In this invention, it is preferred that a non-aligned crystal lattice state has been created at at least part of the interface between the first antiferromagnetic layer 14 and the pinned magnetic layer 3. In addition, the second antiferromagnetic layer 15 is made of an antiferromagnetic material having a composition which approximates an ideal composition that permits easy transformation from disordered lattice to ordered lattice upon a heat treatment. The requirements concerning the composition ratios of the element X or the elements X+X' and the thickness in the first antiferromagnetic layer 14 and the second antiferromagnetic layer 15 and the thicknesses of these layers are the same as those explained before with reference to FIG. 2.

The process forming the antiferromagnetic layer 4 described above is not exclusive, and the first antiferromagnetic layer 4 may be formed by varying the sputter gas pressure so that the atomic percent of the element X or the elements X+X' is progressively changed n the thicknesswise direction, while using the same target.

A heat treatment is conducted after the deposition of the antiferromagnetic layer 4. The heat treatment causes a proper transformation from disordered lattice structure into ordered lattice structure in the second antiferromagnetic layer 15, as well as a diffusion of elements at the boundary between the first antiferromagnetic layer 14 and the second antiferromagnetic layer 15. Accordingly, whereby transformation from disordered lattice structure into ordered lattice structure is properly effected in the first antiferromagnetic layer 14.

Preferably, the ratio of the atomic percent of the element X or the elements X+X' in the state after the heat treatment increases in a direction towards the pinned magnetic layer 3, with the crystalline structure of at least part of the antiferromagnetic layer 4 having a CuAu—I type face-centered cubic ordered lattice, and with a non-aligned crystal lattice state created at at least part of the interface between the antiferromagnetic layer 4 and the pinned magnetic layer 3. It is also preferred that the pinned magnetic layer 3 and the antiferromagnetic layer 4 have different lattice constants or different crystal orientations at the interface therebetween.

When the antiferromagnetic layer 4 has been deposited to have a three-layered structure as shown in FIG. 4 or when the antiferromagnetic layer 4 has been deposited such that the composition ratio of the element X or the elements X+X' progressively decreases in a direction towards the thicknesswise central portion from both interfaces on the antiferromagnetic layer 4, the heat-treated antiferromagnetic layer 4 has a region in which the ratio of the atomic percent of the element X to Mn progressively increases in a direction towards the pinned magnetic layer 3 starting from a thicknesswise central portion of the antiferromagnetic layer 4. Additionally, a region is formed in which the ratio of the atomic percent of the element X to Mn progressively increases in a direction towards the underlying layer 6 starting from the above-mentioned thicknesswise central portion of the antiferromagnetic layer 4. In addition, the crystalline structure of at least part of the antiferromagnetic layer 4 has a CuAu—I type face-centered cubic ordered lattice and, preferably, a non-aligned crystal lattice state is created at at least part of the interface adjacent to the pinned magnetic layer 3 or, alternatively, both layers on the above-mentioned interface have different lattice constants or different crystal orientations.

As shown in FIG. 7, segments 16, 16 of the exchange bias layer are formed on the free magnetic layer 1, leaving therebetween a space corresponding to the track width Tw in the track width direction. The exchange bias layer 16 is formed from an X—Mn alloy, wherein X is selected from the group of elements consisting of Pt, Pd, Ir, Rh, Ru, and Os and combinations thereof, and in particular, a Pt—Mn alloy, or from an X—Mn—X' alloy, wherein X' is selected from the group of elements consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb and a rare earth element and combinations thereof.

Deposition of the exchange bias layer 16 employs the steps of forming a first antiferromagnetic layer 14 on the free magnetic layer 1, and forming a second antiferromagnetic layer 15 on the first antiferromagnetic layer 14. These first antiferromagnetic layer 14 and second antiferromagnetic layer 15 are the same as those shown in FIG. 2. The first antiferromagnetic layer 14 has a greater composition ratio of the element X or the elements X+X' than the second antiferromagnetic layer 15 and, in addition, the second antiferromagnetic layer 15 is formed of an antiferromagnetic material having a composition approximating an ideal composition that permits easy transformation from disordered lattice structure into ordered lattice structure when heat-treated.

As a result of the above-described heat treatment, the exchange bias layer 16 is properly transformed from disordered lattice structure into ordered lattice structure, without undergoing the restraint force produced by the crystalline structure of the pinned magnetic layer 3 at the interface adjacent to the free magnetic layer 1. Accordingly, an exchange coupling magnetic field is generated at the interface between the exchange bias layer 16 and the free magnetic layer 1.

The exchange bias layer 16 after the heat treatment has a region in which the ratio of the atomic percent of the element x or elements X+X' to Mn increases in a direction towards the free magnetic layer 1, the crystalline structure of at least part of the exchange bias layer 16 has a CuAu—I type face-centered cubic ordered lattice and, preferably, a non-aligned crystal lattice state is created at at least part of the interface adjacent to the free magnetic layer 1.

The exchange bias layer 16 may be formed to have a three-layered structure such as that described before with reference to FIG. 4. In this case, the exchange bias layer 16 has a region in which the ratio of the atomic percent of the element X to Mn increases in a direction towards the free magnetic layer 1 starting from the thicknesswise central region of this layer, and a region in which the ratio of the atomic percent of the element X to Mn increases in the direction away from the free magnetic layer 1 starting from the thicknesswise central region of this layer. In addition, the crystalline structure of at least part of the exchange bias layer 16 has a CuAu—I type face-centered cubic ordered lattice and, preferably, a non-aligned crystal lattice state is created at at least part of the interface adjacent to the free magnetic layer 1 or, alternatively, both layers on the above-mentioned interface have different lattice constants or different crystal orientations.

Both end portions of the free magnetic layer 1 are formed into single magnetic domain in the X direction by the effect of the exchange coupling magnetic field acting between the exchange bias layer 16 and the free magnetic layer 1, and the region of the free magnetic layer 1 extending over the width Tw corresponding to the track width has been properly aligned in the X direction to such a degree as to be sensitive to external magnetic fields.

In the single-spin-valve type magnetoresistive sensor produced by the described process, the magnetization of the free magnetic layer 1 at the region of the track width Tw changes from the X direction to Y direction under the influence of an external magnetic field which is applied in the Y direction. Electric resistance is changed based on the relationship between the change of the magnetization in the free magnetic layer 1 and the fixed direction (Y direction) of magnetization of the pinned magnetic layer 3, the change in the electrical resistance causing a change in a voltage, thus enabling sensing of magnetic field leaking from a recording medium.

The single-spin-valve type magnetoresistive sensor of FIG. 7 may have a seed layer 22 such as that explained before with reference to FIGS. 4 and 5. In such a case, the seed layer 22 is interposed between the antiferromagnetic layer 4 and the underlying layer 6. The seed layer has a crystalline structure primarily constituted by face-centered cubic crystals, with the (111) plane substantially oriented in a direction parallel to the interface adjacent to the antiferromagnetic layer 4. The use of the seed layer 22 permits substantial orientation of the (111) plane in the layers inclusive of the antiferromagnetic layer 4 and the free magnetic layer 1, as well as the intervening layers, thus allowing the crystal grains to grow large. It is therefore possible to increase the ratio of the resistance variation.

The requirements concerning the material of the seed layer 22 and the structure of the antiferromagnetic layer 4 are the same as those described before with reference to FIGS. 4 and 5. The seed layer 22 may be formed on the exchange bias layer 16.

FIG. 8 shows a single-spin-valve type magnetoresistive sensor having a laminate structure deposited in the order reverse to that of the magnetoresistive sensor of FIG. 7. Referring to FIG. 8, segments 16 of the exchange bias layer are formed so as to be spaced apart from each other by a distance corresponding to the track width Tw, and the vacancy between these segments 16 of the exchange bias layer is filled with an insulating layer 17 made of an insulating material such as $SiO_2$ or $Al_2O_3$. A free magnetic layer 1 is formed to cover the exchange bias layer 16 and the insulating layer 17. In this embodiment also, the exchange bias layer 16 as deposited, i.e., prior to the heat treatment, has a laminate structure composed of a first antiferromagnetic layer 14 and a second antiferromagnetic layer 15.

More specifically, the second antiferromagnetic layer 15 is deposited first, followed by deposition of the first antiferromagnetic layer 14 thereon, and the widthwise central portion of the first antiferromagnetic layer 14 and second antiferromagnetic layer 15 is removed by etching for example, whereby the segments 16 of the exchange bias layer are obtained. The vacancy between the segments 16 of the exchange bias layer being then filled with the insulating layer 17, followed by deposition of the free magnetic layer 17 overlying the exchange bias layer 16 and the insulating layer 17. The first antiferromagnetic layer 14, constituting part of the exchange bias layer 16, has a greater composition ratio of the element X or the elements X+X' than the second antiferromagnetic layer 15, which constitutes the other part of the exchange bias layer 16. In addition, the second antiferromagnetic layer 15 is formed of an antiferromagnetic material having a composition approximating an ideal composition that permits easy transformation from the disordered lattice structure into ordered lattice structure. The requirement concerning the composition ratios of the element X or the elements X+X' and thicknesses of the first antiferromagnetic layer 14 and the second antiferromagnetic layer 15 are the same as those explained before with reference to FIG. 2.

The laminate structure after deposition up to the free magnetic layer 1 is subjected to a heat treatment. As a result of the heat treatment, the exchange bias layer 16 is properly transformed to change its structure from disordered lattice structure into ordered lattice structure, without being influenced by the restraint force of the crystalline structure of the free magnetic layer 1 at the interface adjacent to the free magnetic layer 1. An exchange coupling magnetic field is generated at the boundary between the exchange bias layer 16 and the free magnetic layer 1. The exchange bias layer 16, after the heat treatment, has a region in which the ratio of the element X or the elements X+X' to Mn increases in a duration towards the free magnetic layer 1. At the same time, the crystalline structure of at least part of the exchange bias layer has been changed into CuAu—I type face-centered square ordered lattice and, in addition, a non-aligned crystal lattice state has been created at at least part of the interface adjacent to the free magnetic layer. Both end portions of the free magnetic layer 1 are formed into single magnetic domain in the X direction by the effect of the exchange coupling magnetic field. The region of the free magnetic layer 1 extending over the width Tw corresponding to the track width has been properly aligned in the X direction to such a degree as to be sensitive to external magnetic fields. The exchange bias layer 16 may be formed to have a three-layered structure such as that described before with reference to FIG. 4.

In this case, as a result of the heat treatment, the exchange bias layer 16 has a region in which the ratio of the atomic percent of the element X to Mn increases in a direction towards the free magnetic layer 1 starting from the thicknesswise central region of this layer, and a region in which the ratio of the atomic percent of the element X to Mn increases in the direction away from the free magnetic layer 1 starting from the thicknesswise central region of this layer. In addition, the crystalline structure of at least part of the exchange bias layer 16 has a CuAu—I type face-centered cubic ordered lattice and, preferably, a non-aligned crystal lattice state is created at at least part of the interface adjacent to the free magnetic layer 1. Alternatively, both layers on the above-mentioned interface have different lattice constants or different crystal orientations.

Then, the non-magnetic intermediate layer 2, the pinned magnetic layer 3, the antiferromagnetic layer 4 and the protective layer 7 are deposited successively in this order on the free magnetic layer 1. In accordance with the invention, the first antiferromagnetic layer 14 is formed on the pinned magnetic layer 3 and the second antiferromagnetic layer 15 is formed on the first antiferromagnetic layer 13, in the as-deposited state prior to the heat treatment. In the as-deposited state, the first antiferromagnetic layer 14 has a greater composition ratio of the element X or the elements X+X' than that of the second antiferromagnetic layer 15 and, preferably, a non-aligned crystal lattice state has been created at at least part of the interface adjacent to the pinned magnetic layer 3. In addition, the second antiferromagnetic layer 15 is made of an antiferromagnetic material having a composition approximating an ideal composition that permits easy transformation from disordered lattice to ordered lattice upon heat treatment.

A heat treatment is effected after the deposition of the first antiferromagnetic layer 14 and the second antiferromagnetic layer 15. As a result of this heat treatment, the structure of the antiferromagnetic layer 4 is properly transformed from disordered lattice to ordered lattice, without being restrained by the factors such as the crystalline structure of the pinned magnetic layer 3 at the interface adjacent to the pinned magnetic layer 3. Accordingly, an exchange coupling magnetic field is generated at the interface between the antiferromagnetic layer 4 and the pinned magnetic layer 3. The exchange coupling magnetic field serves to fix the magnetization of the pinned magnetic layer 3 in the direction of the arrow Y shown in the drawings.

In accordance with the present invention, the antiferromagnetic layer 4 under the heat treatment is not restrained by the factors such as the crystalline structure of the pinned magnetic layer 3, at the interface between the antiferromagnetic layer 4 and the pinned magnetic layer 3. In addition, the antiferromagnetic layer 4 is made of an antiferromagnetic material having a composition approximating an ideal composition that permits easy transformation from disordered lattice to ordered lattice upon heat treatment. Consequently, an exchange coupling magnetic field greater than that obtainable with conventional devices can be produced at the interface between the antiferromagnetic layer 4 and the pinned magnetic layer 3. Specifically, a large magnetic field of about $7.9 \times 10^4$ (A/m) is produced.

The antiferromagnetic layer 4 may be composed of three layers as is the case of the antiferromagnetic layer 4 shown in FIG. 4. In such a case, as a result of the heat treatment, the antiferromagnetic layer 4 is caused to have a region in which the ratio of the atomic percent of the element X to Mn increases in a direction towards the pinned magnetic layer 3 starting from a thicknesswise central portion, and a region in which the ratio of the atomic percent of the element X to Mn increases in a direction towards the protective layer 7. In addition, the crystalline structure of at least part of the antiferromagnetic layer 4 has a CuAu—I type face-centered cubic ordered lattice and, preferably, a non-aligned crystal lattice state is created at at least part of the interface adjacent to the pinned magnetic layer 3. Alternatively, both layers on the above-mentioned interface have different lattice constants or different crystal orientations.

A seed layer 22 may be employed also in this embodiment. Such a seed layer 22 is formed between the antiferromagnetic layer 4 and the protective layer 7. It is possible to enhance the exchange coupling magnetic field by the use of the seed layer 22. The requirements concerning the material of the seed layer 22 and the structure of the antiferromagnetic layer 4 are the same as those described before with reference to FIGS. 4 and 5. Preferably, the seed layer 22 is formed on the lower side of the exchange bias layer 16 as shown in FIG. 8. By forming the seed layer 22, it is possible to orderly align the crystal orientation of the exchange bias layer 16, making it possible to properly generate an exchange coupling magnetic field between the free magnetic layer 1 and the exchange bias layer 16.

Figure 9:
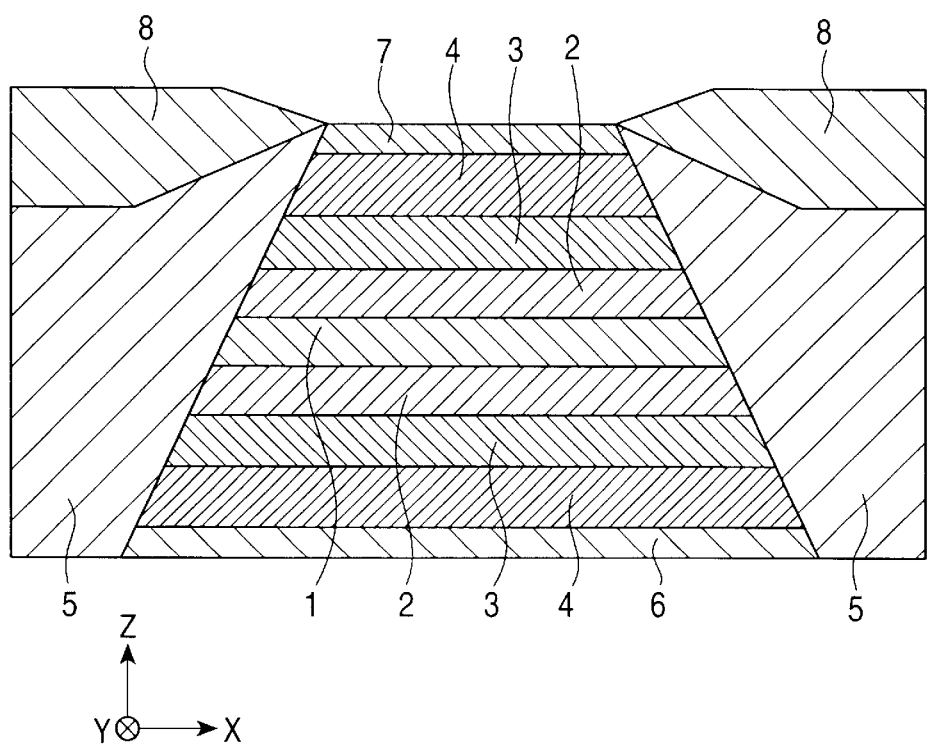
FIG. 9 is a cross-sectional view of the structure of a single spin valve type magnetoresistive sensor in accordance with a fifth embodiment of the present invention, as viewed from the same side as an ABS surface.

FIG. 9 is a sectional view showing the structure of a dual-spin-valve type magnetoresistive sensor in accordance with the present invention. As will be seen from FIG. 9, an underlying layer 6, an antiferromagnetic layer 4, a pinned magnetic layer 3, a non-magnetic intermediate layer 2, and a free magnetic layer 1 are deposited in this order from the bottom. Further, another non-magnetic intermediate layer 2, another pinned magnetic layer 3, another antiferromagnetic layer 4 and a protective layer 7 are sequentially deposited on the free magnetic layer 1.

Hard bias layers 5 and conductive layers 8 are formed on both lateral sides of the laminate structure having the underlying layer 6 and the protective layer 7. The described layers are made of materials which are the same as those described before with reference to FIGS. 1 to 7.

Figure 10:
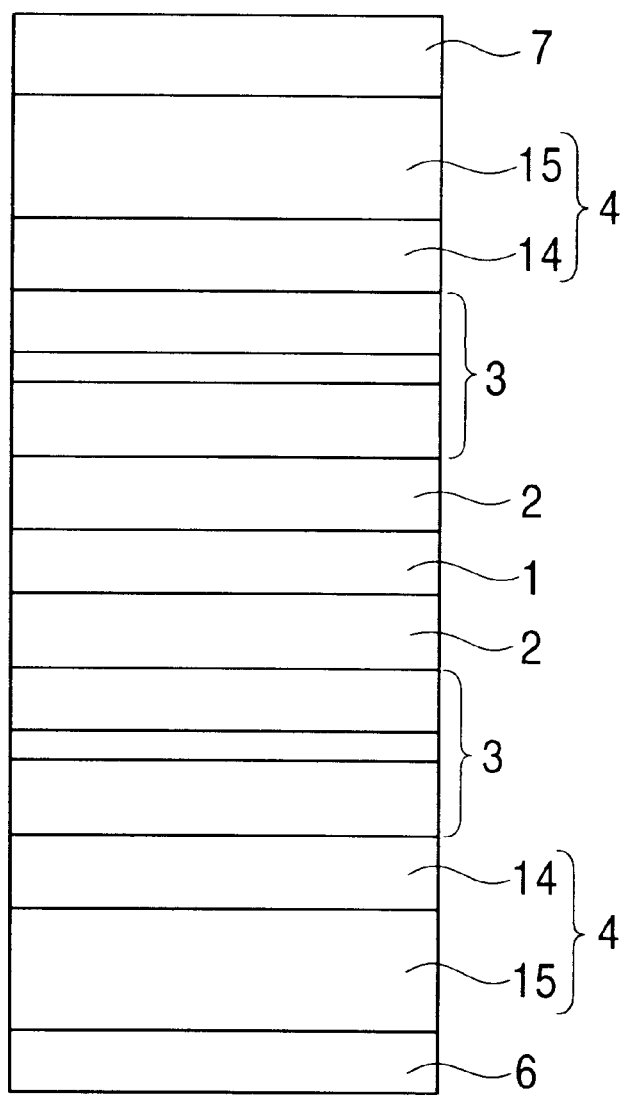
FIG. 10 is a schematic illustration of a dual-spin valve type laminate structure in accordance with the invention in a state after deposition.

A description will now be given of a production process, with reference to FIG. 10. The deposition is conducted such that each of the two antiferromagnetic layers 4 have a two-layered structure composed of a first antiferromagnetic layer 14 and a second antiferromagnetic layer 15. The first antiferromagnetic layer 15 is formed in contact with the pinned magnetic layer 3, while the second antiferromagnetic layer 15 is formed in contact with the first antiferromagnetic layer 14. Each of the first and second antiferromagnetic layers 14 and 15 is formed of the above-mentioned X—Mn alloy or X—Mn—X' alloy.

In the as-deposited state, the first antiferromagnetic layer 14 has a greater composition ratio of the element X or the element X+X' than the second antiferromagnetic layer 15 and, preferably, a non-aligned crystal lattice state is created at at least part of the interface adjacent to the pinned magnetic layer 3 and, in addition, the second antiferromagnetic layer 15 is formed from an antiferromagnetic material having a composition approximating an ideal composition that permits easy transformation from disordered lattice structure to ordered lattice structure when heat-treated. Requirements for the composition ratios of the element X or the elements X+X' and thicknesses of the respective antiferromagnetic layers are the same as those described before with reference to FIG. 2.

The heat treatment is executed after the deposition of the antiferromagnetic layer 14 and the second antiferromagnetic layer 15. As a result of the heat treatment, the antiferromagnetic layer 4 is properly transformed to change its disordered lattice structure into ordered lattice structure, without being influenced by the restraint force produced by the crystalline structure of the pinned magnetic layer 3 at the interface adjacent to the pinned magnetic layer 3. An exchange coupling magnetic field generated at the above-mentioned interface serves to fix the magnetization of the pinned magnetic layer 3 in the direction Y shown in the drawings.

Since in the deposition process, the first antiferromagnetic layer 14 is formed of a suitable material free from the influence of the restraint force produced by the crystalline structure of the pinned magnetic layer 3 at the interface adjacent to the pinned magnetic layer 3, and since the second antiferromagnetic layer 15 is formed from a material having a composition approximating an ideal composition that permits easy transformation from disordered lattice structure to ordered lattice structure, transformation from disordered lattice structure into ordered lattice structure is properly effected by the heat treatment. A non-aligned crystal lattice state is maintained between the antiferromagnetic layer 4 and the pinned magnetic layer 3, whereby a greater exchange coupling magnetic field than in the conventional devices can be obtained. Specifically, an exchange coupling magnetic field of about $7.9 \times 10^4$ (A/m) or greater is produced in accordance with the present invention.

Figure 11:
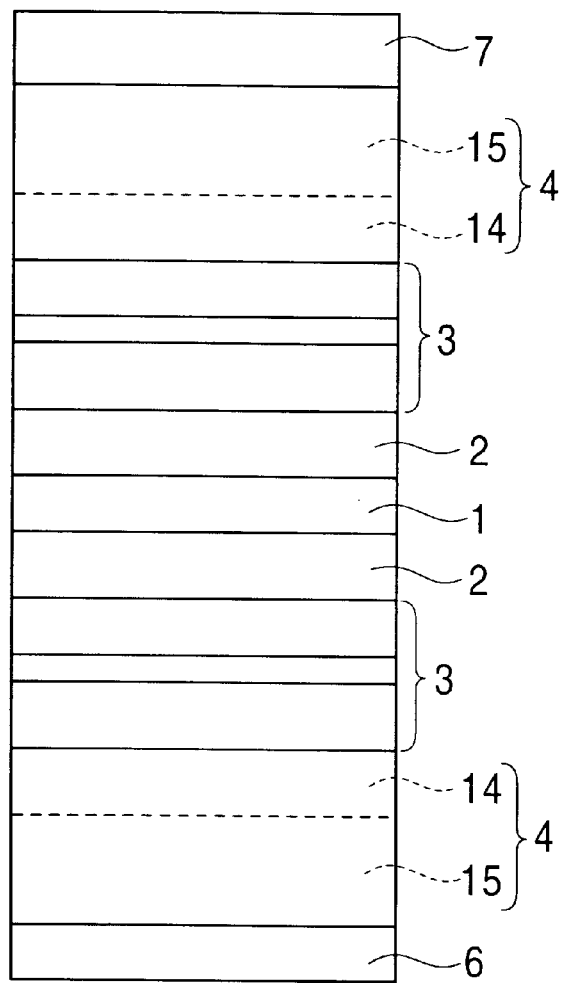
FIG. 11 is a schematic illustration of the laminate structure of FIG. 10 in a state after a heat treatment.

FIG. 11 shows the state of the structure after the heat treatment. The antiferromagnetic layer 4 shown in FIG. 11 has a region in which the ratio of atomic percent of the element X or the elements X+X' increases in a direction towards the pinned magnetic layer 3, and the crystalline structure of at least part of the antiferromagnetic layer 4 has a CuAu—I type face-centered square ordered lattice. Preferably, a non-aligned state is created at at least part of the interface adjacent to the pinned magnetic layer 3.

The presence of the region in the antiferromagnetic layer 4 in which the ratio of the atomic percent of the element X or elements X+X' to Mn increases in a direction towards the pinned magnetic layer 3 is attributable to the lamination of the first and second antiferromagnetic layers 14 and 15. Although the first antiferromagnetic layer 14 and the second antiferromagnetic layer 15 experience diffusion due to the heat treatment, the diffusion is still imperfect and the first antiferromagnetic layer 14 and the second antiferromagnetic layer are not completely diffused in each other. As such, the antiferromagnetic layer after the heat treatment does not have completely uniform structure. Thus, the region that has been constituted by the first antiferromagnetic layer 14 still has a portion in which the composition ratio of the element X or the elements X+X' is still greater than that of a portion that has been constituted by the second antiferromagnetic layer 15. Accordingly, the region is formed in which the ratio of the atomic percent of the element X or the elements X+X' to Mn increases towards the pinned magnetic layer 3.

The antiferromagnetic layer 4 has a region near the interface adjacent to the pinned magnetic layer 3, in which the composition ratio of the element X or the elements X+X' in the antiferromagnetic layer 4 decreases towards the pinned magnetic layer 3. This is attributable to the diffusion of compositions between the antiferromagnetic layer 4 and the pinned magnetic layer 3 caused by the heat treatment. Likewise, the diffusion of composition takes place also between the antiferromagnetic layer 4 and the underlying layer 6 and between the antiferromagnetic layer 4 and the protective layer 7. It is therefore to be understood that the antiferromagnetic layer 4 also has a region near the interface adjacent to the underlying layer 6, as well as a region near the interface adjacent to the protective layer 7, in which the composition ratio of the element X or the elements X+X' in the antiferromagnetic layer 4 decreases in a direction towards such interface.

Requirements concerning the composition ratios of the element X or the elements X+X' of the antiferromagnetic layer 4 at the interface adjacent to the pinned magnetic layer 3 or at the side opposite to this interface, thickness of the antiferromagnetic layer 4, and so forth, are the same as those described before in connection with FIG. 3.

Figure 12:
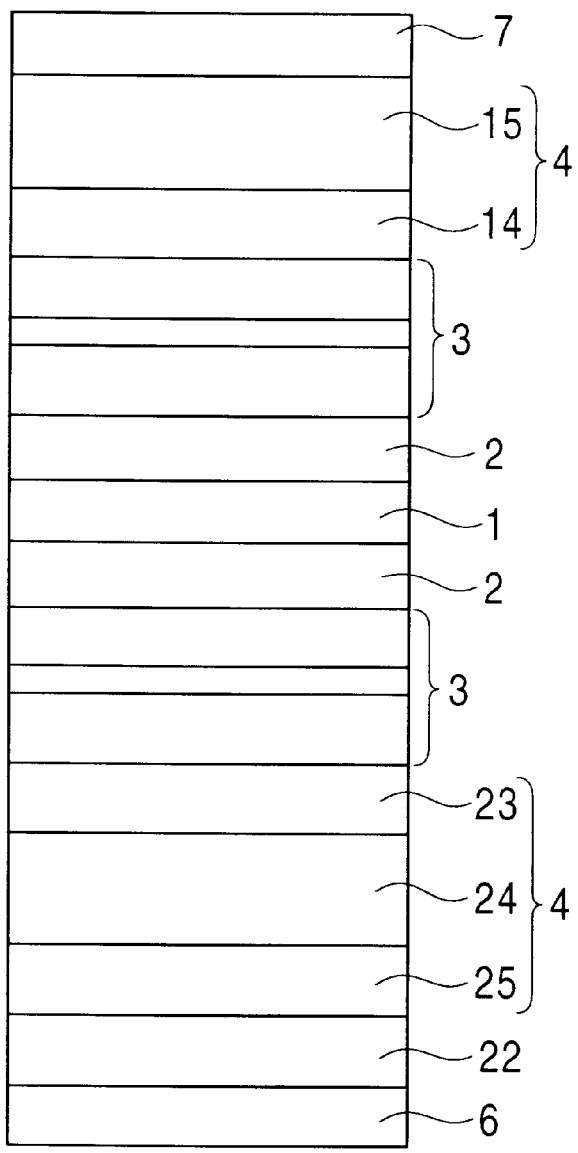
FIG. 12 is a schematic illustration of a dual-spin valve type laminate structure in accordance with the invention using a seed layer, in a state after deposition.

This embodiment also may employ a seed layer 22. The production process is illustrated in FIG. 12. As will be seen from this Figure, the seed layer 22 is formed on the underlying layer 6, and an antiferromagnetic layer 4 composed of three layers is formed on the seed layer 22. The structure formed on the antiferromagnetic layer 4 is the same as that shown in FIG. 10.

The antiferromagnetic layer 4 formed on the seed layer 22 has a third antiferromagnetic layer 25 adjacent to the seed layer 22, a first antiferromagnetic layer 23 adjacent to the pinned magnetic layer 3, and a second antiferromagnetic layer 24 interposed between the first antiferromagnetic layer 23 and the third antiferromagnetic layer 25.

As described before with reference to FIG. 4, each of the first to third antiferromagnetic layers is formed from an X—Mn alloy or an X—Mn—X' alloy, wherein the composition ratio of the element X or the elements X+X' in the second antiferromagnetic layer 24 is determined to be smaller than that in the remainder two antiferromagnetic layers. By adjusting the composition ratio as described above, it is possible to create a non-aligned crystal lattice state at at least part of the interface between the seed layer 22 and the third antiferromagnetic layer 23. Similarly, a non-aligned crystal lattice state can be created at at least part of the interface between the pinned magnetic layer 3 and the first antiferromagnetic layer 3. Layers facing each of these interfaces may have different lattice constants.

The seed layer 22 has face-centered cubic crystals with the (111) planes substantially oriented in the direction parallel to the interface adjacent to the pinned magnetic layer 3, so that the layers formed on this seed layer have crystalline structures in which their (111) planes are oriented in the direction parallel to the above-mentioned interface. The material of the seed layer 22 may be similar to that described before with reference to FIG. 4, although the material preferably has non-magnetic properties and a high specific resistance.

As will be seen from FIG. 12, the antiferromagnetic layer 4 formed above the free magnetic layer 1 has a structure composed of two films. This feature is exactly the same as that explained before with reference to FIG. 2. This, however, is only illustrative and the antiferromagnetic layer 4 formed above the free magnetic layer 1 may have a structure formed from three films, as is the case of the antiferromagnetic layer 1 formed below the free magnetic layer 1.

Figure 13:
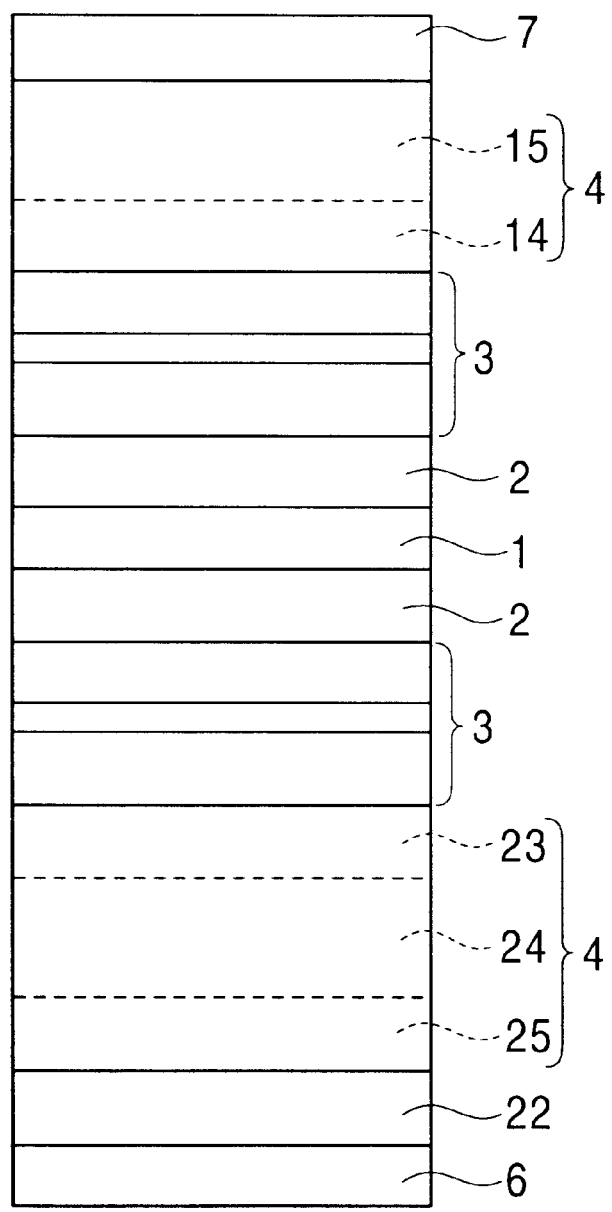
FIG. 13 is a schematic illustration of the laminate structure of FIG. 12 in a state after a heat treatment.

FIG. 13 schematically shows the dual-spin-valve type magnetoresistive sensor obtained through the heat treatment. As a result of the heat treatment, transformation into ordered lattice structure is commenced in the second antiferromagnetic layer 24 of the first antiferromagnetic layer 4 below the free magnetic layer 1 and in the second antiferromagnetic layer 15 of the antiferromagnetic layer 4 above the free magnetic layer 1. Since these second antiferromagnetic layers 24 and 15 have compositions apt to be transformed into ordered lattice structure and, as a result of diffusions of compositions caused by the heat treatment, transformation proceeds also in other layers, while the non-aligned state is maintained. A greater exchange coupling magnetic field than is found in conventional devices can be achieved.

As a result of the above-described diffusions of elements, the antiferromagnetic layer 4 beneath the free magnetic layer 1 has a region in which the ratio of the atomic percent of the element X or the elements X+X' to Mn increases in a direction towards the pinned magnetic layer 3, as well as a region in which this ratio increases towards the seed layer 22. At the same time, the crystalline structure of at least part of this antiferromagnetic layer 4 has a CuAu—I type face-centered crystalline structure and, preferably, a non-aligned crystal lattice state is created at at least part of the interface adjacent to the seed layer 22, as well as at least part of the interface adjacent to the pinned magnetic layer 3.

Meanwhile, the antiferromagnetic layer 4 above the free magnetic layer 1 has a region in which the ratio of the atomic percent of the element X or the elements X+X' to Mn increases in a direction towards the pinned magnetic layer 3. At the same time, the crystalline structure of at least part of this antiferromagnetic layer 4 has a CuAu—I type face-centered crystalline structure and, preferably, a non-aligned crystal lattice state is created at at least part of the interface adjacent to the pinned magnetic layer 3. The antiferromagnetic layer 4 formed above the free magnetic layer 1 also has a crystal orientation in which the (111) planes are substantially aligned.

In the antiferromagnetic layer 4 below the free magnetic layer 1, diffusion of elements takes place at the interface adjacent to the seed layer 22 and at the interface adjacent to the pinned magnetic layer 3, so that regions exist near the interface adjacent to the seed layer 22 and near the interface adjacent to the pinned magnetic layer 3, respectively, in which the atomic percent of the element X or the elements X+X' in the antiferromagnetic layer 4 decreases in a direction towards the respective interfaces. The presence of such regions indicates that the antiferromagnetic layer 4 has been properly transformed into ordered lattice structure at each of the interfaces adjacent to the seed layer 22 and the interface adjacent to pinned magnetic layer 3, making it possible to obtain a large exchange coupling magnetic field.

In the antiferromagnetic layer 4 formed above the free magnetic layer 1, a diffusion of elements takes place at the interface adjacent to the pinned magnetic layer 3, so that a region exists near the interface adjacent to the pinned magnetic layer 3 in which the atomic percent of the element X or the elements X+X' in the antiferromagnetic layer 4 decreases in a direction towards the above-mentioned interface. It is also possible that a diffusion of elements takes place also at the boundary between the antiferromagnetic layer 4 and the protective layer which is formed from, for example, Ta. If such a diffusion has taken place, a region exists in the antiferromagnetic layer 4 near the interface adjacent to the protective layer 7, in which the atomic percent of the element X or the elements X+X' in the antiferromagnetic layer 4 decreases in a direction towards this interface.

The presence of the seed layer 22 serves to promote preferential orientation of the (111) planes in parallel with the film planes and to increase the sizes of the crystal grains, in the antiferromagnetic layer 4 below the free magnetic layer 1 and the antiferromagnetic layer 4 above the free magnetic layer 1, as well as in the layers intervening between these two antiferromagnetic layers 4. It is therefore possible to obtain a greater exchange magnetic field and a greater ratio of resistance variation than in the conventional devices.

For achieving a greater effect of improving the ratio of resistance variation, the seed layer 22 is preferably formed between the underlying layer 6 and the antiferromagnetic layer 4 below the free magnetic layer 1, as shown in FIGS. 12 and 13. The seed layer 22, however, may be formed between the protective layer 7 and the antiferromagnetic layer 4 above the free magnetic layer 1.

Figure 14:
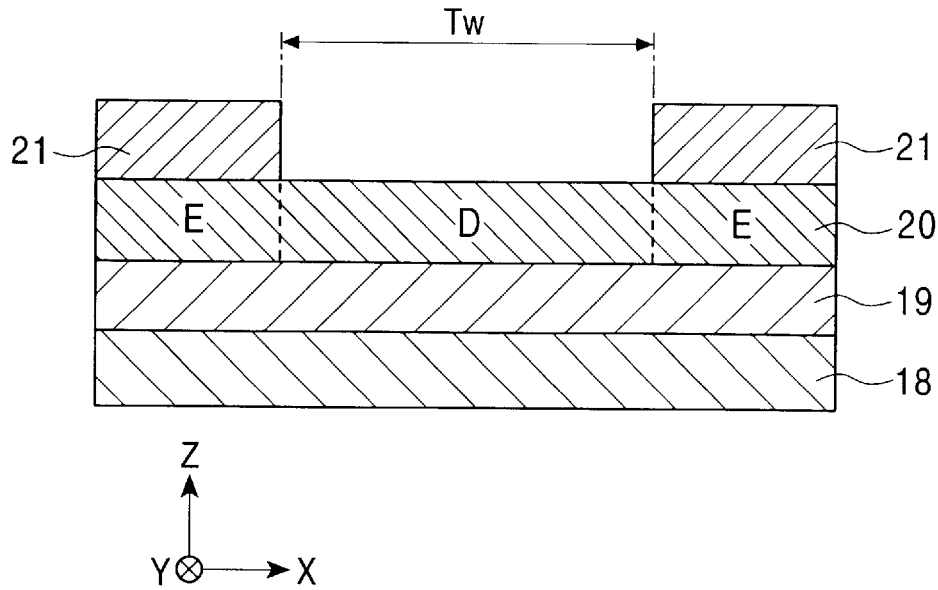
FIG. 14 is a sectional view of a structure of an AMR magnetoresistive sensor in accordance with a sixth embodiment of the present invention, as viewed from the same side as the ABS surface.
Figure 15:
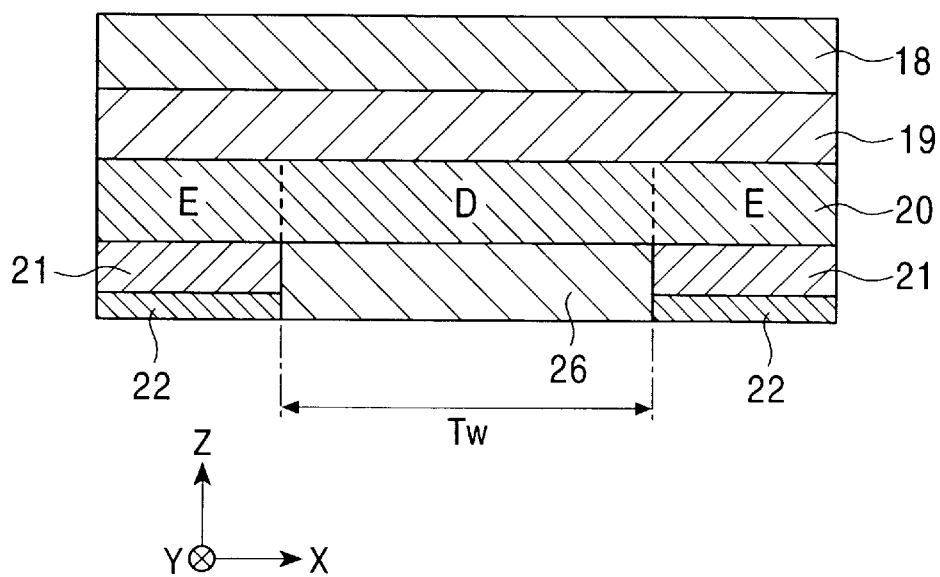
FIG. 15 is a sectional view of a structure of an AMR magnetoresistive sensor in accordance with a sixth embodiment of the present invention, as viewed from the same side as the ABS surface.

FIGS. 14 and 15 are cross-sectional views of ΔMR magnetoresistive sensors embodying the present invention. Referring to FIG. 14, a soft magnetic layer (SAL layer) 18, a non-magnetic layer (SHUNT layer) 19, and a magnetoresistive layer (MR layer) 20 are successively deposited. By way of example, the soft magnetic layer 18 is formed of an Fe—Ni—Nb alloy, while the non-magnetic layer 19 is made from a Ta film. The magnetoresistive layer 20 is formed of an Ni—Fe alloy.

Formed on the magnetoresistive layer 20 are segments 21 of an exchange bias layer (antiferromagnetic layer) spaced from each other in the direction of the track width X by a distance corresponding to the track width Tw. Although not shown, a conductive layer is formed, for example, on the segments 21 of the exchange bias layer.

Referring to FIG. 15, segments 21 of the exchange bias layer are formed so as to be spaced apart from each other in the track width direction (X direction) by a distance corresponding to the track width Tw, and the vacancy between these segments 21 of the exchange bias layer is filled with an insulating layer 26 made of an insulating material such as $SiO_2$ or $Al_2O_3$. The exchange bias layer 21 and the insulating layer 26 are overlain by the magnetoresistive layer (MR layer) 20, the non-magnetic layer (SHUNT layer) 19 and the soft magnetic layer (SAL layer) 18.

In the production process, the exchange bias layer 21, 21 is deposited to have a two-layered structure composed of the first antiferromagnetic layer 14 and the second antiferromagnetic layer 15. The first antiferromagnetic layer 14 is formed in contact with the magnetoresistive layer 20, and the second antiferromagnetic layer 15 is formed on the magnetoresistive layer 20 with the first antiferromagnetic layer 14 intervening therebetween.

As described before in connection with FIG. 2, the first antiferromagnetic layer 14 has a greater composition ratio of the element X or the element X+X' than that of the second antiferromagnetic layer 15. Preferably, a non-aligned crystal lattice state is created at at least part of the interface adjacent to the magnetoresistive layer 20. The second antiferromagnetic layer 15 is formed of an antiferromagnetic material having a composition approximating an ideal composition that permits easy transformation from the disordered lattice structure to ordered lattice structure when heat-treated. The composition ratios of the element X or the elements X+X' in the first antiferromagnetic layer 14 and second antiferromagnetic layer 15, as well as thicknesses of these antiferromagnetic layers, are the same as those explained before with reference to FIG. 2.

As a result of the heat treatment, the exchange bias layer 21 is properly transformed from the disordered lattice structure to ordered lattice structure, while maintaining the non-aligned crystal lattice state at the interface adjacent to the magnetoresistive layer 20. Accordingly, an exchange coupling magnetic field is produced at the interface between the exchange bias layer 21 and the magnetoresistive layer 20.

In accordance with the present invention, the structure as deposited has the first antiferromagnetic layer 14, which is formed of a composition that is not liable to be restrained by the factors such as the crystalline structure of the magnetoresistive layer 20, and the second antiferromagnetic layer 15 having a composition approximating an ideal composition that permits easy transformation from disordered lattice to ordered lattice upon heat treatment. Therefore, transformation from disordered lattice to ordered lattice occurs as a result of the heat treatment, while maintaining the non-aligned crystal lattice state at the interface adjacent to the magnetoresistive layer 20. Accordingly, a greater exchange coupling magnetic field is obtained than those offered by conventional devices. Specifically, an exchange coupling magnetic field of about 7.9 $\times 10^4$ (A/m) or greater is produced in accordance with the present invention.

The exchange bias layer 21 may be formed by depositing three films, as in the case of the structure shown in FIG. 4. The first antiferromagnetic layer 23 is formed on the side adjacent to the magnetoresistive layer 20, and the second antiferromagnetic layer 24 and the third antiferromagnetic layer 25 are sequentially formed on the first antiferromagnetic layer 23. In this case, the composition ratio of the element X or the elements X+X' in the second antiferromagnetic layer 24 is set to be smaller than those in the first and third antiferromagnetic layers 23 and 25. Preferably, a non-aligned crystal lattice state is created at at least part of the interface between the first antiferromagnetic layer 23 and the magnetoresistive layer 20. Alternatively, both layers are made to have different lattice constants or different crystalline orientations at the interface therebetween.

When the heat treatment is effected on the exchange bias layer 21 thus formed, transformation into ordered lattice structure is commenced in the second antiferromagnetic layer 24, followed by transformation into ordered lattice structures in the first antiferromagnetic layer 23 and third antiferromagnetic layer 25, which occurs due to diffusions of compositions. Consequently, the heat-treated exchange bias layer 21 has a region in which the ratio of atomic percent of the element X to Mn increases in a direction towards the magnetoresistive layer 20 starting from a thicknesswise central portion of the exchange bias layer 21, and a region in which the ratio of atomic percent of the element X to Mn increases in the direction away from the magnetoresistive layer 20 starting from the above-mentioned thicknesswise central portion.

Requirements concerning the compositions of the first to third antiferromagnetic layers 23, 24 and 25 are the same as those described before with reference to FIG. 4, and the composition and thickness of the exchange bias layer 21 after the heat treatment are the same as those of the antiferromagnetic layer 4 shown in FIG. 5.

This embodiment also can employ a seed layer 22. In particular, the use of the seed layer 22 in the structure shown in FIG. 15 offers a greater advantage. More specifically, in the case where the exchange bias layer 21, 21 is formed at the lower side of the magnetoresistive layer 20, the seed layer 22 is formed at the lower side of the exchange bias layer 21. It is possible to use a seed layer also in the structure shown in FIG. 14. In such a case, the seed layer 22 is formed on the exchange bias layer 22. By forming the seed layer 22, it is possible to increase the ratio of resistance variation.

Requirements regarding the crystalline structure and material of the seed layer 22, as well as the material, composition and film thickness of the exchange bias layer 21, are the same as those shown in FIGS. 4 and 5.

In each of the AMR devices sown in FIGS. 14 and 15, the regions E of the magnetoresistive layer 20 are formed into a single magnetic domain in the X direction of these Figures, due to the effect of the exchange coupling magnetic field produced at the interface between the exchange bias layer 21, 21 and the magnetoresistive layer 20. This causes the magnetization of the region D of the magnetoresistive layer 20 to be aligned in the X direction. A magnetic field that is produced when a sense current flows through the magnetoresistive layer 20 is applied to the soft magnetic layer 18, so that a lateral bias magnetic field Y is applied to the region D of the magnetoresistive layer 20 by static magnetic coupling energy produced by the soft magnetic layer 18. Thus, the lateral magnetic field is applied to the region D of the magnetoresistive layer 20 that has been formed into a single magnetic domain in the X direction. Accordingly, the region D of the magnetoresistive layer 20 exhibits a linear change of the resistance in response to a change in the magnetic field, thus achieving a linear magnetoresistive characteristics, i.e., a linear H-R effect characteristic.

A recording medium moves in the direction Z, so that a magnetic field leaking in the Y direction causes a change in the electrical resistance in the region D of the magnetoresistive layer 20, and such a change is sensed as a change in a voltage.

Figure 16:
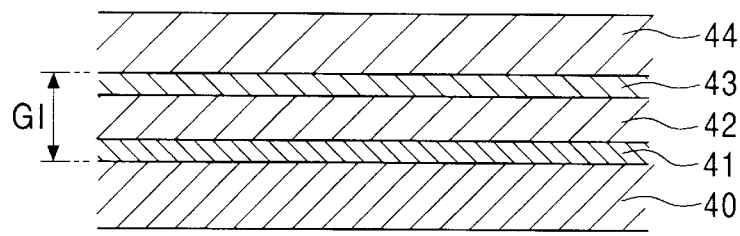
FIG. 16 is a fragmentary sectional view of a thin-film magnetic head (reproducing head) in accordance with the present invention.

FIG. 16 is a cross-sectional view of the structure of a reading head having any of the magnetoresistive sensor described heretofore with reference to FIGS. 1 to 11, as viewed from the surface which opposes the recording medium. Numeral 40 designates a lower shield layer formed of, for example, an Ni—Fe alloy, and overlain by a lower gap layer 41. A magnetoresistive sensor 42, which may be any one of those described heretofore with reference to FIGS. 1 to 15, is formed on the lower gap layer 41. The magnetoresistive sensor 42 is overlain by an upper gap layer 43 formed thereon, and an upper shield layer 44 formed of, for example, an Ni—Fe alloy, is formed on the upper gap layer 43.

The lower gap layer 41 and the upper gap layer 43 are formed of an insulating material such as $SiO_2$ or $Al_2O_3$ (alumina). The length between the extremities of the lower gap layer 41 and the upper gap layer 43 as shown in FIG. 16 is the gap length Gl, and the reading head with smaller gap length Gl can be used at higher recording density.

As described before, the present invention makes it possible to achieve a large exchange coupling magnetic field, even with a reduced thickness of the antiferromagnetic layer 4. It is therefore possible to reduce the thickness of the magnetoresistive sensor as compared with the conventional devices and, therefore, to produce a thin-film magnetic head which has a narrower gap to cope with the demand for higher recording density.

EXAMPLES

Figure 20:
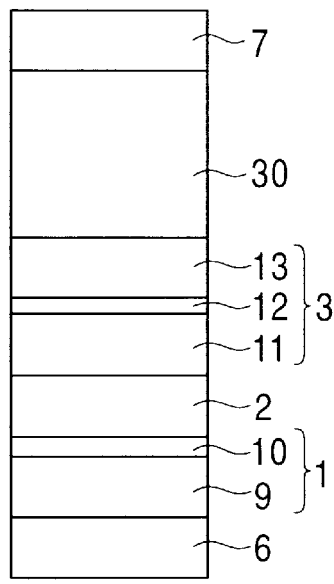
FIG. 20 is a schematic illustration of the structure of a conventional single spin valve type magnetoresistive sensor.

The following laminate structures were formed by deposition and samples were prepared to include Examples in which the antiferromagnetic layer 4 was formed by depositing two layers (first antiferromagnetic layer 14 and second antiferromagnetic layer 15) having different composition ratios as in FIG. 2. Comparative Examples were also prepared in which the antiferromagnetic layer 30 was deposited to have a single layer, as shown in FIG. 20. The samples were then subjected to heat treatments conducted under the same condition, followed by measurements of the exchange coupling magnetic field (Hex) and the ratio of resistance variation (ΔMR). The heat treatment was conducted for more than 2 hours at temperatures not lower than 200° C.

Example 1

The laminate structure was composed of the following layers in sequence from the bottom layer: Underlying layer 6: Ta (50)/free magnetic layer 1: [$Ni_{80}Fe_{20}$(45)/Co(5)]/non-magnetic intermediate layer 2: Cu(25)/pinned magnetic layer 3:[Co(20)/Ru(8)/Co(15)]/first antiferromagnetic layer 14:$Pt_{58}Mn_{42}$(10)/second antiferromagnetic layer:$Pt_{50}Mn_{50}$ (110)/protective layer 7:Ta(30)

Comparative Example 1

Underlying layer 6:Ta(50)/free magnetic layer 1:[$Ni_{80}Fe_{20}$(45)/Co(5)]/non-magnetic intermediate layer 2:Cu(25)/pinned layer 3:[Co(20)/Ru(8)/Co(15)]/antiferromagnetic layer 30:$Pt_{58}Mn_{42}$(120)/protective layer 7:Ta(30)

Comparative Example 2

Underlying layer 6: Ta (50)/free magnetic layer 1:[$Ni_{80}Fe_{20}$(45)/Co(5)]/non-magnetic intermediate layer 2:Cu(25)/pinned magnetic layer 3:[Co(20)/Ru(8)/Co(15)]/antiferromagnetic layer 30:$Pt_{46}Mn_{54}$(120)/protective layer 7:Ta(30)

Comparative Example 3

Underlying layer 6: Ta (50)/free magnetic layer 1:[$Ni_{80}Fe_{20}$(45)/Co(5)]/non-magnetic intermediate layer 2:Cu(25)/pinned magnetic layer 3:[Co(20)/Ru(8)/Co(15)]/antiferromagnetic layer 30: $Pt_5Mn_{50}$(120)/protective layer 7:Ta(30)

Comparative Example 4

Underlying layer 6:Ta(50)/free magnetic layer 1:[$Ni_{80}Fe_{20}$(45)/Co(5)]/non-magnetic intermediate layer 2:Cu(25)/pinned magnetic layer 3:[Co(20)/Ru(8)/Co(15)]/antiferromagnetic layer 30:$Pt_{52}Mn_{48}$(120)/protective layer 7:Ta(30)

Values in parenthesis indicate the layer thicknesses in terms of Angstroms. The suffixes in the representations of Ni—Fe alloys and Pt—Mn alloys represent composition ratios in terms of at %.

Thus, all the samples had the same laminate structure, except for the structure of the antiferromagnetic layer. The thickness of the antiferromagnetic layers was 120 Å in all the samples, where, in Example 1, this thickness is the sum of the thicknesses of the first antiferromagnetic layer 14 and second antiferromagnetic layer 15.

the as-deposited state before the heat treatment, while the second antiferromagnetic layer had the ideal composition. In contrast, in Comparative example 1, antiferromagnetic properties could hardly be obtained despite the heat treatment,

TABLE 1

|  | Example 1 | Comp. Ex. 1 | Comp. Ex. 2 | Comp. Ex. 3 | Comp. Ex. 4 |
| --- | --- | --- | --- | --- | --- |
| Interface with ferro-magnetic layer | Non-alignment very strong | Non-alignment very strong | Non-alignment strong | Non-alignment weak | Non-alignment very strong |
| (Hex) | $17.4 \times 10^4$ (A/m) | $1.2 \times 10^4$ (A/m) | $0.79 \times 10^4$ (A/m) | $6.48 \times 10^4$ (A/m) | $8.37 \times 10^4$ (A/m) |
| Resistance variation ratio | 8.3% | 5.5% | 5.0% | 8.0% | 8.1% |
| Features of PtMn | With strong non-aligned state, bulk ideal composition (Pt50—Mn50) is used for 90% of more. | Non-aligned state is very strong advantageously, but antiferromagnetic properties can hardly be obtained due to too high Pt content. | Antiferromagnetic properties can hardly be obtained due to strong non-alignment and due to small Pt content. | Unsatisfactory due to weak non-alignment, although ideal bulk composition was used. | The non-aligned state was held rather strong, and composition approximates bulk ideal composition. Best composition among samples of single-layered type. |

Table 1 shows the results of experiments executed with the samples after the heat treatment, Referring to the item "Interface with Ferromagnetic layer", both Example 1 and Comparative Example 1 had very strong state of non-alignment, whereas Comparative Examples 2 and 3 showed greater tendencies of alignment. In Comparative Example 4, the non-aligned state was not so strong.

In order to obtain a non-aligned interface structure, it is necessary to increase the Pt content in the Pt—Mn alloy. In Example 1 and Comparative Example 1, the Pt content of the antiferromagnetic layer contacting the interface with the pinned magnetic layer was 58 (at %), whereas the Pt content was smaller in each of other samples, leading to the above-described results.

Referring now to item "Hex" which represents the exchange coupling magnetic field, Example 1 showed a very large exchange coupling magnetic field of $17.4 \times 10^4$ (A/m), while Comparative Examples showed much smaller values of the exchange coupling magnetic field. In Comparative Examples 3 and 4, the values of the exchange coupling magnetic fields were greater than those in Comparative Examples 1 and 2, but were much smaller than that obtained with Example 1 of the invention.

In order to obtain a large exchange coupling magnetic field, it is necessary that the antiferromagnetic layer is formed of a Pt—Mn alloy having a composition that approximates an ideal composition which permits easy transformation from disordered lattice structure to ordered lattice structure when heat-treated. The ideal composition here means $Pt_{50}Mn_{50}$.

The use of the ideal composition that permits easy transformation alone is still insufficient. It is also important that the interface adjacent to the pinned magnetic layer is held in non-aligned state. An aligned state of the interface impedes proper transformation of the antiferromagnetic layer during the heat treatment, due to restraint force produced by the crystalline structure of the pinned magnetic layer.

It will be seen that only Example 1 simultaneously met these two conditions. More specifically, in Example 1, the interface between the first antiferromagnetic layer and the pinned magnetic layer was held in the non-aligned state in because the composition deviated from the ideal composition due to too large Pt content, although the interface adjacent to the pinned magnetic layer was held in a non-aligned state. In Comparative example 2, antferromagnetic properties could hardly be obtained despite the heat treatment, because the composition deviates from the ideal composition due to too small Pt content, and due to aligned state of the interface adjacent to the pinned magnetic layer. In case of Comparative Example 3, transformation from disordered lattice structure to ordered lattice structure could hardly occur despite the heat treatment, due to the aligned state of the interface adjacent to the pinned magnetic layer, although the ideal composition was employed. Comparative Example 4 employed a composition approximating the ideal composition and had the interface adjacent to the pinned magnetic layer which is comparatively easy to maintain non-aligned state, so that this Comparative example produced an exchange coupling magnetic field which is the greatest of those of all other Comparative Examples but was still smaller than that of Example 1, due to large Pt content and due to the non-aligned state which is not very strong.

In accordance with the present invention, transformation from disordered lattice structure into ordered lattice structure caused by the heat treatment was properly performed without losing the non-aligned state at the interface, by virtue of the feature that the antiferromagnetic layer as deposited had a first antiferromagnetic layer 14 facing the interface adjacent to the pinned magnetic layer and having a composition easy to create the non-aligned state, and a second antiferromagnetic layer 15 having a composition approximating the ideal composition and formed on the pinned magnetic layer with the first antiferromagnetic layer 14 intervening therebetween, thus successfully achieving a greater exchange coupling magnetic field than those of conventional devices. The data in the item "Resistance variation ratio" also shows the superiority of Example 1 to Comparative examples.

Figure 17:
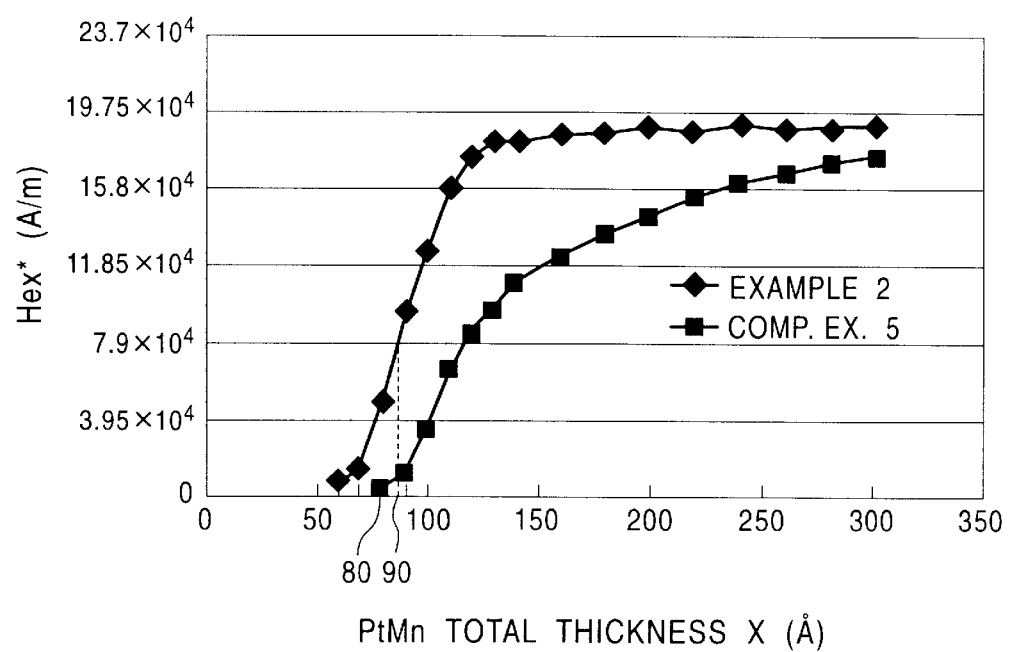
FIG. 17 is a graph showing the relationship between the total film thickness of an antiferromagnetic layer formed in accordance with the invention and an exchange coupling magnetic field (Hex), the antiferromagnetic layer being formed of a first antiferromagnetic layer and a second antiferromagnetic layer.

Then, the relationship between the total film thickness of the antiferromagnetic layer and the exchange coupling magnetic field (Hex) was examined (see FIG. 17). The following two samples in the as-deposited state (prior to heat treatment) were prepared. The structure of Example 2 was the same as that shown in FIG. 2, while the structure of Comparative Example 5 was the same as that shown in FIG. 20.

Example 2

The laminate structure was composed of the following layers, in sequence from the bottom layer: Underlying layer 6: Ta (50)/free magnetic layer 1: [$Ni_{80}Fe_{20}$(45)/Co(5)]/non-magnetic intermediate layer 2: Cu(25)/pinned magnetic layer 3: [Co(20)/Ru(8)/Co(15)]/first antiferromagnetic layer 14: $Pt_{58}Mn_{42}$ (10)/second antiferromagnetic layer: $Pt_{50}Mn_{50}$ (X-10)/protective layer 7:Ta(30)

Comparative Example 5

Underlying layer 6: Ta (50)/free magnetic layer 1: [$Ni_{80}Fe_{20}$(45)/Co (5)]/non-magnetic intermediate layer 2: Cu(25)/pinned magnetic layer 3: [Co(20)/Ru (8)/Co(15)]/antiferromagnetic layer 30: $Pt_{52}Mn_{48}$ (X)/protective layer 7:Ta(30) Values in the parenthesis ( ) indicate the layer thicknesses in terms of Angstrom. The suffixes in the representations of Ni—Fe alloys and Pt—Mn alloys represent composition ratios in terms of at %.

In Example 2, the thickness of the first antiferromagnetic layer 14 was fixed to 10 Å, while the thickness of the second antiferromagnetic layer 15 was varied, as will be seen from the composition shown above.

These samples were heat-treated and were subjected to measurement of the exchange coupling magnetic field (Hex). It will be seen that a greater total thickness of the Pt—Mn alloy layer provides a greater exchange coupling magnetic field, both in Example 2 and Comparative Example 5, as will be seen from FIG. 17.

Example of the invention showed a drastic increase of the exchange coupling magnetic field as compared with that of Comparative Example 5, when the total thickness of the Pt—Mn layer was increased, i.e., when the thickness of the second antiferromagnetic layer 15 was increased, and provided an exchange coupling magnetic field as large as $7.9 \times 10^4$ (A/m) or greater when the total thickness reached and exceeded 80 Å.

An exchange coupling magnetic field of $7.9 \times 10^4$ (A/m) or greater was obtainable also with Comparative Example 5, when the thickness of the antiferromagnetic layer exceeded about 120 Å, suggesting that a greater thickness of the antiferromagnetic layer 30 than that in Example 2 was required for achieving the same exchange coupling magnetic field as that produced in Example 2.

The result of this experiment also shows that, when the antiferromagnetic layer 4 is formed by depositing two layers, the first antiferromagnetic layer 14 and the second antiferromagnetic layer 15 as in Example 2, the second antiferromagnetic layer 15 that is formed by an antiferromagnetic material having a composition approximating the ideal composition for easy transformation from disordered lattice structure to ordered lattice structure should have a thickness greater than a predetermined thickness.

In accordance with the present invention, it is understood from the experiment results shown in FIG. 17 that a large exchange coupling magnetic field of about $7.9 \; 10^4$ (A/m) or greater is obtainable when the total thickness of the antiferromagnetic layer is determined to be about 80 Å or greater and, since the thickness of the first antiferromagnetic layer 14 is about 10 Å in this case, the thickness of the second antiferromagnetic layer 15 is determined to be about 70 Å or greater.

Figure 18:
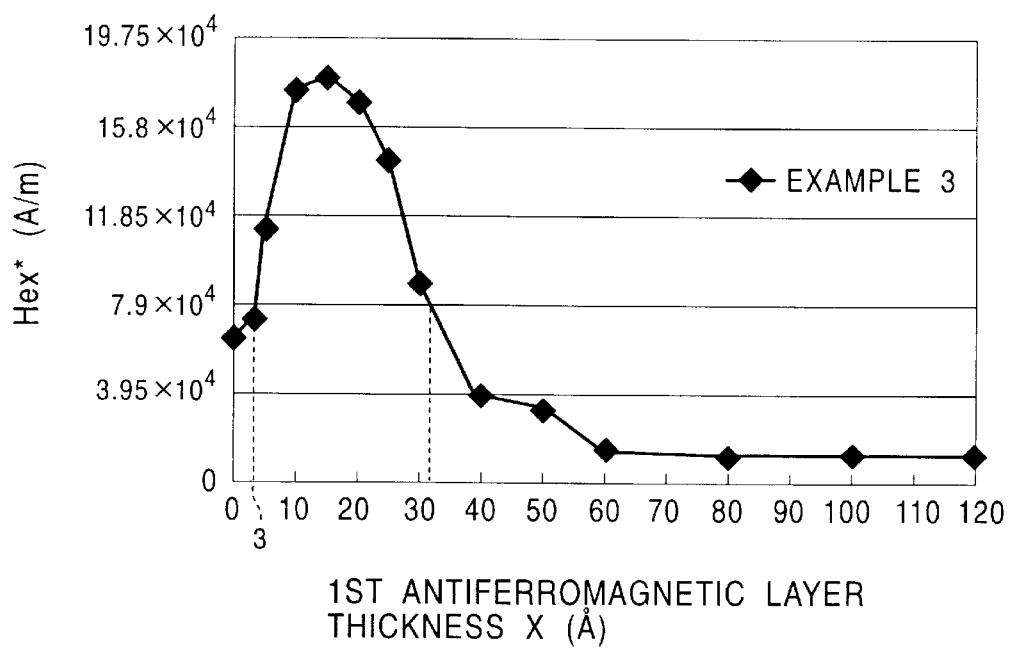
FIG. 18 is a graph showing the relationship between the thickness of a first antiferromagnetic layer which together with a second antiferromagnetic layer forms an antiferromagnetic layer in accordance with the invention, and an exchange coupling magnetic field (Hex)

Then, the relationship was examined between the thickness of the first antiferromagnetic layer and the exchange coupling magnetic field (Hex) in the structure in which the antiferromagnetic layer as deposited is composed of the first antiferromagnetic layer 14 and the second antiferromagnetic layer 15 (FIG. 18). The laminate structure used in this experiment was the same as that shown in FIG. 2.

Example 3

The structure had the following layers in sequence from the bottom: underlying layer 6:Ta(50)/free magnetic layer 1:[$Ni_{80}Fe_{20}$(45)/Co(5)]/non-magnetic intermediate layer 2:Cu(25)/pinned magnetic layer 3:[Co(20)/Ru(8)/Co(15)]/first antiferromagnetic layer 14:$Pt_{58}Mn_{42}$(X)/second antiferromagnetic layer:$Pt_{50}Mn_{50}$(120-X)/protective layer 7:Ta (30)

Values in parenthesis indicate layer thicknesses in terms of Angstroms. The suffixes in the representations of Ni—Fe alloys and Pt—Mn alloys represent composition ratios in terms of at %.

A plurality of samples having different thicknesses of the first antiferromagnetic layer 14 were prepared and heat-treated, and the exchange coupling magnetic field was measured on each of the heat-treated samples. From FIG. 18, it is understood that the exchange coupling magnetic field of $7.933 \; 10^4$ (A/m) or greater was obtainable when the thickness X of the first antiferromagnetic layer 14 ranged from about 3 Å to about 30 Å.

The first antiferromagnetic layer 14 had a large Pt content, in order to maintain the required non-aligned state at the interface adjacent to the pinned magnetic layer 3. For instance, the Pt content was as large as 58 at % in the Example. The composition having such a high Pt content is not easy to transform from disordered lattice structure to ordered lattice structure when-heat treated and, therefore, can hardly exhibit antiferromagnetic properties, although this composition effectively maintains the above-mentioned non-aligned state. Therefore, a too large thickness of the first antiferromagnetic layer 14 increases the ratio of the region which is hard to transform and, as will be clearly seen from the experiment results shown in FIG. 18, incurs a serious reduction in the exchange coupling magnetic field.

In contrast, the thickness of the first antiferromagnetic layer 14 ranging from about 3 Å to about 30 Å provides a large exchange coupling magnetic field, possibly for the reason that a diffusion of compositions takes place as a result of the heat treatment between the first antiferromagnetic layer 14 and the second antiferromagnetic layer 15 which is inherently easy to transform, throughout the whole thickness region of the first antiferromagnetic layer 14 when the thickness of the first antiferromagnetic layer 14 falls within the above-specified range. This diffusion causes the Pt content to be decreased in the first antiferromagnetic layer 14 from that obtained in the as-deposited state, so that the first antiferromagnetic layer 14 becomes more easy to be transformed, thus providing a large exchange coupling magnetic field.

Thus, in order to obtain a large exchange coupling magnetic field in accordance with the present invention, it is necessary that the second antiferromagnetic layer 15 made of an antiferromagnetic material approximating an ideal composition easy to transform from disordered lattice structure to ordered lattice structure is deposited to have a thickness of about 70 Å or greater as explained before with reference to FIG. 17, and that the first antiferromagnetic layer 14 which has a high Pt content to maintain the non-aligned state at the interface adjacent to the pinned magnetic layer is deposited to have a thickness ranging from about 3 Å to about 30 Å, as explained before with reference to FIG. 18.

Thus, the exchange coupling magnetic field of about $7.9 \times 10^4$ (A/m) or greater is obtainable when the thickness of the first antiferromagnetic layer 14 is set to be about 3 Å or greater while the thickness of the second antiferromagnetic layer 15 is set to be about 70 Å or greater, providing a total thickness of the antiferromagnetic layer 4 of about 73 Å. Based on this result of the experiment, in accordance with the present invention, the thickness of the antiferromagnetic layer 4 after the heat treatment is set to be about 73 Å or greater.

Thus, in accordance with the present invention, the minimum thickness required for the antiferromagnetic layer 4 is about 73 Å or greater, so that the thickness of the antiferromagnetic layer can be reduced as compared with that in the conventional devices, thus meeting the demand for narrower gaps.

Figure 19:
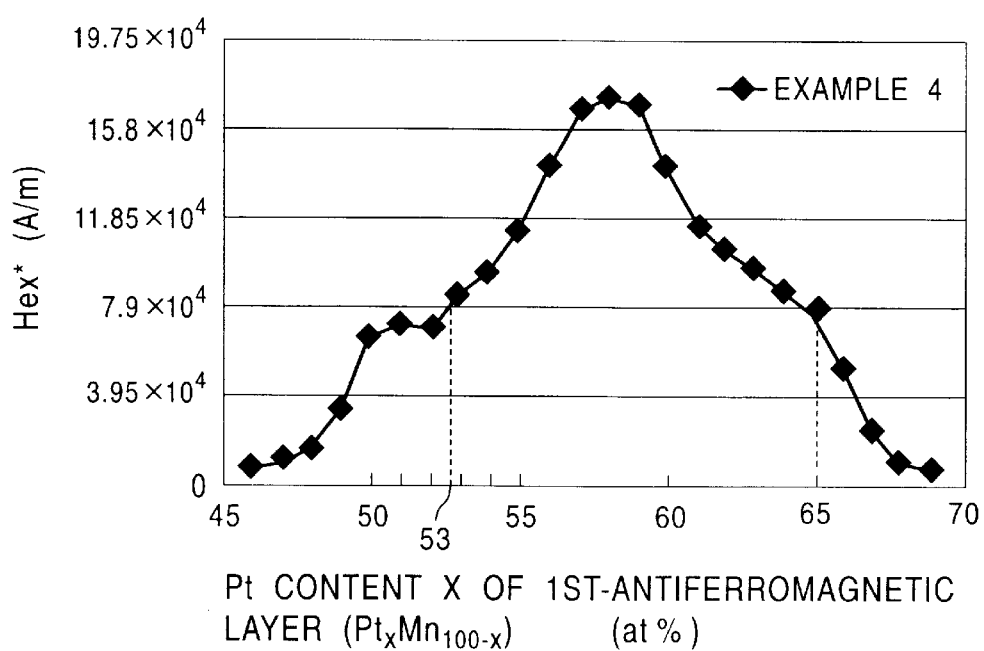
FIG. 19 is a graph showing the relationship between the Pt content (X) and exchange coupling magnetic field (Hex) as observed when the antiferromagnetic layer in accordance with the invention is composed of first and second antiferromagnetic layers, the first antiferromagnetic layer having a composition expressed by $Pt_xMn_{100-x}$.

Then, the relationship was examined between the composition ratio of the first antiferromagnetic layer and the exchange coupling magnetic field (Hex) in the structure in which the antiferromagnetic layer as deposited is composed of the first antiferromagnetic layer 14 and the second antiferromagnetic layer 15 (FIG. 19). The laminate structure used in this experiment was the same as that shown in FIG. 2.

Example 4

The structure had the following layers in sequence from the bottom: underlying layer 6:Ta(50)/free magnetic layer 1:[$Ni_{80}Fe_{20}$(45)/Co(5)]/non-magnetic intermediate layer 2:Cu(25)/pinned magnetic layer 3:[Co(20)/Ru(8)/Co(15)]/first antiferromagnetic layer 14:$Pt_{(X)}Mn_{(100-X)}$(10)/second antiferromagnetic layer:$Pt_{50}Mn_{50}$ (120-X)/protective layer 7:Ta(30)

Values in parenthesis indicate layer thicknesses in terms of Angstroms. The suffixes in the representations of Ni—Fe alloys and Pt—Mn alloys represent composition ratios in terms of at %.

A plurality of samples were prepared having different composition ratios in the first antiferromagnetic layer 14, and were subjected to the heat treatment, followed by measurement of the exchange coupling magnetic field (Hex). The heat treatment was conducted for more than 2 hours at temperatures not lower than 200° C. From FIG. 19, it is understood that the exchange coupling magnetic field of about $7.9 \times 10^4$ (A/m) or greater is obtainable when the Pt content of the first antiferromagnetic layer 14 is about 53 at % to about 65 at %.

A Pt content of the first antiferromagnetic layer 14 ranging from about 53 at % to about 65 at % can adequately create a non-aligned state at the interface between the first antiferromagnetic layer 14 and the pinned magnetic layer 3, and this is the reason why the above-mentioned large exchange coupling magnetic field is obtained.

It is understood, however, that the exchange coupling magnetic field starts to decrease when the Pt content mentioned before exceeds about 65 at %. It is considered that, when the first antiferromagnetic layer 14 as deposited contains such a large amount of Pt, the Pt content in the first antiferromagnetic layer is not decreased to such a level as to enable a proper transformation in the first antiferromagnetic layer 14, despite any diffusion of compositions between the first antiferromagnetic layer 14 and second antiferromagnetic layer 15 caused by the heat treatment, resulting in a reduction of the exchange coupling magnetic field.

It is understood that a large exchange coupling magnetic field, specifically about $11.85 \times 10^4$ (A/m) or greater, is obtainable when the Pt content is determined to be about 55 at % to about 60 at %. Pt content less than about 53 at % causes a reduction of the exchange coupling magnetic field, because such a small Pt content makes the lattice constant of the antiferromagnetic layer 4 approach that of the pinned magnetic layer 3 so as to make it difficult to create the required non-aligned state.

Then, in accordance with the present invention, an experiment was conducted by using samples prepared as Example 5 in which the antiferromagnetic layer 4 was deposited in a different method, and exchange coupling magnetic fields (Hex) on these samples after a heat treatment were measured.

The materials and thicknesses of the layers other than the antiferromagnetic layer 4 were the same as those of Examples 1 to 3. In this experiment, the antiferromagnetic layer 4 in each sample was deposited on the pinned magnetic layer 3 by using a target formed of a Pt—Mn alloy, while progressively changing the sputtering gas pressure from low to high. A measurement of the composition ratio in the antiferromagnetic layer 4 along the thickness thereof proved that a composition $Pt_{58}Mn_{42}$ was developed at the region near the interface adjacent to the pinned magnetic layer 3 and the Pt content was progressively decreased in the direction away from the above-mentioned interface to develop a composition $Pt_{48}Mn_{52}$ in the region near the side of the antiferromagnetic layer 4 opposite to the above-mentioned interface.

A laminate structure having an antiferromagnetic layer 30 was prepared as Comparative Example 5, the whole structure of the antiferromagnetic layer 30 having a composition $Pt_{52}Mn_{48}$. Materials and thicknesses of the layers other than the antiferromagnetic layer 30 were the same as those of Comparative Examples 1 to 4.

The samples of Example 5 and Comparative Examples 5 as deposited were subjected to the heat treatment, followed by measurement of the exchange coupling magnetic field, the results of which are shown in Table 2. The heat treatment was conducted for more than 2 hours at temperatures not lower than 200° C.

TABLE 2

|  | Example 5 | Comp. Ex. 5 |
| --- | --- | --- |
| Interface with ferromagnetic layer | Non-alignment very strong | Non-alignment very strong |
| (Hex) | $16.43 \times 10^4$ (A/m) | $8.37 \times 10^4$ (A/m) |
| Resistance variation ratio | 8.4% | 8.1% |
| Features of PtMn | Composition modulation was effected while maintaining a very strong non-aligned state, so that most part of film was constituted by composition approximating the ideal composition. | The non-aligned state was held rather strong, and composition approximates bulk ideal composition. Best composition among samples of single-layered type. |

As shown in the item "Interface with ferromagnetic layer" in Table 2, in Example 5, the non-aligned crystal lattice state was strongly held in the interface structure between the antiferromagnetic layer 4 and the pinned magnetic layer 3, whereas, in Comparative Example 5, the non-aligned crystal lattice state was not so strong as in Example 5, although this Comparative Example employed a composition which enables the non-aligned crystal lattice state to be easily created.

There was no significant difference in the resistance variation ratio ($\Delta MR$) between Example 5 and Comparative Example 5.

A major difference between Example 5 and Comparative example 5 is that the former exhibited an exchange coupling magnetic field (Hex) two times as large that of the latter.

Example 5 showed such a large exchange coupling magnetic field owing to a proper transformation of the antiferromagnetic layer 4, which is afforded by the high Pt content of the antiferromagnetic layer 4 as expressed by $Pt_{58}Mn_{42}$ at the interface adjacent to the pinned magnetic layer so as to properly maintain the non-aligned state at that interface and by the composition modulation in the thicknesswise direction of the antiferromagnetic layer 4 executed such that most portion of the antiferromagnetic layer 4 was constituted by compositions approximating the ideal composition which allows easy transformation from disordered lattice structure to lattice structure under the heat treatment.

Then, in accordance with the invention, samples were prepared as Example 6 in which the antiferromagnetic layer 4 of so-called dual-spin-valve type magnetoresistive sensor was deposited to have a laminate structure composed of a first antiferromagnetic layer 14 and a second antiferromagnetic layer 15, as well as samples as Comparative Example 6 in which the antiferromagnetic layer was composed of a single layer, and exchange coupling magnetic fields were measured on these samples.

Example 6

The laminate structure had the following layers: $Pt_{50}Mn_{50}$ (83)/first antiferromagnetic layer 14:$Pt_{58}Mn_{42}$ (7)/pinned magnetic layer 3: [Co(15)/Ru(8)/Co(20)]/non-magnetic intermediate layer 2: Cu(22)/free magnetic layer 1: Co (20)/non-magnetic intermediate layer 2: Cu(22)/pinned magnetic layer 3: [Co(20)/Ru(8)/Co(15)]/first antiferromagnetic layer 14: $Pt_58Mn_{42}$ (7)/second antiferromagnetic layer: $Pt_{50}Mn_{50}$(83)/protective layer 7:Ta(10)

Comparative Example 6

The laminate structure had the following layers sequentially from the bottom: Antiferromagnetic layer 30:$Pt_{50}Mn_{50}$ (90)/pinned magnetic layer 3: [Co(15)/Ru(8)/Co(20)]/non-magnetic intermediate layer 2: Cu(22)/free magnetic layer 1: Co (20)/non-magnetic intermediate layer 2: Cu(22)/pinned magnetic layer 3: [Co(20)/Ru(8)/Co(15)]/antiferromagnetic layer 30:$Pt_{50}Mn_{50}$(90)/protective layer 7:Ta(10) Values in the parenthesis indicates the layer thickness in terms of Angstrom. The suffixes in the representations of Ni—Fe alloys and Pt—Mn alloys represent composition ratios in terms of at %.

The samples of Example 6 and Comparative Examples 6 as deposited were subjected to the heat treatment, followed by measurement of the exchange coupling magnetic field, the results of which are shown in Table 2. The heat treatment was conducted for more than 2 hours at temperatures not lower than 200° C.

TABLE 3

|  | Example 6 | Comp. Ex. 6 |
| --- | --- | --- |
| Interface with ferromagnetic layer (Hex) | Non-alignment very strong<br>15.96 × 10⁴ (A/m) | Non-alignment very strong<br>10.59 × 10⁴ (A/m) |
| Resistance variation ratio | 140% | 13.4% |
| Features of PtMn | With strong non-aligned state, bulk ideal composition (Pt50—Mn50) is used for 90% of more, | The non-aligned state was held rather strong, and composition approximates bulk ideal composition. Best composition among samples of single-layered type. |

As shown in the item "Interface with ferromagnetic layer" in Table 3, in Example 6, the non-aligned state was strongly held in the interface structure between the antiferromagnetic layer 4 and the pinned magnetic layer 3, whereas, in Comparative Example 6, the non-aligned state was not so strong as in Example 6, although this Comparative Example employed a composition which enables the non-aligned state to be easily created. There was no significant difference in the resistance variation ratio ($\Delta MR$) between Example 6 and Comparative Example 6.

A major difference between Example 6 and Comparative Example 6 was that the former showed much greater exchange coupling magnetic field (Hex) than the latter. Example 6 showed such a large exchange coupling magnetic field owing to the fact that the transformation from the disordered lattice structure to the ordered lattice structure was properly effected by the heat treatment while the non-aligned state was maintained, which in turn owes to the fact that the interface adjacent to the pinned magnetic layer was held in the non-aligned state due to the formation of the first antiferromagnetic layer 14 and that the second antiferromagnetic layer 15 having an ideal composition that permits easy transformation under the heat treatment was formed on the pinned magnetic layer 3 through the first antiferromagnetic layer.

Figure 21:
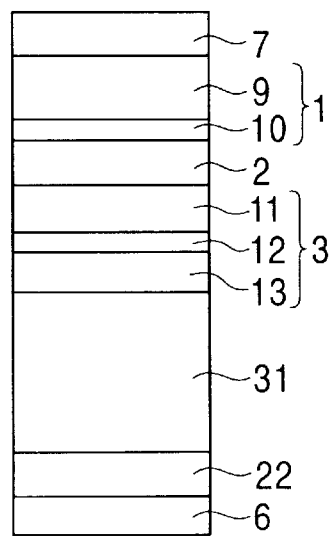
FIG. 21 is a schematic illustration of the structure of a conventional experimental single spin valve type magnetoresistive sensor using a seed layer.

Then, in accordance with the present invention, four types of laminate structures each having a seed layer 22 explained before with reference to FIG. 4 were prepared, including two types of samples (Example 7 an Example 8) in which the interface adjacent to the seed layer was held in non-aligned state and the remainder two types (Comparative Example 7 and Comparative Example 8) in which the interface adjacent to the seed layer 22 was held in aligned state. These samples were subjected to a heat treatment and subsequent measurement of the exchange coupling magnetic field (Hex) and resistance variation ratio ($\Delta MR$). The structures of Examples 7 and 8 were the same as that shown in FIG. 8, while the structures of Comparative Examples 7 and 8 were the same as that shown in FIG. 21.

Example 7

The structure had the following layers sequentially from the bottom: underlying layer 6:Ta(50)/seed layer 22:$Ni_{80}Fe_{20}$(30)/antiferromagnetic layer 4/third antiferromagnetic layer 25:$Pt_{58}Mn_{42}$(10)/second a tiferromagnetic layer 24:$Pt_{50}Mn_{50}$(100)/first antiferromagnetic layer 23:$Pt_{58}Mn_{42}$(10)]/pinned magnetic layer 3[Co(15)/Ru(8)/Co(20)]/non-magnetic intermediate layer 2:Cu(22)/free magnetic layer 1[Co(5)/$Ni_{80}Fe_{20}$(45)]/protective layer 7:Ta(30)

Example 8

The structure had the following layers sequentially from the bottom: underlying layer 6:Ta(50)/seed layer 22:$Ni_{60}Fe_{10}Cr_{30}$(30)/antiferomagnetic layer 4/third antiferromagnetic layer 25:$Pt_{58}Mn_{42}$(10)/second antiferromagnetic layer 24:$Pt_{50}Mn_{50}$(100)/first antiferromagnetic layer 23:$Pt_{58}Mn_{42}$(10)]/spinned magnetic layer 3[Co(15)/Ru(8)/Co(20)]/non-magnetic intermediate layer 2:Cu(22)/free magnetic layer 1[Co(5)/$Ni_{80}Fe_{20}$(45)]/protective layer 7:Ta(30)

Comparative Example 7

The structure had the following layers sequentially from the bottom: underlying layer 6:Ta(50)/seed layer 22:$Ni_{80}Fe_{20}$(30)/antiferromagnetic layer 31:$Pt_{50}Mn_{50}$(120)/spinned magnetic layer 3[Co(15)/Ru(8)/Co(20)]/non-magnetic intermediate layer 2:Cu(22)/free magnetic layer 1[Co(5)/$Ni_{80}Fe_{20}$(45)]/protective layer 7:Ta(30)

Comparative Example 8

The laminate structure had the following layers, sequentially from the bottom: Underlying layer 6: Ta(50)/seed layer 22: $Ni_{60}Fe_{10}Cr_{30}$(30)/antiferromagnetic layer 31: $Pt_{50}Mn_{50}$(120)/pinned magnetic layer 3[Co(15)/Ru(8)/Co(20)]/non-magnetic intermediate layer 2: Cu(22)/free magnetic layer 1[Co(5)/$Ni_{80}Fe_{20}$(45)]/protective layer 7:Ta(30) Values in the parenthesis ( ) indicates the layer thickness in terms of Angstrom. The suffixes in the representations of Ni—Fe alloys and Pt—Mn alloys represent composition ratios in terms of at %.

The samples prepared to have the above-described structures as deposited were subjected to the heat treatment, followed by measurement of the exchange coupling magnetic field (Hex) and resistance variation ratio ($\Delta$MR), as well as other properties, the results of which are shown in Table 4. The heat treatment was conducted for more than 2 hours at temperatures not lower than 200° C.

TABLE 4

| | Example 7 | Example 8 | Comp. Ex. 7 | Comp. Ex. 8 |
|---|---|---|---|---|
| Interface with seed layer | Non-alignment very strong | Non-alignment very strong | Almost aligned | Almost aligned |
| Saturation magnetic field of seed layer | 0.9 T | Non-magnetic | 0.9 T | Non-magnetic |
| specific resistance of seed layer | 25 $\mu\Omega \cdot$ cm | 160 $\mu\Omega \cdot$ cm | 25 $\mu\Omega \cdot$ cm | 160 $\mu\Omega \cdot$ cm |
| Crystalline structure of seed layer | Mostly face-centered cubes with strong (111) plane orientation | Mostly face-centered cubes with strong (111) plane orientation | Mostly face-centered cubes with strong (111) plane orientation | Mostly face-centered cubes with strong (111) plane orientation |
| Interface with ferro-magnetic layer | Non-alignment very strong | Non-alignment very strong | Almost aligned | Almost aligned |
| (Hex) | 18.2 $\times 10^4$ A/m | 18.5 $\times 10^4$ A/m | 6 $\times 10^4$ A/m | 6.5 $\times 10^4$ A/m |
| Resistance variation ratio | 7.8% | 10.29% | 8.1% | 10.3% |
| Role played by seed layer | Seed layer is composed mainly of face-centered cubic structure with the most dense (111) plane strongly aligned, so that layers from Pt to free layer have rather strong (111) plane orientation and, accordingly, greater crystal grains, resulting in large resistance variation ratio. Alignment between seed layer and PtMn, however, makes it difficult to obtain large Hex in one hand, but on the other hand significantly enhances the (111) planes of layers down to the free layer, resulting in greater crystal grain size and consequent greater resistance variation ratio. In order to simultaneously meet the requirements for greater Hex and greater resistance variation ratio, it is preferred that the (111) plane orientations are enhanced in the layers from the PtMn layer to the free layer, while maintaining a on-aligned state between the seed layer and the PtMn layer, as in Example 8. | | | |
| Features of PtMn | Bulk ideal composition (Pt50—Mn 50) used in the region around central region, while maintaining very strongly non-aligned state | Bulk ideal composition (Pt50—Mn 50) used in the region around central region, while maintaining very strongly non-aligned state | Insufficient due to almost-aligned state, although the composition is ideal | insufficient due to almost-aligned state, although the composition is ideal |
| Feature of resistance variation ratio | Variation ratio not large because of small specific resistance of seed layer | Variation ratio large because of large specific resistance of seed layer | Variation ratio not large because of small specific resistance of seed layer | Variation ratio large because of large specific resistance of seed layer |

As will be seen from Table 4, the seed layer 22 plays the same role in Examples 7 and 8 and Comparative Examples 7 and 8. In the present invention, the seed layer is composed mainly of face-centered cubic structure, with the (111) planes substantially oriented in parallel with the interface. Therefore, the layers formed on the seed layer 22, from the antiferromagnetic layer to the free magnetic layer 1, are also have their (111) planes substantially oriented in the direction parallel to the interfaces and are caused to have greater crystal grains. For these reasons, large resistance variation ratios were obtained in all samples, as will be seen from FIG. 4.

Example 8 showed a greater resistance variation ratio than Example 7, and Comparative Example 8 showed a greater resistance variation ratio than Comparative Example, because in each of Example 7 and Comparative Example 7 the seed layer 22 formed of $Ni_{80}Fe_{20}$ alloy had a low specific resistance, while in Example 8 and Comparative Example 8 the seed layer 22 containing non-magnetic Cr and having a composition $Ni_{60}Fe_{10}Cr_{30}$ had a high specific resistance.

In Example 7 and Comparative Example 7, the sense current shunted into the seed layer 22 due to the low specific resistance, whereas, in Example 8 and Comparative Example 8, such shunting did not take place, whereby greater resistance variation ratios were obtained in Example 8 and Comparative Example 8 than in Example 7 and Comparative Example 7.

In regard to the exchange coupling magnetic field, it is understood that Examples 7 and 8 exhibit much greater strength of magnetic field than Comparative Examples 7 and 8. This is because the interface adjacent to the seed layer 22 and the interface adjacent to the pinned magnetic layer 3 are held in non-aligned crystal lattice state by virtue of the third antiferromagnetic layer 25 and the first antiferromagnetic layer 23, both in Examples 7 and 8. In contrast, in Comparative Examples 7 and 8, the transformation is suppressed so that large exchange coupling magnetic field is not obtained, due to aligned state at each of the interface adjacent to the seed layer 22 and the interface adjacent to the pinned magnetic layer, although the antiferromagnetic layer 31 has an ideal composition that permits easy transformation from disordered lattice to ordered lattice.

From the results of this experiment, it is understood that the requirements for high resistance variation ratio and exchange coupling magnetic field are satisfied when the following conditions are met. In particular, it is possible to increase the resistance variation ratio by forming the seed layer 22 on the side of the antiferromagnetic layer opposite to the interface adjacent to the pinned magnetic layer 3, and by using a material having a large specific resistance as the material of the seed layer 22. In addition, the antiferromagnetic layer 4, as deposited, has three layers among which the first antiferromagnetic layer 23 contacting the pinned magnetic layer 3 and the third antiferromagnetic layer 25 contacting the seed layer are made to have greater Pt contents than the intermediate second antiferromagnetic layer 24. Accordingly, the non-aligned crystal lattice states are maintained at the interface adjacent to the pinned magnetic layer 3 and at the interface adjacent to the seed layer 22, while forming the intermediate second antiferromagnetic layer 22 from a material having an ideal composition that permits easy transformation from disordered lattice to ordered lattice structure. By using this antiferromagnetic layer, it is possible to enhance the exchange coupling magnetic field (Hex). As in the case of the experiment results shown in FIGS. 18 and 19, the thicknesses of the first antiferromagnetic layer 23 and the third antiferromagnetic layer 25 are preferably about 3 Å to about 30 Å, while the composition ratios are preferably such that the Pt content is about 53 at % to about 65 at %. The thickness of the second antiferromagnetic layer 24 is preferably about 70 Å or greater, as in the case of the experiment result shown in FIG. 17.

Although the invention has been described through its preferred forms, it is to be understood that the described embodiments are only illustrative and various changes and modifications may be imparted thereto without departing from the scope of the present invention which is limited solely by the appended claims.

What is claimed is:

1. An exchange coupling film comprising:

an antiferromagnetic layer;

a ferromagnetic layer arranged such that an interface is formed between said antiferromagnetic layer and said ferromagnetic layer and such that an exchange coupling magnetic field is produced at the interface; and a seed layer formed on a side of said antiferromagnetic layer opposite to said ferromagnetic layer, said seed layer having face-centered cubic crystals with a (111) plane substantially oriented in parallel with said interface;

wherein the crystalline structure of at least part of said antiferromagnetic layer comprises CuAu—I type face-centered ordered lattice, wherein said antiferromagnetic layer and said ferromagnetic layer have crystalline orientations in which (111) planes of said antiferromagnetic layer and said ferromagnetic layer are oriented in parallel with said interface, and wherein a non-aligned crystal lattice state exists at at least part of an interface between said antiferromagnetic layer and said seed layer.

2. An exchange coupling film comprising:

an antiferromagnetic layer characterized by a lattice constant;

a ferromagnetic layer arranged such that an interface is formed between said antiferromagnetic layer and said ferromagnetic layer and such that an exchange coupling magnetic field is produced at said interface; and a seed layer formed on a side of said antiferromagnetic layer opposite to said ferromagnetic layer, said seed layer having face-centered cubic crystals with a (111) plane substantially oriented in parallel with said interface and characterized by a lattice constant;

wherein a crystalline structure of at least part of said antiferromagnetic layer comprises CuAu—I type face-centered ordered lattice, wherein said antiferromagnetic layer has a (111) crystal plane and said ferromagnetic layer has a (111) plane and wherein said antiferromagnetic layer and said ferromagnetic layer have crystalline orientations in which the (111) planes are oriented in parallel with said interface, and wherein said antiferromagnetic layer has a lattice constant and said seed layer has a lattice constant, and wherein said lattice constants of said antiferromagnetic layer and said seed layer have different values at an interface therebetween.

3. An exchange coupling film according to claim 2, wherein a non-aligned crystal lattice state exists at at least part of an interface between said antiferromagnetic layer and said seed layer.

4. An exchange coupling film according to claim 1, wherein said antiferromagnetic layer is an antiferromagnetic material comprising an element X and Mn, and wherein said element X is selected from the group of elements consisting of Pt, Pd, Ir, Rh, Ru, and Os and combinations thereof.

5. An exchange coupling film according to claim 2, wherein said antiferromagnetic layer is an antiferromagnetic material comprising an element X and Mn, wherein said element X is selected from the group of elements consisting of Pt, Pd, Ir, Rh, Ru, and Os and combinations thereof.

6. An exchange coupling film according to claim 1, wherein said antiferromagnetic layer is made from an antiferromagnetic alloy material containing an element X, an element X' and Mn, wherein the element X is selected from the group of elements consisting of Pt, Pd, Ir, Rh, Ru, and Os, while the element X' is selected from the group of elements consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb and a rare earth element and combinations thereof.

7. An exchange coupling film according to claim 2, wherein said antiferromagnetic layer is an antiferromagnetic alloy material comprising an element X, an element X' and Mn, wherein said element X is selected from the group of elements consisting of Pt, Pd, Ir, Rh, Ru, and Os and combinations thereof, while said element X' is selected from the group of elements consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb and a rare earth element and combinations thereof.

8. An exchange coupling film according to claim 6, wherein said antiferromagnetic alloy material comprises a solid solution selected from the group consisting of an interstitial solid solution in which said element X' resides in the interstices of a space lattice constituted by said element X and Mn, and a substitutive solid solution in which a portion of lattice points of a crystal lattice constituted by said element X and Mn are substituted by said element X'.

9. An exchange coupling film according to claim 7, wherein said antiferromagnetic alloy material comprises a solid solution selected from the group consisting of an interstitial solid solution in which said element X' resides in interstices of a space lattice constituted by said element X and Mn, and a substitutive solid solution in which a portion of lattice points of a crystal lattice constituted by element X and Mn are substituted by said element X'.

10. An exchange coupling film comprising:
an antiferromagnetic layer comprising an antiferromagnetic alloy material including an element X and Mn, wherein said element X is selected from the group of elements consisting of Pt, Pd, Ir, Rh, Ru, and Os and combinations thereof;
a ferromagnetic layer arranged such that an interface is formed between said antiferromagnetic layer and said ferromagnetic layer and such that an exchange coupling magnetic field is generated at said interface; and
a seed layer formed on said antiferromagnetic layer at a side of said antiferromagnetic layer opposite to said interface, and having (111) planes of face-centered cubic crystals substantially oriented in parallel with said interface;
wherein said antiferromagnetic layer has a region in which a ratio of atomic percent of said element X to Mn increases in a direction towards said seed layer, wherein a crystalline structure of at least a portion of said antiferromagnetic layer has a CuAu—I face-centered cubic ordered lattice, and wherein said antiferromagnetic layer and said ferromagnetic layer have such crystal orientations that (111) planes of said antiferromagnetic layer and said ferromagnetic layer are substantially oriented in parallel with said interface between said antiferromagnetic layer and said ferromagnetic layer.

11. An exchange coupling film comprising:
an antiferromagnetic layer comprising an antiferromagnetic alloy material including an element X, an element X' and Mn, wherein said element X is selected from the group of elements consisting of Pt, Pd, Ir, Rh, Ru, and Os and combinations thereof, and said element X' is selected from the group of elements consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb and a rare earth element and combinations thereof;
a ferromagnetic layer arranged such that an interface is formed between said antiferromagnetic layer and said ferromagnetic layer and such that an exchange coupling magnetic field is generated at said interface; and
a seed layer formed on said antiferromagnetic layer at a side of said antiferromagnetic layer opposite to said interface, and having (111) planes of face-centered cubic crystals substantially oriented in parallel with said interface,
wherein said antiferromagnetic layer has a region in which a ratio of atomic percent of said element X to Mn increases in a direction towards said seed layer, wherein a crystalline structure of at least part of said antiferromagnetic layer has a CuAu—I face-centered cubic ordered lattice, and wherein said antiferromagnetic layer and said ferromagnetic layer have such crystal orientations that (111) planes of said antiferromagnetic layer and said ferromagnetic layer are substantially oriented in parallel with said interface between said antiferromagnetic layer and said ferromagnetic layer.

12. An exchange coupling film according to claim 11, wherein said antiferromagnetic alloy material comprises a solid solution selected from the group consisting of an interstitial solid solution in which the element X' resides in the interstices of a space lattice constituted by the element X and Mn, and a substitutive solid solution in which a portion of the lattice points of a crystal lattice constituted by the element X and Mn are substituted by the element X'.

13. An exchange coupling film according to claim 10, wherein said antiferromagnetic layer has a lattice constant and said seed layer has a lattice constant;
and wherein said lattice constants of said antiferromagnetic layer and said ferromagnetic layer have different values at an interface between said antiferromagnetic layer and said seed layer.

14. An exchange coupling film according to claim 11, wherein said antiferromagnetic layer has a lattice constant and said seed layer has a lattice constant and wherein said lattice constants of said antiferromagnetic layer and said seed layer have different value at an interface between said antiferromagnetic layer and said seed layer.

15. An exchange coupling film according to claim 10, wherein a non-aligned crystal lattice state exists at said interface between said antiferromagnetic layer and said seed layer.

16. An exchange coupling film according to claim 11, wherein a non-aligned crystal lattice state exists at said interface between said antiferromagnetic layer and said seed layer.

17. An exchange coupling film according to claim 10, wherein, a first imaginary boundary at a side of a thicknesswise center of said antiferromagnetic layer adjacent to said seed layer defines a first region and a second imaginary boundary at a side of said thicknesswise center adjacent to said ferromagnetic layer defines a third region and wherein said first imaginary boundary and said second imaginary boundary are spaced apart by a second region, said ratio is greater in said first region between an interface adjacent to said seed layer and said first imaginary boundary than in said secured region between said first and second imaginary boundaries, and said ratio increases in a direction towards said interface adjacent to said seed layer in said first region.

18. An exchange coupling film according to claim 11, wherein, a first imaginary boundary at a side of a thicknesswise center of said antiferromagnetic layer adjacent to said seed layer defines a first region and a second imaginary boundary at a side of said thicknesswise center adjacent to said ferromagnetic layer defines a third region and wherein said first imaginary boundary and said second imaginary boundary are spaced apart by a second region, said ratio is greater in said first region between an interface adjacent to said seed layer and said first imaginary boundary than in said secured region between said first and second imaginary boundaries, and said ratio increases in a direction towards said interface adjacent to said seed layer in said first region.

19. An exchange coupling film according to claim 4, wherein said antiferromagnetic layer has a region in which the atomic percent of said element X increases in a direction towards said seed layer starting from a thicknesswise location within said antiferromagnetic layer.

20. An exchange coupling film according to claim 5, wherein said antiferromagnetic layer has a region in which an atomic percent of said element X increases towards said seed layer starting from a thicknesswise location within said antiferromagnetic layer.

21. An exchange coupling film according to claim 6, wherein said antiferromagnetic layer has a region in which an atomic percent of said elements X+X' increases in a direction towards said seed layer starting from a thicknesswise location within said antiferromagnetic layer.

22. An exchange coupling film according to claim 7, wherein said antiferromagnetic layer has a region in which an atomic percent of said elements X+X' increases in a direction towards said seed layer starting from a thicknesswise location within said antiferromagnetic layer.

23. An exchange coupling film according to claim 10, wherein said antiferromagnetic layer has a region in which an atomic percent of said element X increases in a direction towards said seed layer starting from a thicknesswise location within said antiferromagnetic layer.

24. An exchange coupling film according to claim 11, wherein said antiferromagnetic layer has a region in which an atomic percent of said elements X+X' increases in a direction towards said seed layer starting from a thicknesswise location within said antiferromagnetic layer.

25. An exchange coupling film according to claim 4, wherein said antiferromagnetic layer has a region which is near an interface between said antiferromagnetic layer and said seed layer and in which the atomic percent of said element X decreases in a direction towards said seed layer.

26. An exchange coupling film according to claim 5, wherein said antiferromagnetic layer has a region which is near an interface between said antiferromagnetic layer and said seed layer and in which an atomic percent of said element X decreases in a direction towards said seed layer.

27. An exchange coupling film according to claim 6, wherein said antiferromagnetic layer has a region which is near an interface between said antiferromagnetic layer and said seed layer and in which an atomic percent of said elements X+X' decreases in a direction towards said seed layer.

28. An exchange coupling film according to claim 7, wherein said antiferromagnetic layer has a region which is near an interface between said antiferromagnetic layer and said seed layer and in which an atomic percent of said elements X+X' decreases in a direction towards said seed layer.

29. An exchange coupling film according to claim 10, wherein said antiferromagnetic layer has a region which is near an interface between said antiferromagnetic layer and said seed layer and in which an atomic percent of said element X decreases in a direction towards said seed layer.

30. An exchange coupling film according to claim 11, wherein said antiferromagnetic layer has a region which is near an interface between said antiferromagnetic layer and said seed layer and in which an atomic percent of said elements X+X' decreases in a direction towards said seed layer.

31. An exchange coupling film according to claim 4, wherein a composition ratio of said element X of said antiferromagnetic layer to a total composition ratio 100 at % of all elements constituting said antiferromagnetic layer is about 50 at % to about 65 at %, in a region near an interface between said antiferromagnetic layer and said seed layer.

32. An exchange coupling film according to claim 5, wherein a composition ratio of said element X of said antiferromagnetic layer to a total composition ratio 100 at % of all elements constituting said antiferromagnetic layer is about 50 at % to about 65 at %, in a region near an interface between said antiferromagnetic layer and said seed layer.

33. An exchange coupling film according to claim 6, wherein a composition ratio of said elements X+X' of said antiferromagnetic layer to a total composition ratio 100 at % of all elements constituting said antiferromagnetic layer is about 50 at % to about 65 at %, in a region near an interface between said antiferromagnetic layer and said seed layer.

34. An exchange coupling film according to claim 7, wherein a composition ratio of said elements X+X' of said antiferromagnetic layer to the total composition ratio 100 at % of all elements constituting said antiferromagnetic layer is about 50 at % to about 65 at %, in a region near an interface between said antiferromagnetic layer and said seed layer.

35. An exchange coupling film according to claim 10, wherein a composition ratio of said element X of said antiferromagnetic layer to the total composition ratio 100 at % of all elements constituting said antiferromagnetic layer is about 50 at % to about 65 at %, in a region near an interface between said antiferromagnetic layer and said seed layer.

36. An exchange coupling film according to claim 11, wherein a composition ratio of said elements X+X' of said antiferromagnetic layer to the total composition ratio 100 at % of all elements constituting said antiferromagnetic layer is about 50 at % to about 65 at %, in a region near an interface between said antiferromagnetic layer and said seed layer.

37. An exchange coupling film according to claim 31, wherein said composition ratio of said element X is about 50 at % to about 60 at %, in said region near said interface between said antiferromagnetic layer and said seed layer.

38. An exchange coupling film according to claim 32, wherein said composition ratio of said element X is about 50 at % to about 60 at %, in said region near said interface between said antiferromagnetic layer and said seed layer.

39. An exchange coupling film according to claim 33, wherein said composition ratio of said elements X+X' is about 50 at % to about 60 at %, in said region near said interface between said antiferromagnetic layer and said seed layer.

40. An exchange coupling film according to claim 34, wherein said composition ratio of said elements X+X' is about 50 at % to about 60 at %, in said region near said interface between said antiferromagnetic layer and said seed layer.

41. An exchange coupling film according to claim 35, wherein said composition ratio of said element X is about 50 at % to about 60 at %, in said region near said interface between said antiferromagnetic layer and said seed layer.

42. An exchange coupling film according to claim 36, wherein said composition ratio of said elements X+X' is about 50 at % to about 60 at %, in said region near said interface between said antiferromagnetic layer and said seed layer.

43. An exchange coupling film according to claim 4, wherein a region near a thicknesswise center of said antiferromagnetic layer comprises a composition ratio of said element X about 44 at % to about 57 at % of said element X where a total composition ratio of all elements of said region is 100 at %.

44. An exchange coupling film according to claim 5, wherein a region near a thicknesswise center of said antiferromagnetic layer comprises a composition ratio of said element X about 44 at % to about 57 at % of said element X where a total composition ratio of all elements of said region is 100 at %.

45. An exchange coupling film according to claim 6, wherein a region near a thicknesswise center of said antiferromagnetic layer comprises a composition ratio of said elements X+X' about 44 at % to about 57 at % of said element X where a total composition ratio of all the elements is expressed as 100 at %.

46. An exchange coupling film according to claim 7, wherein a region near a thicknesswise center of said antiferromagnetic layer comprises a composition ratio of said elements X+X' about 44 at % to about 57 at % of said element X where a total composition ratio of all elements of said region is 100 at %.

47. An exchange coupling film according to claim 10, wherein a region near a thicknesswise center of said antiferromagnetic layer comprises a composition ratio of said element X about 44 at % to about 57 at % of said element X where a total composition ratio of all elements of said region is 100 at %.

48. An exchange coupling film according to claim 11, wherein a region near a thicknesswise center of said antiferromagnetic layer comprises a composition ratio of said elements X+X' about 44 at % to about 57 at % of said element X where a total composition ratio of all elements of said region is 100 at %.

49. An exchange coupling film according to claim 31, wherein a region near a thicknesswise center of said antiferromagnetic layer comprises a composition ratio of said element X about 44 at % to about 57 at % of said element X where a total composition ratio of all elements of said region is 100 at %.

50. An exchange coupling film according to claim 32, wherein a region near a thicknesswise center of said antiferromagnetic layer comprises a composition ratio of said element X about 44 at % to about 57 at % of said element X where a total composition ratio of all elements of said region is 100 at %.

51. An exchange coupling film according to claim 33, wherein a region near a thicknesswise center of said antiferromagnetic layer comprises a composition ratio of said elements X+X' about 44 at % to about 57 at % of said element X where a total composition ratio of all elements of said region is 100 at %.

52. An exchange coupling film according to claim 34, wherein a region near a thicknesswise center of said antiferromagnetic layer comprises a composition ratio of said elements X+X' about 44 at % to about 57 at % of said element X where a total composition ratio of all elements of said region is 100 at %.

53. An exchange coupling film according to claim 35, wherein a region near a thicknesswise center of said antiferromagnetic layer comprises a composition ratio of said element X about 44 at % to about 57 at % of said element X where a total composition ratio of all elements of said region is 100 at %.

54. An exchange coupling film according to claim 36, wherein a region near a thicknesswise center of said antiferromagnetic layer comprises a composition ratio of said elements X+X' about 44 at % to about 57 at % of said element X where a total composition ratio of all elements of said region is 100 at %.

55. An exchange coupling film according to claim 37, wherein a region near a thicknesswise center of said antiferromagnetic layer comprises a composition ratio of said element X about 44 at % to about 57 at % of said element X where a total composition ratio of all elements of said region is 100 at %.

56. An exchange coupling film according to claim 38, wherein a region near a thicknesswise center of said antiferromagnetic layer comprises a composition ratio of said element X about 44 at % to about 57 at % of said element X where a total composition ratio of all elements of said region is 100 at %.

57. An exchange coupling film according to claim 39, wherein a region near a thicknesswise center of said antiferromagnetic layer comprises a composition ratio of said elements X+X' about 44 at % to about 57 at % of said element X where a total composition ratio of all elements of said region is 100 at %.

58. An exchange coupling film according to claim 40, wherein a region near a thicknesswise center of said antiferromagnetic layer comprises a composition ratio of said elements X+X' about 44 at % to about 57 at % of said element X where a total composition ratio of all elements of said region is 100 at %.

59. An exchange coupling film according to claim 41, wherein a region near a thicknesswise center of said antiferromagnetic layer comprises a composition ratio of said element X about 44 at % to about 57 at % of said element X where a total composition ratio of all elements of said region is 100 at %.

60. An exchange coupling film according to claim 42, wherein a region near a thicknesswise center of said antiferromagnetic layer comprises a composition ratio of said elements X+X' about 44 at % to about 57 at % of said element X where a total composition ratio of all elements of said region is 100 at %.

61. An exchange coupling film according to claim 43, wherein said composition ratio of said element X is about 46 at % to about 55 at %.

62. An exchange coupling film according to claim 44, wherein said composition ratio of said element X is about 46 at % to about 55 at %.

63. An exchange coupling film according to claim 45, wherein said composition ratio of said elements X+X' is about 46 at % to about 55 at %.

64. An exchange coupling film according to claim 46, wherein said composition ratio of said elements X+X' is about 46 at % to about 55 at %.

65. An exchange coupling film according to claim 47, wherein said composition ratio of said element X is about 46 at % to about 55 at %.

66. An exchange coupling film according to claim 48, wherein said composition ratio of said elements X+X' is about 46 at % to about 55 at %.

67. An exchange coupling film according to claim 49, wherein the composition ratio of said element X is about 46 at % to about 55 at %.

68. An exchange coupling film according to claim 50, wherein said composition ratio of said element X is about 46 at % to about 55 at %.

69. An exchange coupling film according to claim 51, wherein said composition ratio of said elements X+X' is about 46 at % to about 55 at %.

70. An exchange coupling film according to claim 52, wherein said composition ratio of said elements X+X' is about 46 at % to about 55 at %.

71. An exchange coupling film according to claim 53, wherein said composition ratio of said element X is about 46 at % to about 55 at %.

72. An exchange coupling film according to claim 54, wherein said composition ratio of said elements X+X' is about 46 at % to about 55 at %.

73. An exchange coupling film according to claim 55, wherein said composition ratio of said element X is about 46 at % to about 55 at %.

74. An exchange coupling film according to claim 56, wherein said composition ratio of said element X is about 46 at % to about 55 at %.

75. An exchange coupling film according to claim 57, wherein said composition ratio of said elements X+X' is about 46 at % to about 55 at %.

76. An exchange coupling film according to claim 58, wherein said composition ratio of said elements X+X' is about 46 at % to about 55 at %.

77. An exchange coupling film according to claim 59, wherein said composition ratio of said element X is about 46 at % to about 55 at %.

78. An exchange coupling film according to claim 60, wherein said composition ratio of said elements X+X' is about 46 at % to about 55 at %.

79. An exchange coupling film according to claim 4, wherein said antiferromagnetic layer has a thickness of at least about 76 Å.

80. An exchange coupling film according to claim 5, wherein said antiferromagnetic layer has a thickness not smaller than 76 Å.

81. An exchange coupling film according to claim 6, wherein said antiferromagnetic layer has a thickness of at least about 76 Å.

82. An exchange coupling film according to claim 10, wherein said antiferromagnetic layer has a thickness of at least about 76 Å.

83. An exchange coupling film according to claim 11, wherein said antiferromagnetic layer has a thickness of at least about 76 Å.

84. An exchange coupling film according to claim 1, wherein said seed layer comprises an alloy selected from the group consisting of an Ni—Fe alloy and an Ni—Fe—Y alloy, wherein Y is selected from the group consisting of Cr, Rh, Ta, Hf, Nb, Zr, and Ti and combinations thereof.

85. An exchange coupling film according to claim 2, wherein said seed layer comprises an alloy selected from the group consisting of an Ni—Fe alloy and an Ni—Fe—Y alloy, wherein Y is selected from the group consisting of Cr, Rh, Ta, Hf, Nb, Zr, and Ti and combinations thereof.

86. An exchange coupling film according to claim 10, wherein said seed layer comprises an alloy selected from the group consisting of an Ni—Fe alloy and an Ni—Fe—Y alloy, wherein Y is selected from the group consisting of Cr, Rh, Ta, Hf, Nb, Zr, and Ti and combinations thereof.

87. An exchange coupling film according to claim 11, wherein said antiferromagnetic layer has a thickness of at least about 76 Å.

88. An exchange coupling film according to claim 1, wherein said seed layer comprises a non-magnetic material.

89. An exchange coupling film according to claim 2, wherein said seed layer comprises a non-magnetic material.

90. An exchange coupling film according to claim 10, wherein said seed layer comprises a non-magnetic material.

91. An exchange coupling film according to claim 11, wherein said seed layer comprises a non-magnetic material.

92. An exchange coupling film according to claim 1, wherein said seed layer, said antiferromagnetic layer, and said ferromagnetic layer are sequentially arranged on an underlying layer, wherein said underlying layer comprises at least one element selected from the group consisting of Ta, Hf, Nb, Zr, Ti, Mo and W.

93. An exchange coupling film according to claim 2, wherein said seed layer, said antiferromagnetic layer, and said ferromagnetic layer are sequentially arranged on an underlying layer, wherein said underlying layer comprises at least one element selected from the group consisting of Ta, Hf, Nb, Zr, Ti, Mo and W.

94. An exchange coupling film according to claim 10, wherein said seed layer, said antiferromagnetic layer, and said ferromagnetic layer are sequentially arranged on an underlying layer, wherein said underlying layer comprises at least one element selected from the group consisting of Ta, Hf, Nb, Zr, Ti, Mo and W.

95. An exchange coupling film according to claim 11, wherein said seed layer, said antiferromagnetic layer, and said ferromagnetic layer are sequentially arranged on an underlying layer, wherein said underlying layer comprises at least one element selected from the group consisting of Ta, Hf, Nb, Zr, Ti, Mo and W and combinations thereof.

96. An exchange coupling film according to claim 1, wherein said antiferromagnetic layer has a lattice constant and said ferromagnetic layer has a lattice constant and wherein said lattice constants of said antiferromagnetic layer and said ferromagnetic layer have different values at at least part of said interface.

97. An exchange coupling film according to claim 2, wherein said antiferromagnetic layer and said ferromagnetic layer have different lattice constants at at least part of the interface therebetween.

98. An exchange coupling film according to claim 10, wherein said seed layer, said antiferromagnetic layer, and said ferromagnetic layer are sequentially arranged on an underlying layer, wherein said underlying layer comprises at least one element selected from the group consisting of Ta, Hf, Nb, Zr, Ti, Mo and W and combinations thereof.

99. An exchange coupling film according to claim 11, wherein said antiferromagnetic layer has a lattice constant and said ferromagnetic layer has a lattice constant and wherein said lattice constants of said antiferromagnetic layer and said ferromagnetic layer have different values at at least part of said interface.

100. An exchange coupling film according to claim 1, wherein a non-aligned crystal lattice state exists at at least a portion of said interface between said antiferromagnetic layer and said ferromagnetic layer.

101. An exchange coupling film according to claim 2, wherein a non-aligned crystal lattice state exists at at least a portion of said interface between said antiferromagnetic layer and said ferromagnetic layer.

102. An exchange coupling film according to claim 10, wherein a non-aligned crystal lattice state exists at at least a portion of said interface between said antiferromagnetic layer and said ferromagnetic layer.

103. An exchange coupling film according to claim 11, wherein a non-aligned crystal lattice state exists at at least a portion of said interface between said antiferromagnetic layer and said ferromagnetic layer.

104. A magnetoresistive sensor, comprising:

an antiferromagnetic layer;

a pinned magnetic layer in contact with said antiferromagnetic layer and having a direction of magnetization fixed by an exchange anisotropic magnetic field with said antiferromagnetic layer;

a non-magnetic intermediate layer between said pinned magnetic layer and a free magnetic layer; and a bias layer for aligning a direction of magnetization of said free magnetic layer in a direction which intersects a direction of magnetization of said pinned magnetic layer;

wherein said antiferromagnetic layer and said pinned magnetic layer comprises an exchange coupling film as claimed in claim 1, and wherein said non-magnetic intermediate layer and said free magnetic layer have crystalline orientations with (111) planes substantially oriented in parallel with an interface between said antiferromagnetic layer and said pinned magnetic layer.

105. A magnetoresistive sensor, comprising:

an antiferromagnetic layer;

a pinned magnetic layer in contact with said antiferromagnetic layer and having a direction of magnetization fixed by an exchange anisotropic magnetic field with said antiferromagnetic layer;

a non-magnetic intermediate layer between said pinned magnetic layer and a free magnetic layer; and a bias layer for aligning a direction of magnetization of said free magnetic layer in a direction which intersects a direction of magnetization of said pinned magnetic layer;

wherein said antiferromagnetic layer and said pinned magnetic layer comprises an exchange coupling film as claimed in claim 2, and wherein said non-magnetic intermediate layer and said free magnetic layer have crystalline orientations with (111) planes substantially oriented in parallel with an interface between said antiferromagnetic layer and said pinned magnetic layer.

106. A magnetoresistive sensor, comprising:

an antiferromagnetic layer;

a pinned magnetic layer in contact with said antiferromagnetic layer and having a direction of magnetization fixed by an exchange anisotropic magnetic field with said antiferromagnetic layer;

a non-magnetic intermediate layer between said pinned magnetic layer and a free magnetic layer; and a bias layer for aligning a direction of magnetization of said free magnetic layer in a direction which intersects a direction of magnetization of said pinned magnetic layer;

wherein said antiferromagnetic layer and said pinned magnetic layer comprises an exchange coupling film as claimed in claim 10, and wherein said non-magnetic intermediate layer and said free magnetic layer have crystalline orientations with (111) planes substantially oriented in parallel with an interface between said antiferromagnetic layer and said pinned magnetic layer.

107. A magnetoresistive sensor, comprising:

an antiferromagnetic layer;

a pinned magnetic layer in contact with said antiferromagnetic layer and having a direction of magnetization fixed by an exchange anisotropic magnetic field with said antiferromagnetic layer;

a non-magnetic intermediate layer between said pinned magnetic layer and a free magnetic layer; and a bias layer for aligning a direction of magnetization of said free magnetic layer in a direction which intersects a direction of magnetization of said pinned magnetic layer;

wherein said antiferromagnetic layer and said pinned magnetic layer comprises an exchange coupling film as claimed in claim 11, and wherein said non-magnetic intermediate layer and said free magnetic layer have crystalline orientations with (111) planes substantially oriented in parallel with an interface between said antiferromagnetic layer and said pinned magnetic layer.

108. A magnetoresistive sensor, comprising:

an antiferromagnetic layer;

a pinned magnetic layer in contact with said antiferromagnetic layer and having a direction of magnetization fixed by an exchange anisotropic magnetic field with said antiferromagnetic layer;

a non-magnetic intermediate layer between said pinned magnetic layer and a free magnetic layer; and an antiferromagnetic exchange bias layer formed on one of an upper side or a lower side of said free magnetic layer and having portions spaced from each other in a track width direction;

wherein said antiferromagnetic exchange bias layer and said free magnetic layer comprise an exchange coupling film as claimed in claim 1, and wherein said non-magnetic intermediate layer, said pinned magnetic layer and said antiferromagnetic layer have crystalline orientations with (111) planes substantially oriented in parallel with an interface between said antiferromagnetic exchange bias layer and said free magnetic layer.

109. A magnetoresistive sensor, comprising:

an antiferromagnetic layer;

a pinned magnetic layer in contact with said antiferromagnetic layer and having a direction of magnetization fixed by an exchange anisotropic magnetic field with said antiferromagnetic layer;

a non-magnetic intermediate layer between said pinned magnetic layer and a free magnetic layer; and an antiferromagnetic exchange bias layer on one of an upper side or a lower side of said free magnetic layer and having portions spaced from each other in a track width direction;

wherein said antiferromagnetic exchange bias layer and said free magnetic layer comprise an exchange coupling film as claimed in claim 2, and wherein said non-magnetic intermediate layer, said pinned magnetic layer and said antiferromagnetic layer have crystalline orientations with (111) planes substantially oriented in parallel with an interface between said antiferromagnetic exchange bias layer and said free magnetic layer.

110. A magnetoresistive sensor, comprising:

an antiferromagnetic layer;

a pinned magnetic layer in contact with said antiferromagnetic layer and having a direction of magnetization fixed by an exchange anisotropic magnetic field with said antiferromagnetic layer;

a non-magnetic intermediate layer between said pinned magnetic layer and a free magnetic layer; and an antiferromagnetic exchange bias layer on one of an upper side or a lower side of said free magnetic layer and having portions spaced from each other in a track width direction;

wherein said antiferromagnetic exchange bias layer and said free magnetic layer comprise an exchange coupling film as claimed in claim 10, and wherein said non-magnetic intermediate layer, said pinned magnetic layer and said antiferromagnetic layer have crystalline orientations with (111) planes substantially oriented in parallel with an interface between said antiferromagnetic exchange bias layer and said free magnetic layer.

111. A magnetoresistive sensor, comprising:

an antiferromagnetic layer;

a pinned magnetic layer in contact with said antiferromagnetic layer and having a direction of magnetization fixed by an exchange anisotropic magnetic field with said antiferromagnetic layer;

a non-magnetic intermediate layer between said pinned magnetic layer and a free magnetic layer; and an antiferromagnetic exchange bias layer on one of an upper side or a lower side of said free magnetic layer and having portions spaced from each other in a track width direction;

wherein said antiferromagnetic exchange bias layer and said free magnetic layer comprise an exchange coupling film as claimed in claim 11, and wherein said non-magnetic intermediate layer, said pinned magnetic layer and said antiferromagnetic layer have crystalline orientations with (111) planes substantially oriented in parallel with an interface between said antiferromagnetic exchange bias layer and said free magnetic layer.

112. A magnetoresistive sensor comprising:

a free magnetic layer;

first and second non-magnetic intermediate layers formed on upper side and lower side of said free magnetic layer, respectively;

first and second pinned magnetic layers wherein said first pinned magnetic layer is on said upper side of said first non-magnetic intermediate layer and said second pinned magnetic layer is on the lower side of said second non-magnetic intermediate layer;

first and second antiferromagnetic layers, wherein said first antiferromagnetic layer is on an upper side of said first pinned magnetic layers and said second antiferromagnetic layer is on a lower side of said second pinned magnetic layer, said first and second antiferromagnetic layers serving to fix the directions of magnetization of said first and second pinned magnetic layers, respectively, by exchange anisotropic magnetic fields; and a bias layer which aligns the direction of magnetization of said free magnetic layer to a direction that intersects the directions of magnetization of said first and second pinned magnetic layers;

wherein one of said first antiferromagnetic layer and the said first pinned magnetic layer or said second antiferromagnetic layer and said second pinned magnetic layer comprise an exchange coupling film as claimed in claim 1, and wherein a remaining one of said first antiferromagnetic layer and said first pinned magnetic layer or said second antiferromagnetic layer and said second pinned magnetic layer have crystalline orientations with (111) planes substantially aligned in parallel with an interface between said antiferromagnetic layer and said ferromagnetic layer of said exchange coupling film.

113. A magnetoresistive sensor comprising:

a free magnetic layer;

first and second non-magnetic intermediate layers formed on an upper side and a lower side of said free magnetic layer, respectively;

first and second pinned magnetic layers, wherein said first pinned magnetic layer is formed on an upper side of said first non-magnetic intermediate layer and said second pinned magnetic layer is a lower side of said second non-magnetic intermediate layer first and second antiferromagnetic layers, wherein said first antiferromagnetic layer is on said upper side of said first pinned magnetic layers and said second antiferromagnetic layer is on said lower side of said second pinned magnetic layer, said first and second antiferromagnetic layers serving to fix directions of magnetization of said first and second pinned magnetic layers, respectively, by exchange anisotropic magnetic fields; and a bias layer which aligns a direction of magnetization of said free magnetic layer to a direction that intersects directions of magnetization of said first and second pinned magnetic layers:

wherein one of said first antiferromagnetic layer and said first pinned magnetic layer or said second antiferromagnetic layer and said second pinned magnetic layer comprise an exchange coupling film as claimed in claim 2, and wherein a remaining one of said first antiferromagnetic layer and said first pinned magnetic layer or said second antiferromagnetic layer and said second pinned magnetic layer have crystalline orientations with (111) planes substantially aligned in parallel with an interface between said antiferromagnetic layer and said ferromagnetic layer of said exchange coupling film.

114. A magnetoresistive sensor comprising:

a free magnetic layer;

first and second non-magnetic intermediate layers formed on an upper side and a lower side of said free magnetic layer, respectively;

first and second pinned magnetic layers, wherein said first pinned magnetic layer is formed on an upper side of said first non-magnetic intermediate layer and said second pinned magnetic layer is a lower side of said second non-magnetic intermediate layer first and second antiferromagnetic layers, wherein said first antiferromagnetic layer is on said upper side of said first pinned magnetic layers and said second antiferromagnetic layer is on said lower side of said second pinned magnetic layer, said first and second antiferromagnetic layers serving to fix directions of magnetization of said first and second pinned magnetic layers, respectively, by exchange anisotropic magnetic fields; and a bias layer which aligns a direction of magnetization of said free magnetic layer to a direction that intersects directions of magnetization of said first and second pinned magnetic layers:

wherein one of said first antiferromagnetic layer and the said first pinned magnetic layer or said second antiferromagnetic layer and said second pinned magnetic layer comprise an exchange coupling film as claimed in claim 10, and wherein a remaining one of said first antiferromagnetic layer and said first pinned magnetic layer or said second antiferromagnetic layer and said second pinned magnetic layer have crystalline orientations with (111) planes substantially aligned in parallel with an interface between said antiferromagnetic layer and said ferromagnetic layer of said exchange coupling film.

115. A magnetoresistive sensor comprising:

a free magnetic layer;

first and second non-magnetic intermediate layers formed on an upper side and a lower side of said free magnetic layer, respectively;

first and second pinned magnetic layers, wherein said first pinned magnetic layer is formed on an upper side of said first non-magnetic intermediate layer and said second pinned magnetic layer is a lower side of said second non-magnetic intermediate layer first and second antiferromagnetic layers, wherein said first antiferromagnetic layer is on said upper side of said first pinned magnetic layers and said second antiferromagnetic layer is on said lower side of said second pinned magnetic layer, said first and second antiferromagnetic layers serving to fix directions of magnetization of said first and second pinned magnetic layers, respectively, by exchange anisotropic magnetic fields; and a bias layer which aligns a direction of magnetization of said free magnetic layer to a direction that intersects directions of magnetization of said first and second pinned magnetic layers:

wherein one of said first antiferromagnetic layer and the said first pinned magnetic layer or said second antiferromagnetic layer and said second pinned magnetic layer comprise an exchange coupling film as claimed in claim 1, and wherein a remaining one of said first antiferromagnetic layer and said first pinned magnetic layer or said second antiferromagnetic layer and said second pinned magnetic layer have crystalline orientations with (111) planes substantially aligned in parallel with an interface between said antiferromagnetic layer and said ferromagnetic layer of said exchange coupling film.

116. A magnetoresistive sensor comprising:

a non-magnetic layer;

a magnetoresistive layer and a soft magnetic layer and said non-magnetic layer therebetween; and an antiferromagnetic layer on one of an upper side or a lower side of said magnetoresistive layer and having portions spaced from each other in a track width direction;

wherein said antiferromagnetic layer and said magnetoresistive layer comprise an exchange coupling film as claimed in claim 1, and wherein said non-magnetic layer and said soft magnetic layer have crystalline orientations with (111) planes substantially oriented in parallel with an interface between said magnetoresistive layer and said antiferromagnetic layer.

117. A magnetoresistive sensor comprising:

a non-magnetic layer;

a magnetoresistive layer and a soft magnetic layer and said non-magnetic layer therebetween; and an antiferromagnetic layer on one of an upper side or a lower side of said magnetoresistive layer and having portions spaced from each other in a track width direction;

wherein said antiferromagnetic layer and said magnetoresistive layer comprise an exchange coupling film as claimed in claim 2, and wherein said non-magnetic layer and said soft magnetic layer have crystalline orientations with (111) planes substantially oriented in parallel with an interface between said magnetoresistive layer and said antiferromagnetic layer.

118. A magnetoresistive sensor comprising:

a non-magnetic layer;

a magnetoresistive layer and a soft magnetic layer and said non-magnetic layer therebetween; and an antiferromagnetic layer on one of an upper side or a lower side of the magnetoresistive layer and having portions spaced from each other in a track width direction;

wherein said antiferromagnetic layer and said magnetoresistive layer comprise an exchange coupling film as claimed in claim 10, and wherein said non-magnetic layer and said soft magnetic layer have crystalline orientations with (111) planes substantially oriented in parallel with an interface between said magnetoresistive layer and said antiferromagnetic layer.

119. A magnetoresistive sensor comprising:

a non-magnetic layer;

a magnetoresistive layer and a soft magnetic layer and said non-magnetic layer therebetween; and an antiferromagnetic layer on one of an upper side or a lower side of said magnetoresistive layer and having portions spaced from each other in a track width direction;

wherein said antiferromagnetic layer and said magnetoresistive layer comprise an exchange coupling film as claimed in claim 11, and wherein said non-magnetic layer and said soft magnetic layer have crystalline orientations with (111) planes substantially oriented in parallel with an interface between said magnetoresistive layer and said antiferromagnetic layer.

* * * * *

UNITED STATES PATENT AND TRADEMARK OFFICE
CERTIFICATE OF CORRECTION

PATENT NO. : 6,678,128 B2
DATED : January 13, 2004
INVENTOR(S) : Masamichi Saito et al.

It is certified that error appears in the above-identified patent and that said Letters Patent is hereby corrected as shown below:

Column 70,
Line 56, delete "the" after "layer and".

Column 71,
Line 24, delete "the" after "layer and".

Signed and Sealed this

Twenty-seventh Day of April, 2004

JON W. DUDAS
*Acting Director of the United States Patent and Trademark Office*